(12) United States Patent
Chen et al.

(10) Patent No.: US 12,419,147 B2
(45) Date of Patent: Sep. 16, 2025

(54) LIGHT-EMITTING DEVICE

(71) Applicant: EPISTAR CORPORATION, Hsinchu (TW)

(72) Inventors: Chao-Hsing Chen, Hsinchu (TW);
Meng-Hsiang Hong, Hsinchu (TW);
Chi-Shiang Hsu, Hsinchu (TW);
Yen-Liang Kuo, Hsinchu (TW);
Chien-Ya Hung, Hsinchu (TW);
Yong-Yang Chen, Hsinchu (TW);
Yu-Ling Lin, Hsinchu (TW);
Xue-Cheng Yao, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 449 days.

(21) Appl. No.: 18/089,727

(22) Filed: Dec. 28, 2022

(65) Prior Publication Data
US 2023/0215998 A1    Jul. 6, 2023

(30) Foreign Application Priority Data
Jan. 5, 2022  (TW) .................................. 111100474

(51) Int. Cl.
| | |
|---|---|
| *H01L 33/60* | (2010.01) |
| *H10H 20/819* | (2025.01) |
| *H10H 20/831* | (2025.01) |
| *H10H 20/832* | (2025.01) |
| *H10H 20/84* | (2025.01) |
| *H10H 20/856* | (2025.01) |
| *H10H 20/825* | (2025.01) |

(52) U.S. Cl.
CPC ........ *H10H 20/856* (2025.01); *H10H 20/819* (2025.01); *H10H 20/831* (2025.01); *H10H 20/835* (2025.01); *H10H 20/84* (2025.01); *H10H 20/825* (2025.01)

(58) Field of Classification Search
CPC .. H10H 20/856; H10H 20/819; H10H 20/831; H10H 20/835; H10H 20/84; H10H 20/825; H10H 20/032; H10H 20/8316; H10H 20/841; H10H 20/857
See application file for complete search history.

(56) References Cited

U.S. PATENT DOCUMENTS

| | | | | |
|---|---|---|---|---|
| 2017/0288088 A1* | 10/2017 | Won Cheol | ............ | H10H 20/84 |
| 2020/0295229 A1* | 9/2020 | Kim | ..................... | H10H 20/814 |

\* cited by examiner

*Primary Examiner* — Mohammed R Alam
(74) *Attorney, Agent, or Firm* — Patterson + Sheridan, LLP

(57) ABSTRACT

A light-emitting device includes a semiconductor stack, first and second insulative layers, a reflective conductive structure, and first and second pads. The semiconductor stack includes a first semiconductor layer, and a mesa having an active region having a second semiconductor layer and formed on the first semiconductor layer. The first insulative layer is formed on the semiconductor stack and has first openings. The reflective conductive structure is formed on the first insulative layer and is electrically connected to the second semiconductor layer through the first openings. The second insulative layer is formed on the reflective conductive structure and includes second openings and a contact area covering portions overlapped with the first and second openings. A first pad is formed on the second insulative layer and electrically connected to the first semiconductor layer. A second pad formed on the second insulative layer and electrically connected to the second semiconductor layer.

20 Claims, 36 Drawing Sheets

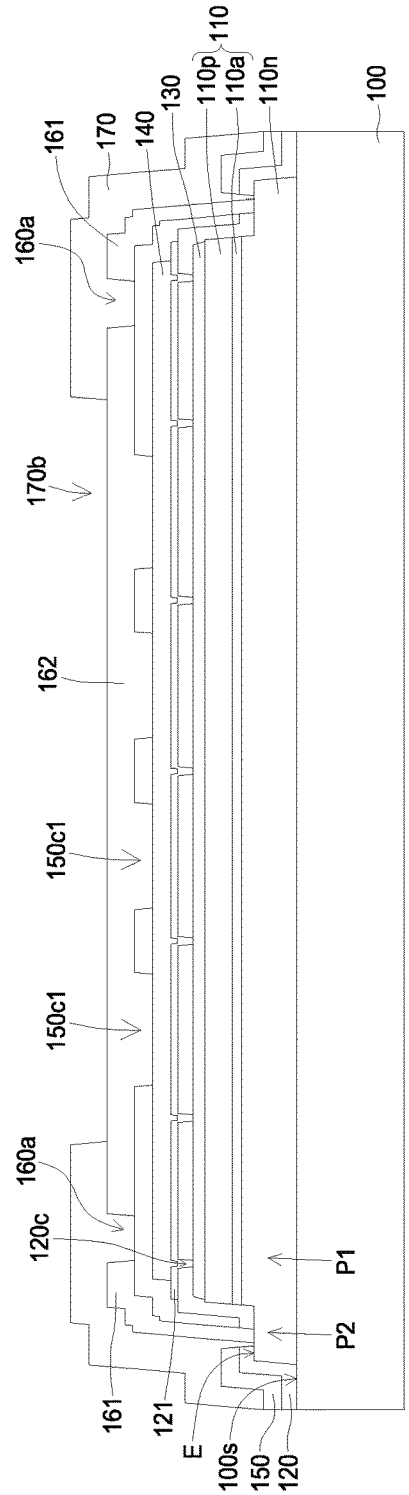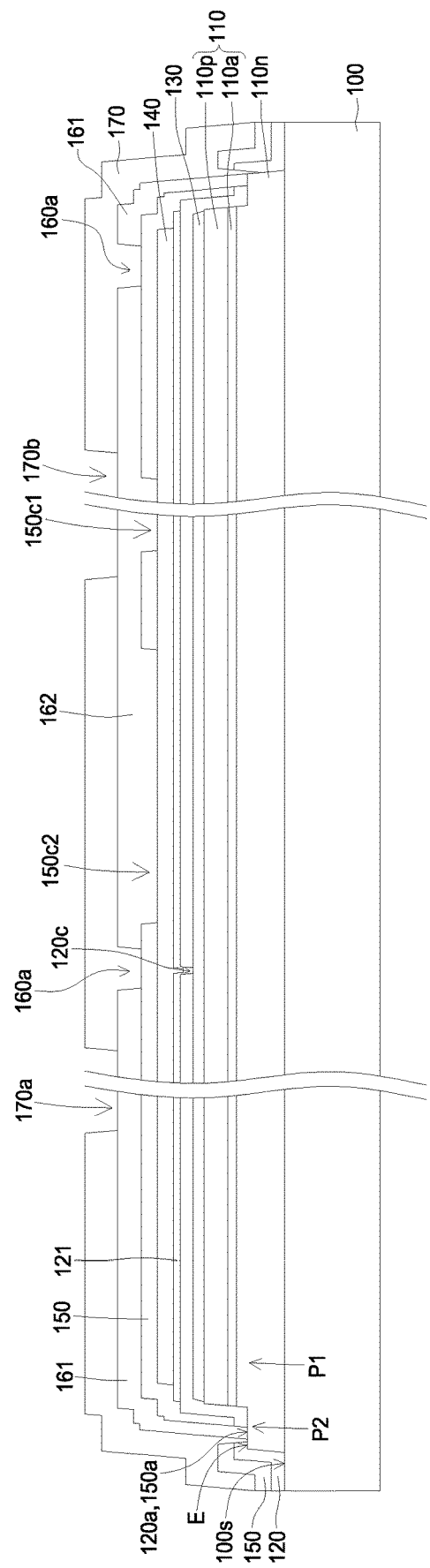
FIG. 18A
FIG. 18B

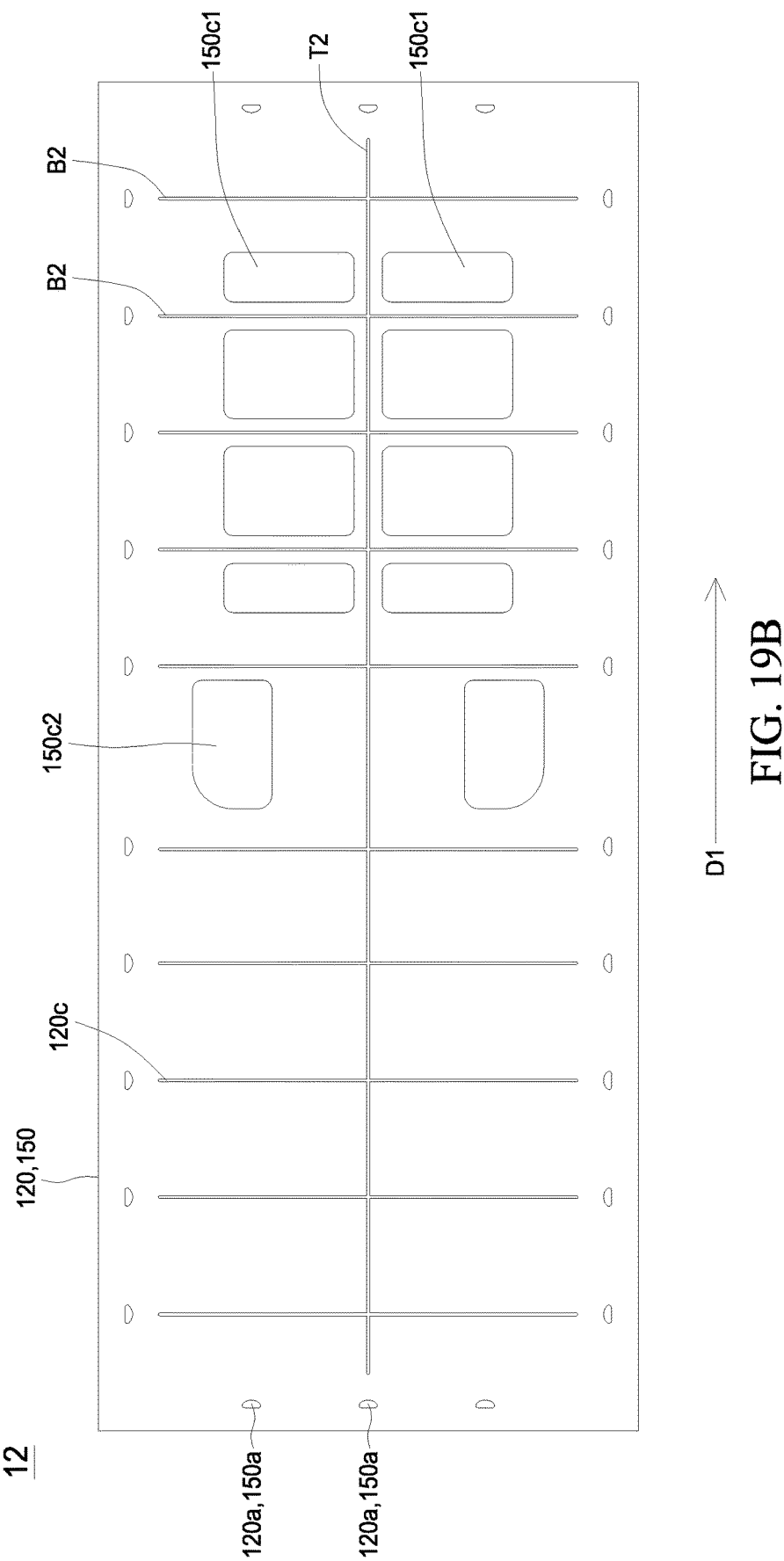

LIGHT-EMITTING DEVICE

CROSS-REFERENCE TO RELATED APPLICATIONS

This application claims priority to the benefit of Taiwan Patent Application Number 111100474 filed on Jan. 5, 2022, and the entire contents of which are hereby incorporated by reference herein in its entirety.

BACKGROUND

Technical Field

The present disclosure relates to a light-emitting device, more specifically, to a light-emitting device that improves brightness.

Description of the Related Art

The light-emitting diodes (LEDs) have the characteristics of low power consumption, low heat-generation, long lifetime, small size, high response speed and good photoelectric property, such as stable light-emitting wavelength. Therefore, the LEDs are widely used in household appliances, indicator lights and optoelectronic products.

The conventional light-emitting diode includes a substrate, an n-type semiconductor layer, an active area and a p-type semiconductor layer formed on the substrate, and p-electrode and n-electrode respectively formed on the p-type semiconductor layer and the n-type semiconductor layer. When the light-emitting diode is energized through the electrodes with a forward bias at a specific value, holes form the p-type semiconductor layer and electrons from the n-type semiconductor layer are combined in the active area to emit light. As light-emitting diodes are applied to different optoelectronic products, the brightness requirements of light-emitting diodes are getting higher.

SUMMARY OF THE DISCLOSURE

A light-emitting device includes a semiconductor stack including a first semiconductor layer including a first part and a second part connected to the first part; and a semiconductor mesa including an active region formed on the first part and a second semiconductor layer formed on the active region; a first insulative layer formed on the semiconductor stack and including a plurality of first openings, wherein the plurality of first openings includes a first group and a second group; a reflective conductive structure formed on the first insulative layer and electrically connected to the second semiconductor layer through the first group of the plurality of first openings; a second insulative layer formed on the reflective conductive structure and including a plurality of second openings and a contact area, wherein the plurality of second openings includes a first group and a second group, and wherein the contact area includes one or multiple covering portions and the first group of the plurality of second openings, the one or multiple covering portions are overlapped with the first group of the plurality of first openings, and the first group of the plurality of second openings and the first group of the plurality of first openings are arranged in a staggered manner; a first pad formed on the second insulative layer and electrically connected to the first semiconductor layer through the second group of the plurality of first openings and the second group of the plurality of second openings; and a second pad formed on the second insulative layer and electrically connected to the second semiconductor layer through the first group of the plurality first openings and the first group of the plurality of second openings.

BRIEF DESCRIPTION OF THE DRAWINGS

FIGS. 3-18B show top views and cross-sectional views of the light-emitting device 10 in corresponding manufacturing steps.

FIGS. 19A-19E show top views of the light-emitting devices 11-15 in accordance with embodiments of the present application.

DETAILED DESCRIPTION OF THE EMBODIMENTS

Figure 1A:
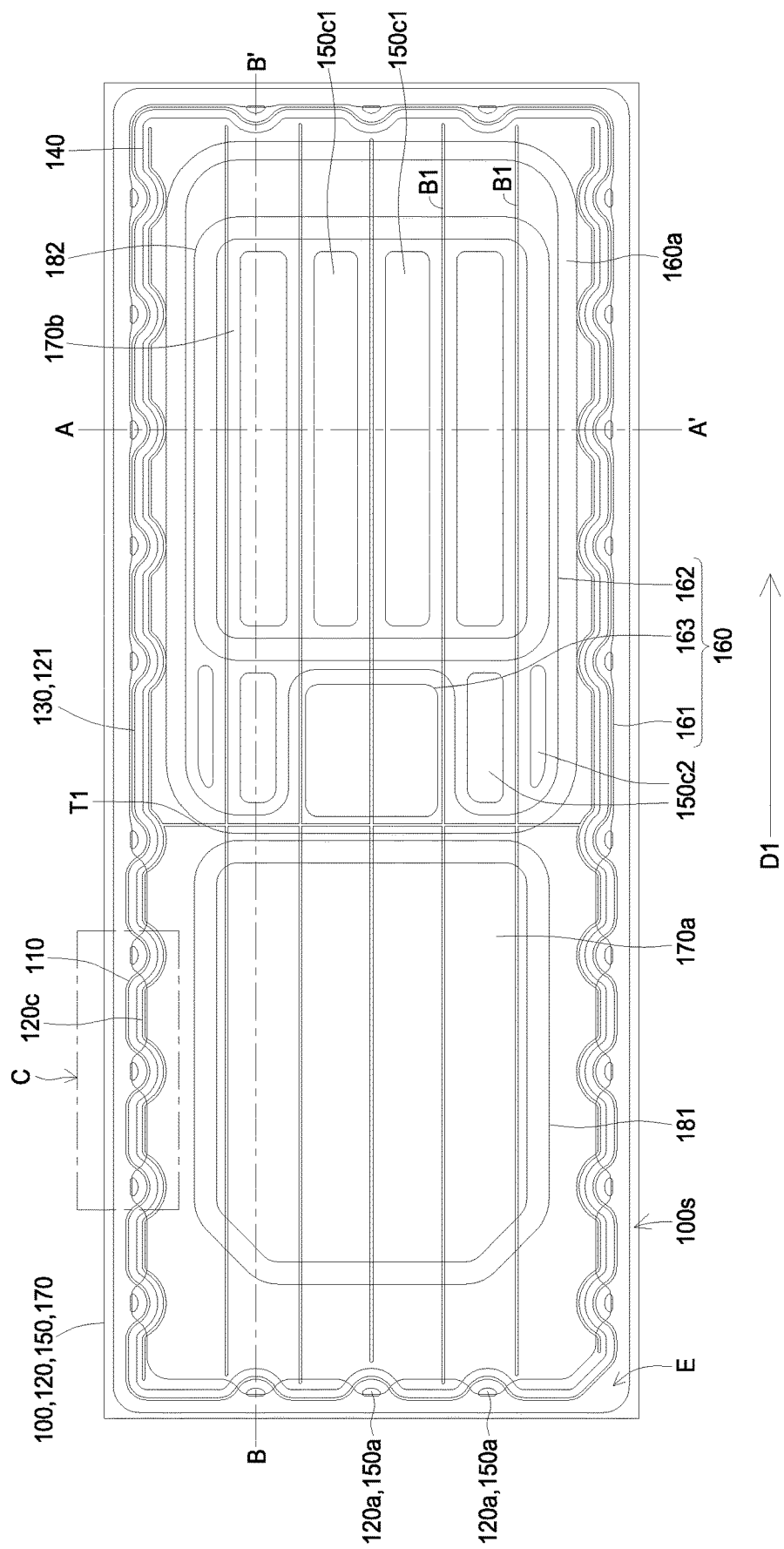
FIG. 1A shows a top view of the light-emitting device 10 in accordance with an embodiment of the present application.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. The ordinal numbers used in the present application, such as "first", "second", and "third", are used to modify elements, they do not imply and represent that the element has any previous ordinal numbers, and they do not represent the order of one element relative to another, or the order of manufacture steps. The ordinal numbers are used to clearly distinguish elements with the same designation. Further, dimensions, materials, shapes, relative arrangements, etc. of the components described in the embodiments in the present application are not limited, and the scope of the present application is not limited thereto, but is merely illustrative. Moreover, the drawings are not precise scale and the dimensions, relative positions, etc. of components may be exaggerated for clarity. In addition, additional layers/structures or steps may be incorporated into the following embodiments. For example, "the formation of a second layer/structure on a first layer/structure" in the description may include embodiments in which the first and second layers/features are formed in direct contact, and may also include embodiments in which the first and second layers/features are formed in indirect contact. That is, additional layers/structures may be formed between the first and second layers/structures. Besides, the spatial relationship between the first layer/structure and the second layer/structure may change according to the operation or usage of the device. The first layer/structure is not limited to a single layer or a single structure. The firs layer may include multiple sub-layers, and the first structure may include multiple sub-structures. In present application, different embodiments may use like and/or corresponding reference numerals to denote like and/or corresponding elements for clarity. It is contemplated that the elements and features of one embodiment may be beneficially incorporated in another embodiment without further recitation.

Figure 2A:
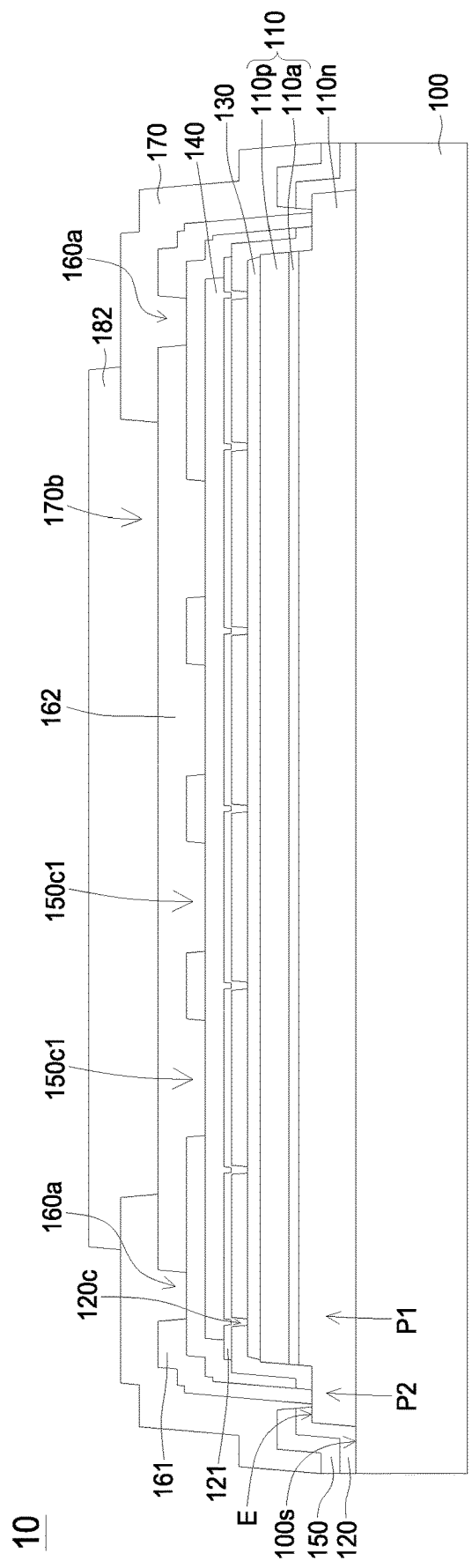
FIG. 2A shows a cross-sectional view along the line A-A' in FIG. 1A.
Figure 2B:
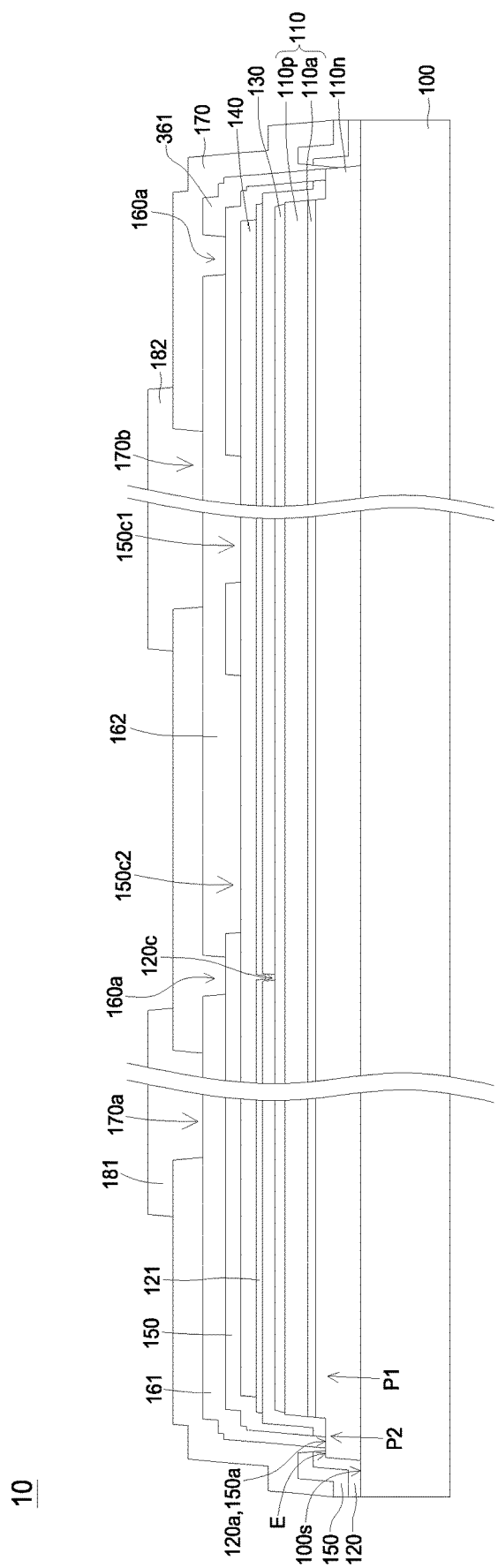
FIG. 2B shows a cross-sectional view along the line B-B' in FIG. 1A.
Figure 3:
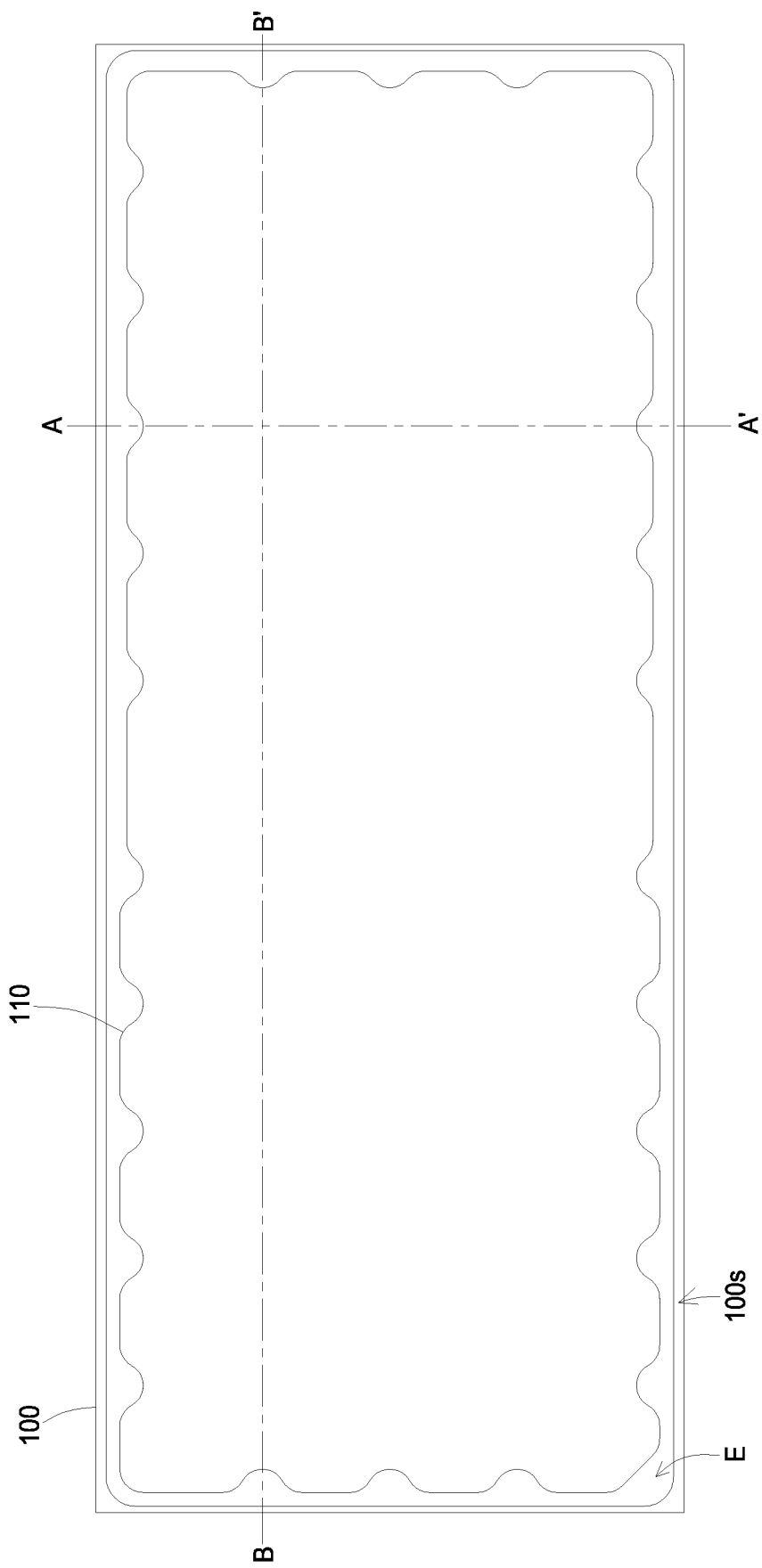

FIG. 1A shows a top view of the light-emitting device 10 in accordance with an embodiment of the present application. FIG. 2A shows a cross-sectional view along the line A-A' in FIG. 1A. FIG. 2B shows a cross-sectional view along the line B-B' in FIG. 1A. FIGS. 3-18B show top views and cross-sectional views of the light-emitting device 10 in corresponding manufacturing steps. The manufacturing method of the light-emitting device 10 is described in detail as follows. First, referring to FIG. 3 and FIGS. 4A-4B, a first semiconductor layer 110n is formed on a substrate 100, and an active region 110a and a second semiconductor layer 110p are sequentially formed on the first semiconductor layer 110n. FIG. 3 shows a top view after the above-mentioned steps in the manufacturing method of the light-emitting element 10 are completed, and FIGS. 4A-4B respectively show cross-sectional views along line A-A' and line B-B' in FIG. 3. The substrate 100 and the first semiconductor layer 110n, the active region 110a and the second semiconductor layer 110p on the substrate 100 form a semiconductor wafer. The semiconductor wafer is separated into a plurality of light-emitting devices 10 after the dicing process. The figures and the descriptions of the following embodiment will use a single light-emitting device 10 as a representative.

The substrate 100 can be a growth substrate, including a substrate for growing AlGaInP semiconductor thereon, such as GaAs substrate or GaP substrate, or a substrate for growing InGaN or AlGaN thereon, such as sapphire substrate, GaN substrate, SiC substrate, or AlN substrate. The substrate 100 includes a substrate surface 100s. The substrate 100 can be a patterned substrate which has a plurality of patterned structures on the substrate surface 100s (not shown). In an embodiment, the light emitted from the active region 110a can be refracted and/or reflected by the patterned structures of the substrate 100 so the brightness of the light-emitting device 10 can be improved. In addition, the patterned structures suppress the dislocation between the substrate 100 and the first semiconductor layer 110n, the active region 110a and the second semiconductor layer 110p caused by the lattice mismatch so the epitaxial quality can be improved.

In an embodiment of the present application, the first semiconductor layer 110n, the active region 110a and the second semiconductor layer 110p are formed on the substrate 100 by epitaxy processes such as metal-organic chemical vapor deposition (MOCVD), molecular beam epitaxy (MBE), hydride vapor epitaxy (HYPE), or physical vapor deposition such as sputtering or evaporating.

In an embodiment, a buffer structure (not shown) may be formed on the substrate 100 before the first semiconductor layer 110n is formed on the substrate 100. The buffer structure can reduce the lattice mismatch and suppress the dislocation, thereby improving the epitaxial quality. The material of the buffer structure includes GaN, AlGaN, or AlN. In an embodiment, the buffer structure includes a plurality of sub-layers (not shown). The sub-layers include the same material or different materials. In an embodiment, the buffer structure includes two sub-layers, wherein a first sub-layer thereof is grown by sputtering and a second sub-layer thereof is grown by MOCVD. In another embodiment, the buffer structure further includes a third sub-layer. The third sub-layer is grown by MOCVD, and the growth temperature of the second sub-layer is higher or lower than the growth temperature of the third sub-layer. In an embodiment, the first, second, and third sub-layers include the same material, such as AlN. In an embodiment of the present application, the first semiconductor layer 110n and the second semiconductor layer 110p are, for example, a cladding layer or a confinement layer having different conductivity types, different electrical properties, different polarities, or different dopants for providing electrons or holes. For example, the first semiconductor layer 110n is an n-type semiconductor and the second semiconductor layer 110p is a p-type semiconductor. The active region 110a is formed between the first semiconductor layer 110n and the second semiconductor layer 110p. Driven by a current, electrons and holes are combined in the active region 110a to convert electrical energy into optical energy for illumination. The wavelength of the light emitted by the light-emitting device 10 can be adjusted by changing the physical properties and chemical composition of one or more layers in the active region 110a.

The materials of the first semiconductor layer 110n, the active region 110a and the second semiconductor layer 110p include III-V semiconductor like $Al_xIn_yGa_{(1-x-y)}N$ or $Al_xIn_yGa_{(1-x-y)}P$, where $0 \leq x$, $y \leq 1$; $x+y \leq 1$. When the material of the active region 110a includes AlInGaP, the active region 110a emits red light having a wavelength between 610 nm and 650 nm or yellow light having a wavelength between 550 nm and 570 nm. When the material of the active region 110a includes InGaN, the active region 110a emits blue light or deep blue light having a wavelength between 400 nm and 490 nm or green light having a wavelength between 490 nm and 550 nm. When the material of the active region 110a includes AlGaN, the active region 110a emits UV light having a wavelength between 250 nm and 400 nm. The active region 110a can be a single hetero-structure (SH), a double hetero-structure (DH), a double-side double hetero-structure (DDH), or a multi-quantum well (MQW). The material of the active region 110a can be i-type semiconductor, p-type semiconductor, or n-type semiconductor.

Figure 4A:
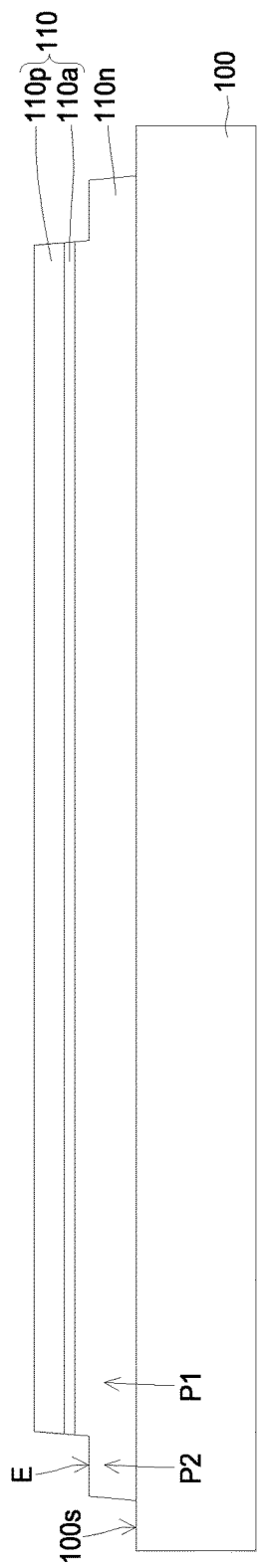
Figure 4B:
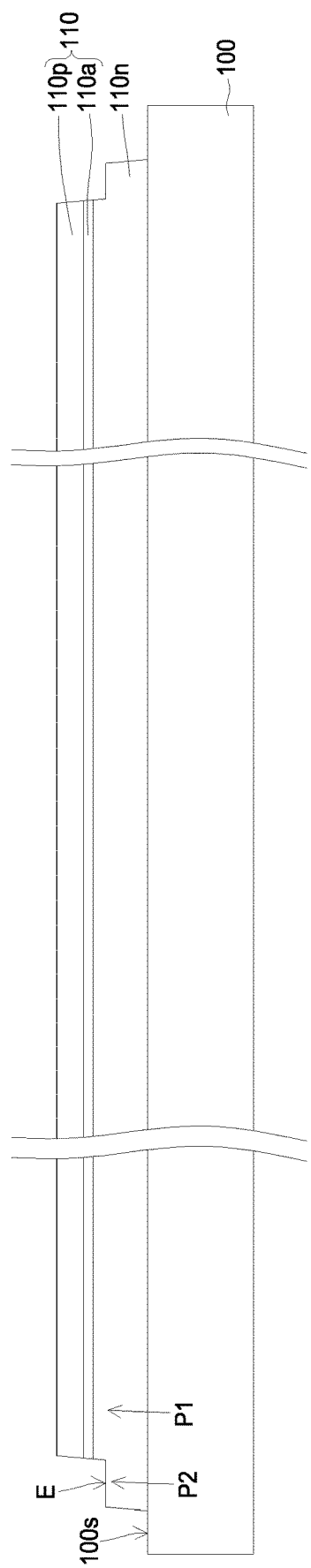

Next, a step of forming an exposed area is implemented, including implementing a step of forming a peripheral exposed area E. FIG. 3 shows a top view after the above-mentioned steps in the manufacturing method of the light-emitting element 10 are completed, and FIGS. 4A-4B respectively show cross-sectional views along line A-A' and line B-B' in FIG. 3. Referring to FIG. 3 and FIGS. 4A-4B, the first semiconductor layer 110n includes a first part P1 and a second part P2 connected to the first part P1, and the second semiconductor layer 110p and the active region 110a on the second part P2 are removed from the top surface of the second semiconductor layer 110p, or part of the first semiconductor layer 110n is further removed to a certain depth, to expose the top surface of the first semiconductor layer 110n to form a peripheral exposed area E. In an embodiment, the second part P2 surrounds the first part P1. The active region 110a and the second semiconductor layer 110p on the first part P1 form a semiconductor mesa 110. In an embodiment, the method of removing the second semiconductor layer 110p and the active region 110a on the second part P2 includes defining the first part P1 and the second part P2 with a photomask, and then removing the second semiconductor layer 110p and the active region 110a on the second part P2 by etching. In this embodiment, the peripheral exposed area E is not covered by the semiconductor mesa 110 and surrounds the semiconductor mesa 110, and the second part P2 of the first-type semiconductor layer 110n is exposed. The peripheral exposed area E includes a bottom and a sidewall, the bottom is formed by the top surface of the second part P2 of the first-type semiconductor layer 110n, and the sidewall is formed by the side surface of the semiconductor mesa 110 connected to the top surface of the second part P2. In an embodiment, a portion of the second part P2 located around the semiconductor mesa 110 is further removed to expose the substrate surface 100s to form an isolation region. The isolation region serves as the location for dividing line (not shown) in the dicing process that separates and defines the light-emitting devices 10. In an embodiment, as shown in FIG. 3, the contour of the semiconductor mesa 110 is wavy, zigzag, square wave or other non-linear patterns. The pattern of the contour of the semiconductor mesa 110 can improve the light extraction efficiency of the light-emitting device 10.

Figure 5:
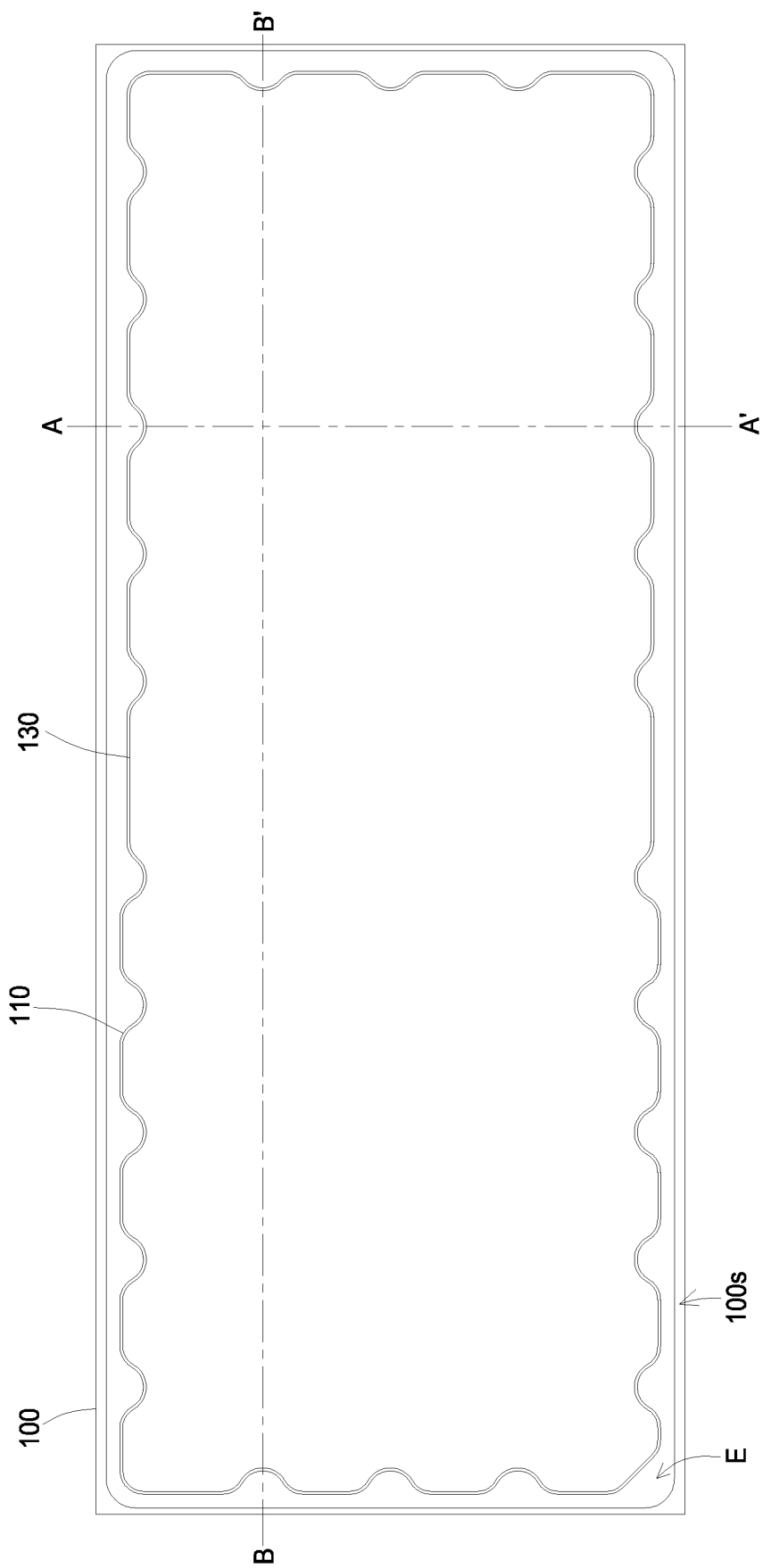
Figure 6A:
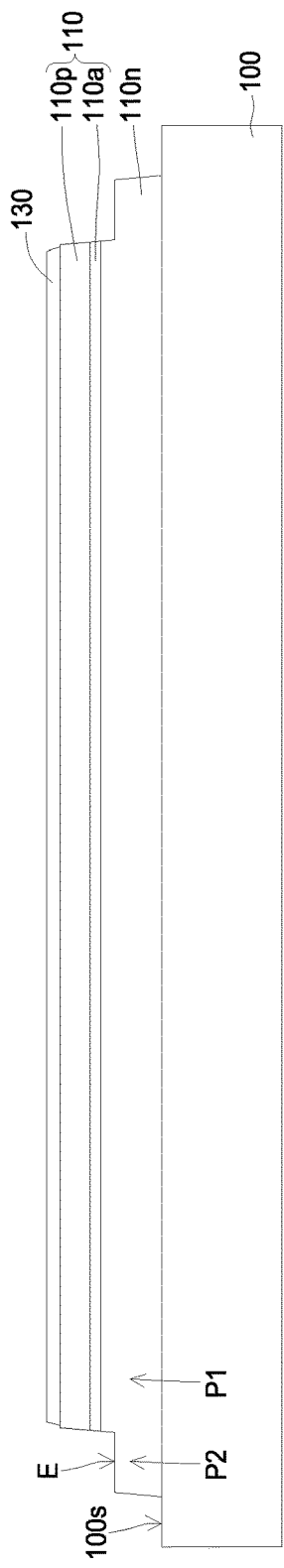
Figure 6B:
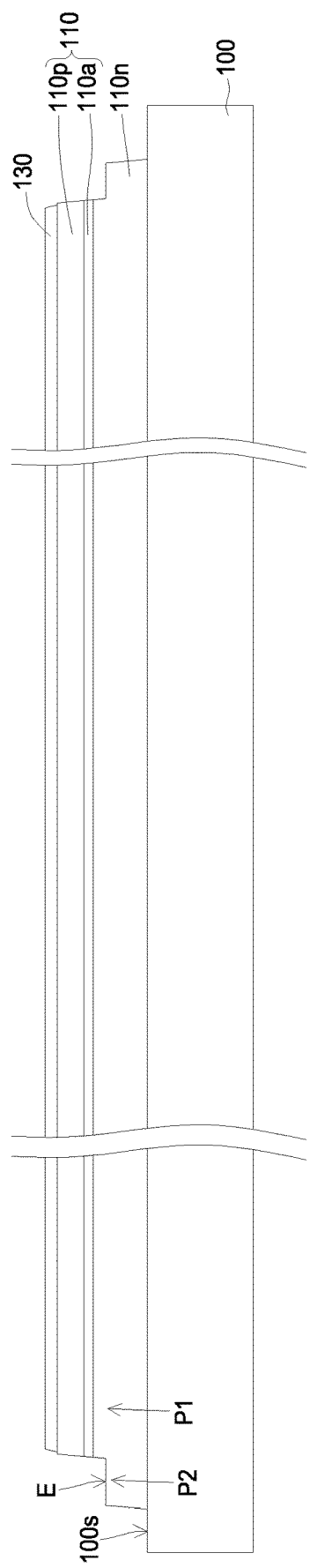

Next, referring to FIG. 5 and FIGS. 6A-6B, a transparent conductive layer 130 is formed. FIG. 5 shows a top view after the above-mentioned steps in the manufacturing method of the light-emitting element 10 are completed, and FIGS. 6A-6B respectively show cross-sectional views along line A-A' and line B-B' in FIG. 5. The transparent conductive layer 130 covers the top surface of the second semiconductor layer 110p and is electrically connected to the second semiconductor layer 110p. In an embodiment, the edge of the transparent conductive layer 130 is retracted from the edge of the second semiconductor layer 110p. The material of the transparent conductive layer 130 includes metal or transparent conductive oxide material. In an embodiment, the transparent conductive layer 130 can be a thin film with high transparency made of metal. The metal includes gold (Au), aluminum (Al), titanium (Ti), nickel (Ni), chromium (Cr) or alloy or stack of the above materials. The transparent conductive oxide material is transparent to the light emitted from the active region 110a, such as indium tin oxide (ITO), zinc oxide (ZnO), aluminum zinc oxide (AZO), gallium zinc oxide (GZO), indium zinc oxide (IZO) or graphene.

Figure 7:
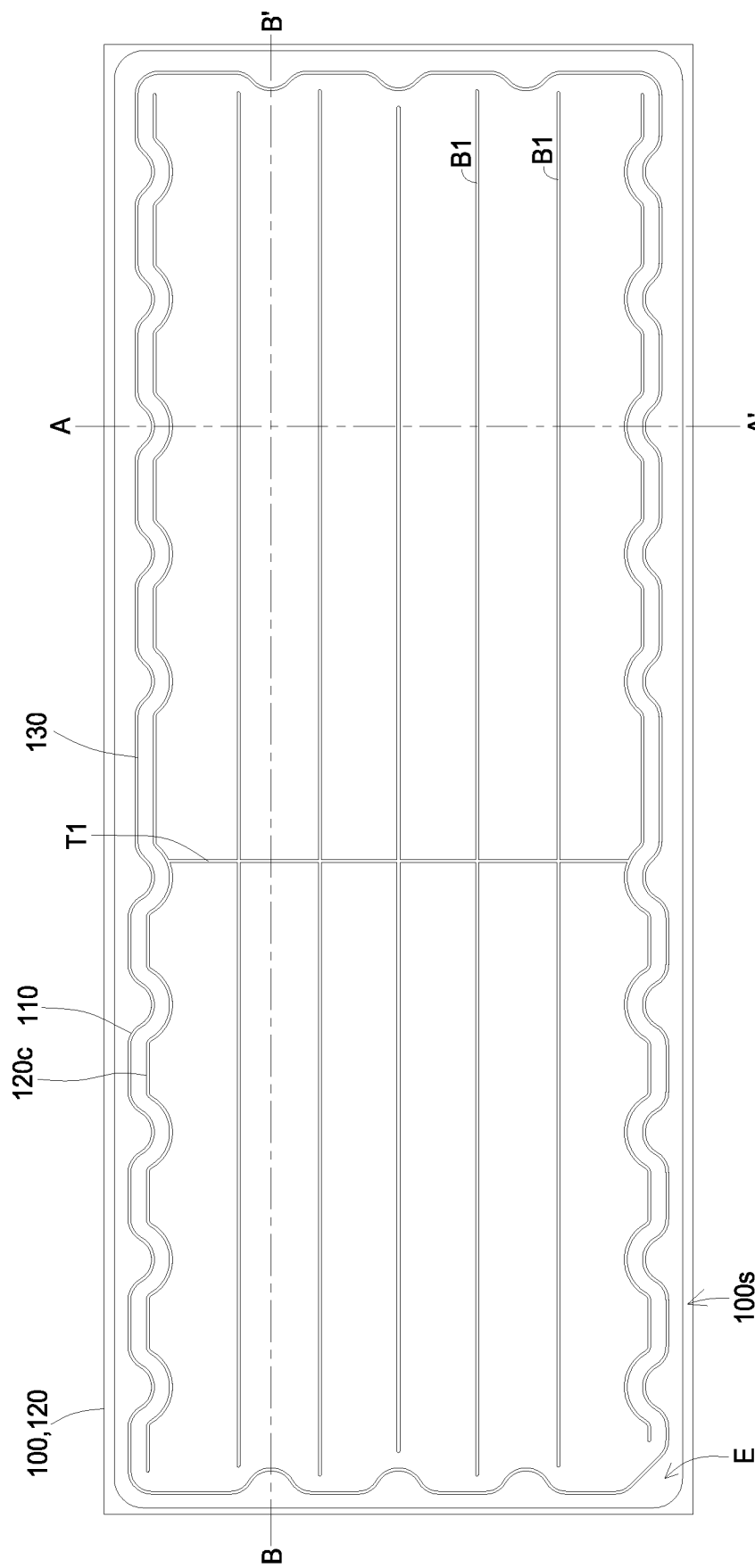
Figure 8A:
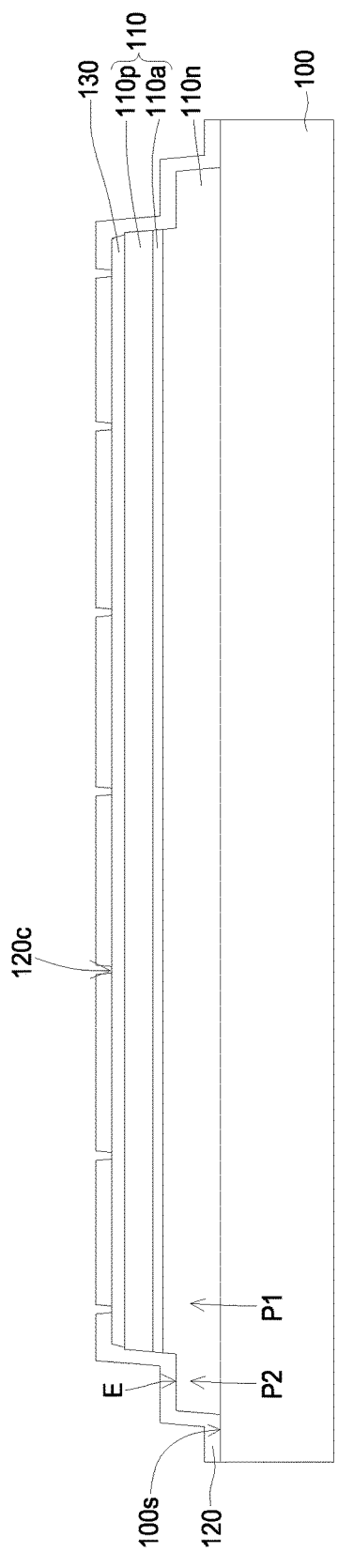
Figure 8B:
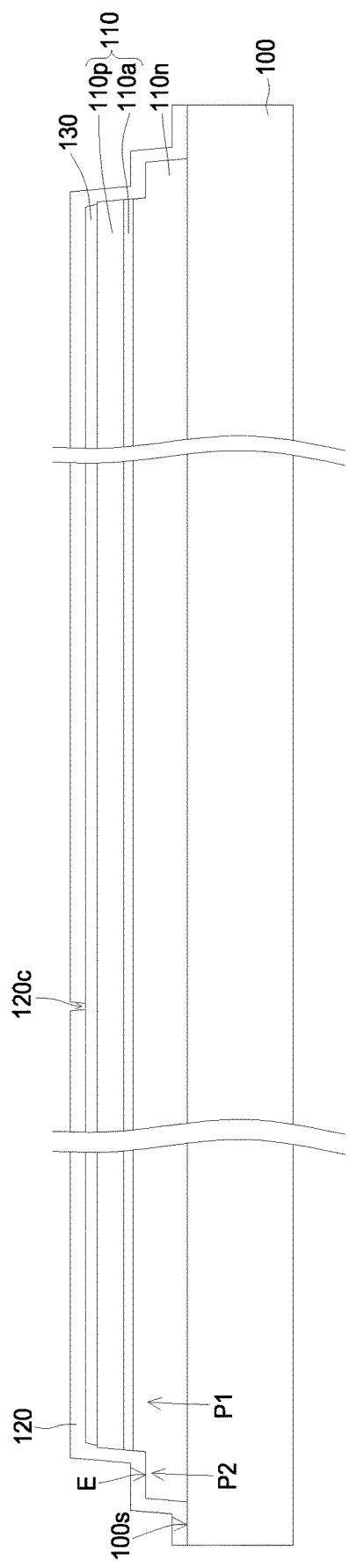

After the transparent conductive layer 130 is formed, referring to FIG. 7 and FIGS. 8A-8B, a step of forming a first insulative layer 120 is implemented. FIG. 7 shows a top view after the above-mentioned steps in the manufacturing method of the light-emitting element 10 are completed, and FIGS. 8A-8B respectively show cross-sectional views along line A-A' and line B-B' in FIG. 7. The first insulative layer 120 is formed on the second semiconductor layer 110p. In an embodiment, the first insulative layer 120 is formed on the top surface of the transparent conductive layer 130, and extends to cover part of the second semiconductor layer 110p, the side surface of the second part P2 of the first semiconductor layer 110n, a part of the bottom and the sidewall of the peripheral exposed area E, and the substrate surface 100s of the periphery of the substrate 100. The first insulative layer 120 includes a first group of first opening 120c located on the second semiconductor layer 110p and exposing part of the second semiconductor layer 110p and/or the transparent conductive layer 130. The first insulative layer 120 is transparent to the light emitted by the active region 110a. The material of the first insulative layer 120 is a non-conductive material, which includes an organic material or an inorganic material. The organic material includes SU-8 photoresist, benzo cyclobutene (BCB), perfluorocyclobutane (PFCB), epoxy resin, acrylic resin, cycloolefin polymer (COC), polymethylmethacrylate (PMMA), polyethylene terephthalate (PET), polycarbonate (PC), polyetherimide (PEI), polyimide (PI) or fluorocarbon polymer. The inorganic material includes silicon or dielectric material. The dielectric material includes glass, silicon oxide, silicon nitride, silicon oxynitride, niobium oxide, tantalum oxide, hafnium oxide, titanium oxide, magnesium fluoride, or aluminum oxide. The first insulative layer 120 includes multiple sub-layers. In an embodiment, the multiple sub-layers are formed by the dielectric materials including silicon-containing material, such as silicon oxide, silicon nitride, or silicon oxynitride; metal oxide, such as tantalum oxide, niobium oxide, hafnium oxide, titanium oxide, or aluminum oxide; metal fluoride, such as magnesium fluoride. The first insulative layer 120 can be a distributed Bragg reflector (DBR), which is formed of a material stack with different refractive indexes and thickness arranged to reflect the light of a specific wavelength range emitted by the active region 110a. The first insulative layer 120 can be formed by atomic layer deposition (ALD), sputtering, evaporation, or spin-coating. In an embodiment, before forming the transparent conductive layer 130 and the first insulative layer 120, a protective layer (not shown) is formed to cover the side surface of the semiconductor mesa 110, and then the first insulative layer 120 is formed on the top surface of the second semiconductor layer 110p and the top surface of the transparent conductive layer 130. Specifically, the protective layer covers part of the second semiconductor layer 110p, the side surface of the second part P2 of the first semiconductor layer 110n, a part of the bottom and the sidewall of the peripheral exposed area E, and the substrate surface 100s of the periphery of the substrate 100, and then the transparent conductive layer 130 and the first insulative layer 120 are formed on the second semiconductor layer 110p. In this embodiment, the transparent conductive layer 130 may extend to cover part of the protective layer. In an embodiment, the transparent conductive layer 130 may extend to cover part of the protective layer, but not beyond the edge of the semiconductor mesa 110. In another embodiment, the transparent conductive layer 130 may extend to cover part of the protective layer, and extend beyond the edge of the semiconductor mesa 110 to cover the protective layer on the sidewall of the semiconductor mesa 110.

Refer to FIG. 7, FIG. 8A and FIG. 8B. In the step of forming the first insulative layer 120, an insulative material can be disposed first, and then the first group of first opening 120c can be formed by dry etching, wet etching or lift-off the insulative material to expose part of the second semiconductor layer 110p and/or the transparent conductive layer 130. In this embodiment, the first group of first opening 120c includes a trench not connected to the peripheral exposed area E in the top view of the light-emitting device 10. Specifically, the end and the edge of the trench are spaced apart from the boundary of the semiconductor mesa 110 by a distance. The trench extends in the first insulative layer 120 to form a fishbone pattern in the top view of the light-emitting device 10. Specifically, the trench includes a trunk T1 and a plurality of branches B1, and the branches B1 respectively extend from two sides of the trunk T1 to form a fishbone pattern on the semiconductor mesa 110 in the top view of the light-emitting device 10. In an embodiment, the branches B1 are respectively branched from two sides of the trunk T1 along the direction perpendicular to the extending direction of the trunk T1. In an embodiment, the branches B1 on both sides of the trunk T1 may be symmetrical or asymmetrical. In an embodiment, the number, lengths and/or widths of the branches B1 on both sides of the trunk T1 may be the same or different. In an embodiment, the lengths and/or widths of the trunk T1 and the branch B1 may be the same or different. In an embodiment, the distance between two adjacent branches B1 may be the same or different. In an embodiment, the number of branches B1, the lengths and widths of the trunk T1 and branches B1, the distance between two adjacent branches B1, and the ratio of the total area of the trench to the area of the substrate 100 can be designed and adjusted according to the size and photoelectric characteristics requirements. In an embodiment, the widths of the trunk T1 and the branches B1 may be 1 μm to 20 μm. In an embodiment, the distance between two adjacent branches B1 may be 10 μm to 200 μm. In an embodiment, the ratio of the total top view area of the trench to the top view area of the substrate 100 may be 1% to 20%. The present application is not limited to the above range of values. In the low current density products, for example, the current density is less than or equal to 0.21 A/mm², the widths of the trunk T1 and branches B1 can be smaller, and the distance between two adjacent branches B1 can be larger. In the high current density products, for example, the current density is greater than or equal to 0.42 A/mm², the widths of the trunk T1 and branches B1 can be relatively large, and the distance between two adjacent branches B1 can be small.

Figure 11:
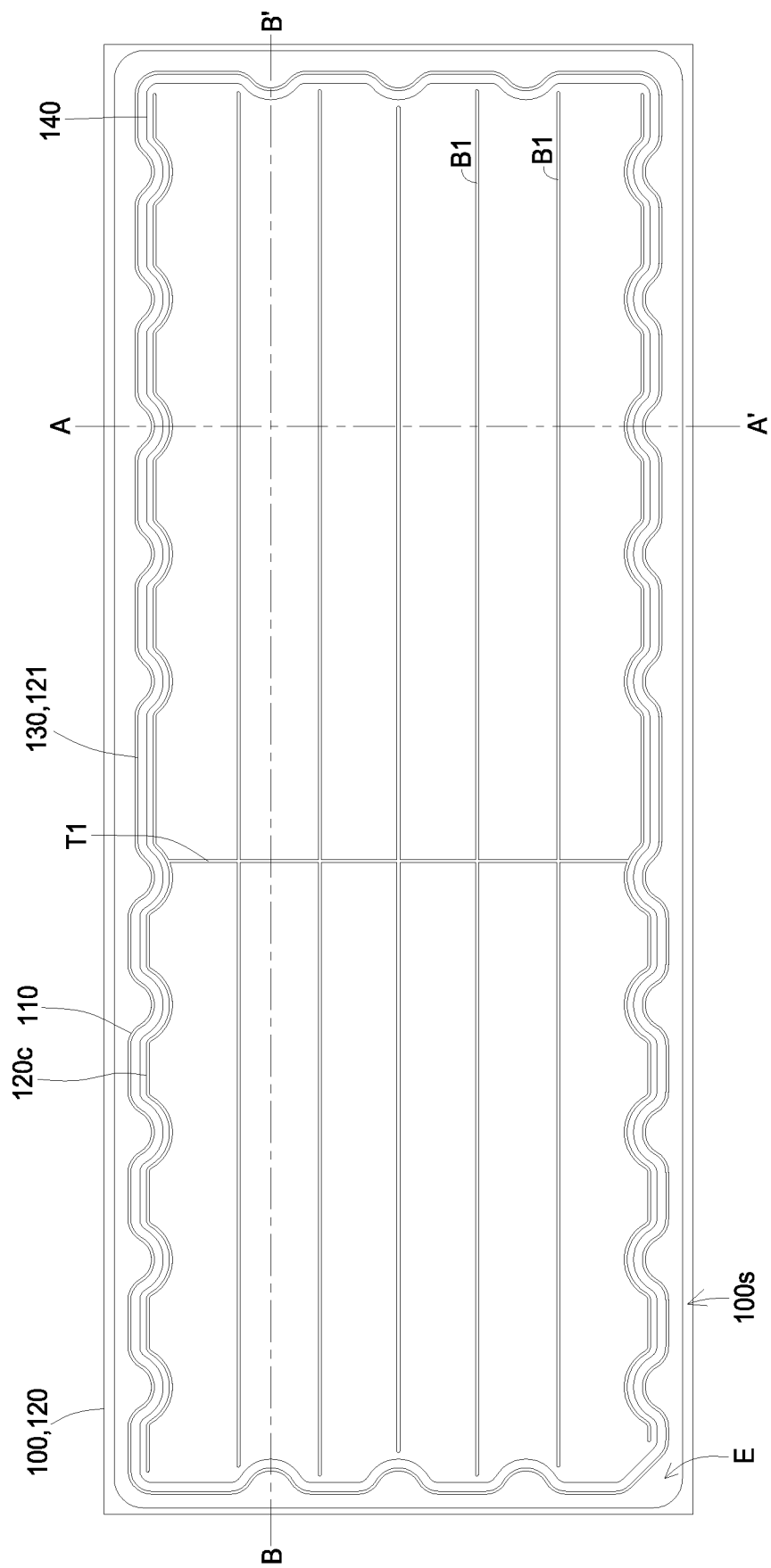
Figure 12A:
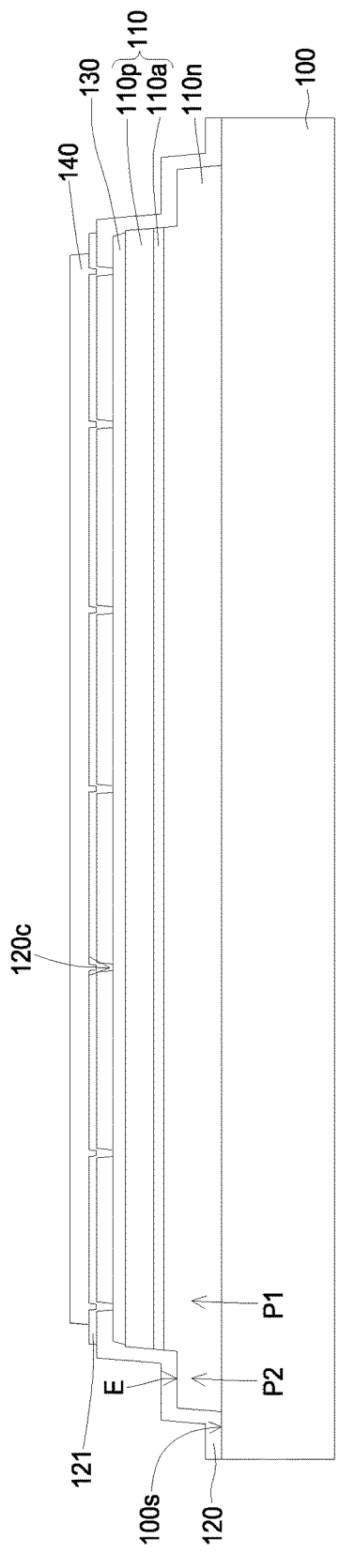
Figure 12B:
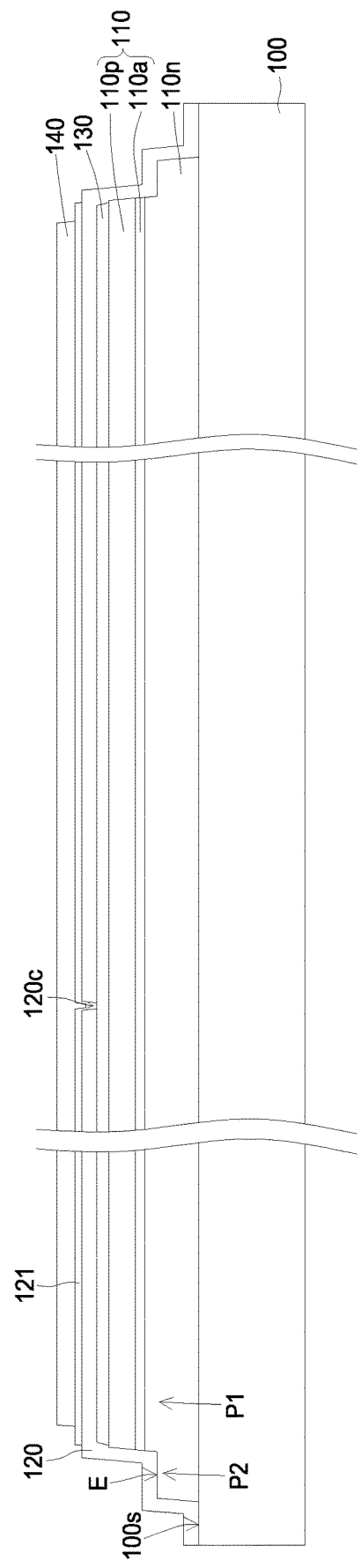

Next, referring to FIG. 11 and FIGS. 12A-12B, a step of forming a reflective conductive structure 140 is implemented. FIG. 11 shows a top view after the above-mentioned steps in the manufacturing method of the light-emitting element 10 are completed, and FIGS. 12A-12B respectively show cross-sectional views along line A-A' and line B-B' in FIG. 11. The reflective conductive structure 140 is formed on the first insulative layer 120 and is electrically connected to the second semiconductor layer 110p through the first group of first opening 120c. The external injection current passes through the reflective conductive structure 140, and then electrically connects to the second semiconductor layer 110p through the first group of first opening 120c to achieve uniform current distribution. In an embodiment, the first insulative layer 120 covers the first semiconductor layer 110n and the side surface of the semiconductor mesa 110, which can protect the first semiconductor layer 110n and the semiconductor mesa 110 from possible damages by subsequent processes or short circuit caused by opposite electrical contacts. In an embodiment, the reflective conductive structure 140 includes a single metal layer or a stack of multiple metal layers, the first insulative layer 120 may include a single layer or a stack of multiple sub-layers, such as a distributed Bragg reflector, and the reflective conductive structure 140 and the first insulating layer 120 form an omnidirectional reflector (ODR) to improve the light reflection and the brightness of the light-emitting device 10. In an embodiment, the ratio of the total top view area of the overlapping portion of the reflective conductive structure 140 and the first insulative layer 120 to the top view area of the semiconductor mesa 110 may be 80% to 99%. In an embodiment, the reflective conductive structure 140 includes a barrier layer (not shown) and a reflective layer (not shown), and the barrier layer is formed on the reflective layer and covers the reflective layer to prevent the migration, diffusion or oxidation of metal elements in the reflective layer. The material of the reflective layer includes a metal material with high reflectivity for the light emitted by the active region 110a, such as silver (Ag), gold (Au), aluminum (Al), titanium (Ti), chromium (Cr), copper (Cu), nickel (Ni), platinum (Pt), ruthenium (Ru) or alloys or stacks of the above materials. The material of the barrier layer includes chromium (Cr), aluminum (Al), platinum (Pt), titanium (Ti), tungsten (W), zinc (Zn), or alloys or stack of the above materials. In an embodiment, the barrier layer is a metal stack formed by alternately stacking two or more layers of metal, such as Cr/Pt, Cr/Ti, Cr/TiW, Cr/W, Cr/Zn, Ti/Al, Ti/Pt, Ti/W, Ti/TiW, Ti/Zn, Pt/TiW, Pt/W, Pt/Zn, TiW/W, TiW/Zn, or W/Zn. In an embodiment, the edge of the reflective conductive structure 140 is retracted from the edge of the second semiconductor layer 110p, and the edge of the transparent conductive layer 130 is retracted from the edge of the reflective conductive structure 140. In other words, there is a distance between the edge of the reflective conductive structure 140 and the edge of the second semiconductor layer 110p, and there is a distance between the edge of the transparent conductive layer 130 and the edge of the reflective conductive structure 140.

Figure 9:
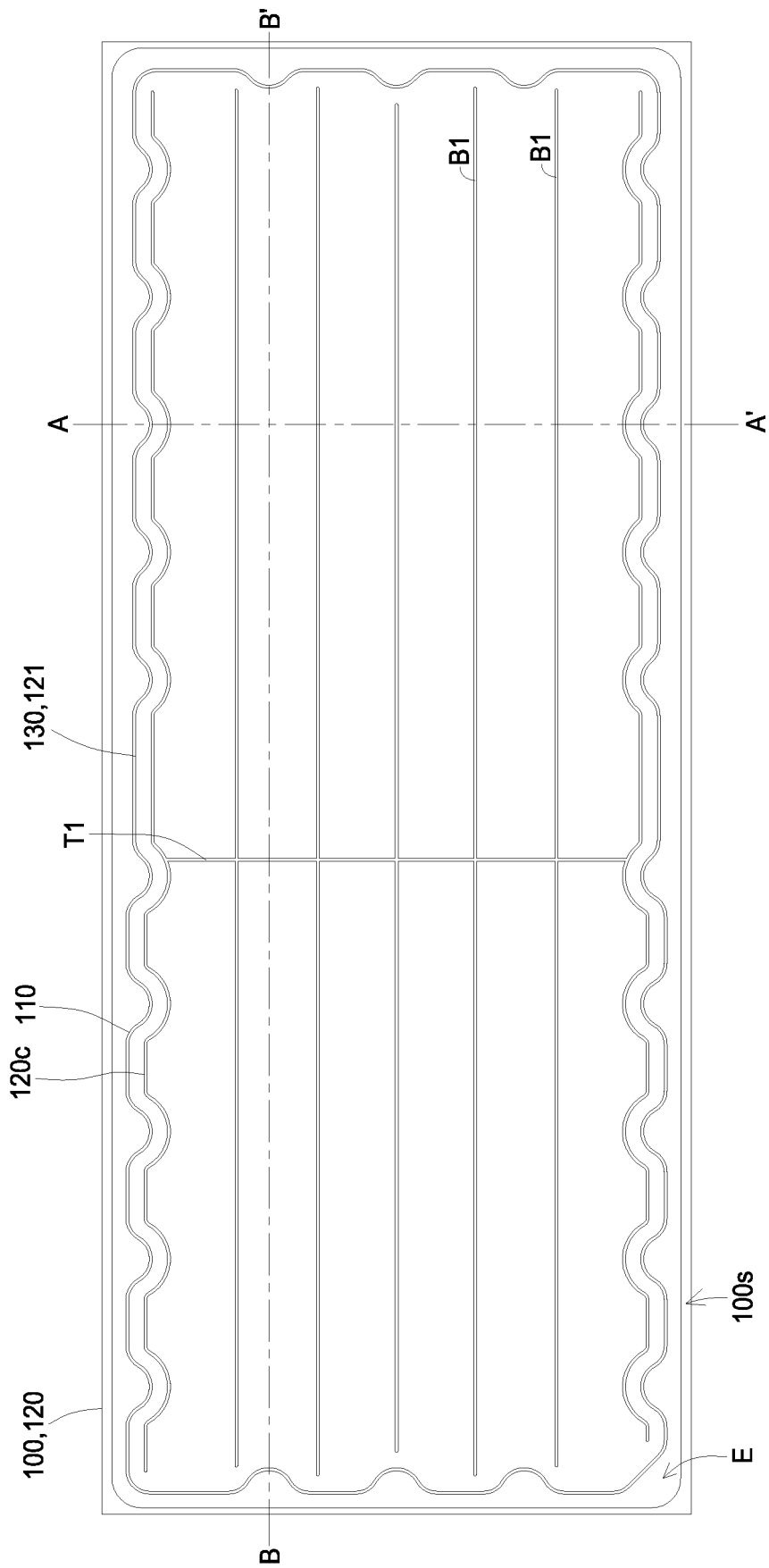
Figure 10A:
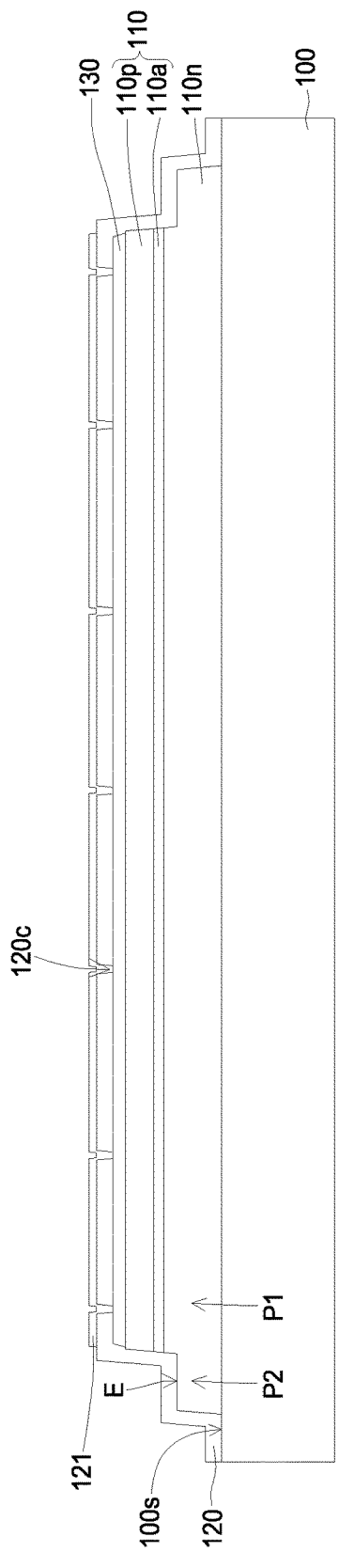
Figure 10B:
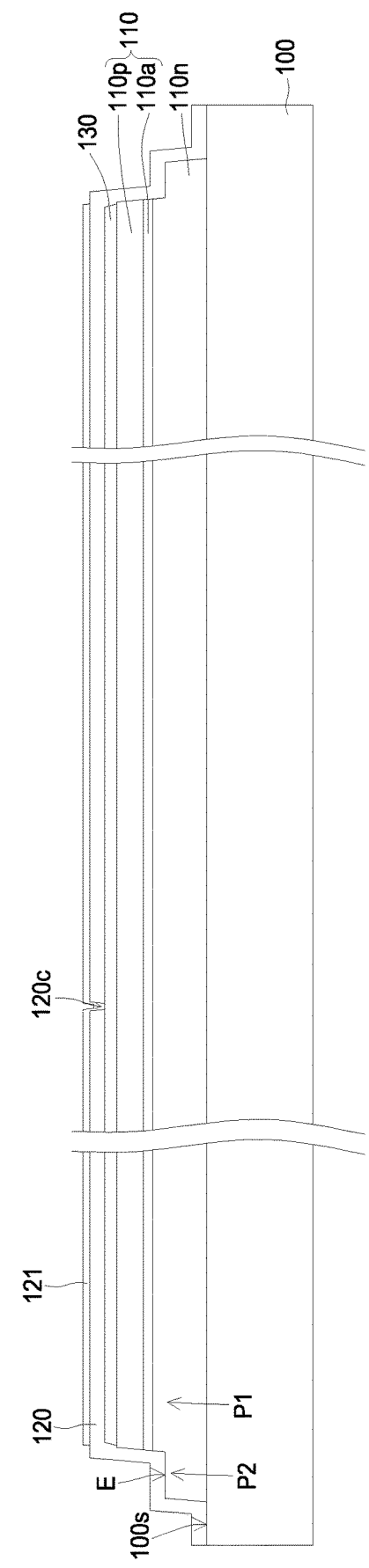

In an embodiment, before forming the reflective conductive structure 140, a step of forming an adhesive layer 121 may be implemented. Referring to FIG. 9 and FIGS. 10A-10B, FIG. 9 shows a top view after the above-mentioned steps in the manufacturing method of the light-emitting element 10 are completed, and FIGS. 10A-10B respectively show cross-sectional views along line A-A' and line B-B' in FIG. 9. The adhesive layer 121 is formed on the first insulative layer 120 and fills the first group of first opening 120c, and is connected to the second semiconductor layer 110p and/or the transparent conductive layer 130 through the first group of first opening 120c. In an embodiment, the adhesive layer 121 is formed on the first insulative layer 120, or is formed on the first insulative layer 120 and extends to the sidewall of the first group of first opening 120c. In an embodiment, the adhesive layer 121 has an adhesive opening (not shown) disposed on the corresponding first group of first opening 120c, and the second semiconductor layer 110p and/or the transparent conductive layer 130 are exposed by the adhesive opening and the first group of first opening 120c. In an embodiment, the edge of the adhesive layer 121 is retracted from the edge of the second semiconductor layer 110p, and the edge of the transparent conductive layer 130 is retracted from the edge of the adhesive layer 121. In other words, the edge of the adhesive layer 121 is located on the second semiconductor layer 110p and is spaced apart from the edge of the second semiconductor layer 110p by a distance, and the edge of the transparent conductive layer 130 is located on the adhesive layer 121 and is spaced apart from the edge of the adhesive layer 121 by a distance. The material of the adhesive layer 121 includes metal or transparent conductive material. In an embodiment, the transparent conductive layer 130 can be a thin film with high transparency made of metal. The metal includes gold (Au), aluminum (Al), titanium (Ti), nickel (Ni), chromium (Cr) or alloy or stack of the above materials. The transparent conductive material is transparent to the light emitted from the active region 110a, such as indium tin oxide (ITO), zinc oxide (ZnO), aluminum zinc oxide (AZO), gallium zinc oxide (GZO), indium zinc oxide (IZO), graphene or titanium nitride. In an embodiment, the adhesive layer 121 includes an adhesive opening (not shown), the material of the adhesive layer 121 may include a dielectric material, such as titanium oxide or aluminum oxide. In an embodiment, the reflective metal layer is silver, and the adhesive layer is indium tin oxide. In an embodiment, the thickness of the adhesive layer 121 is smaller than that of the transparent conductive layer 130 to prevent light absorption from affecting the luminous efficiency. In an embodiment, the reflective conductive structure 140 is formed on the adhesive layer 121, and the adhesion between the reflective conductive structure 140 and the first insulative layer 120 is increased by the adhesive layer 121.

Figure 13:
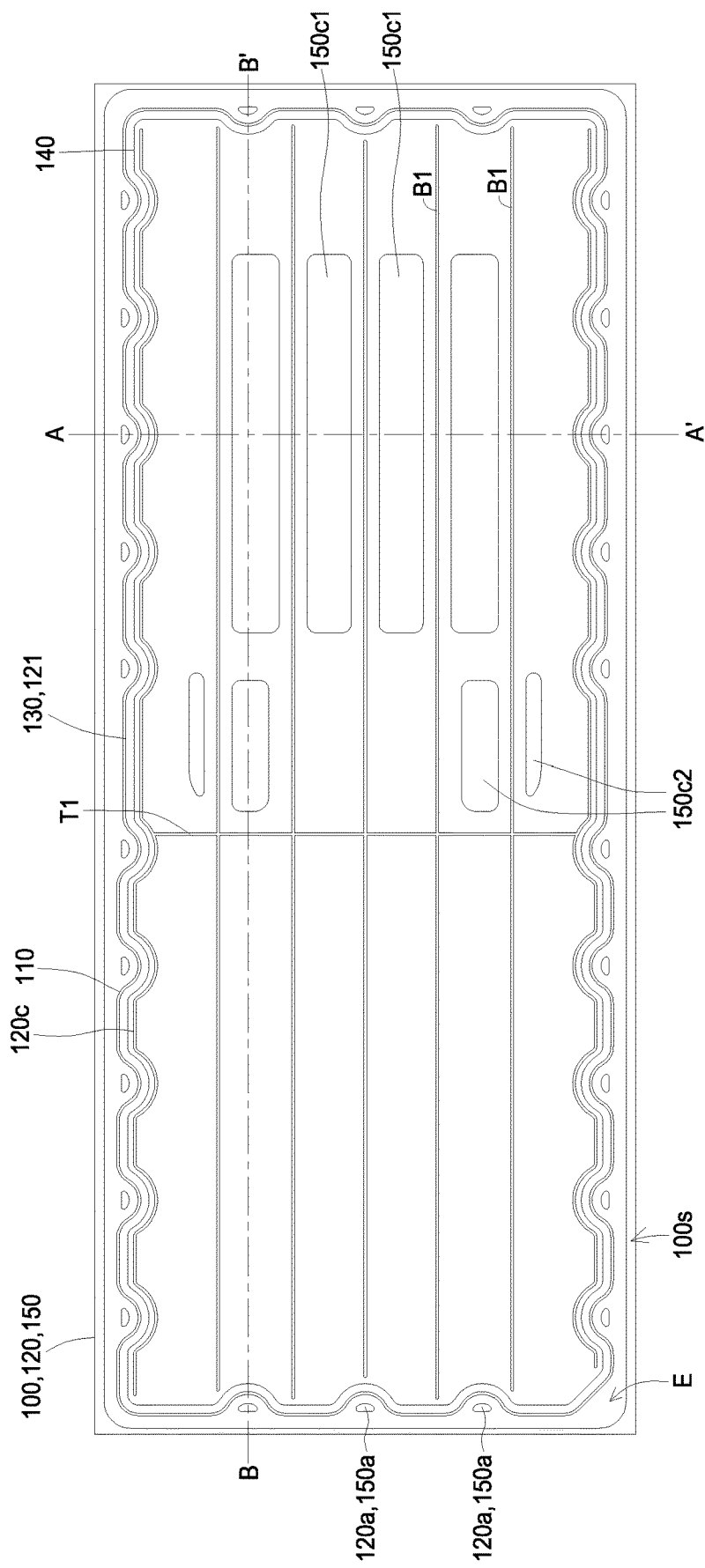
Figure 14A:
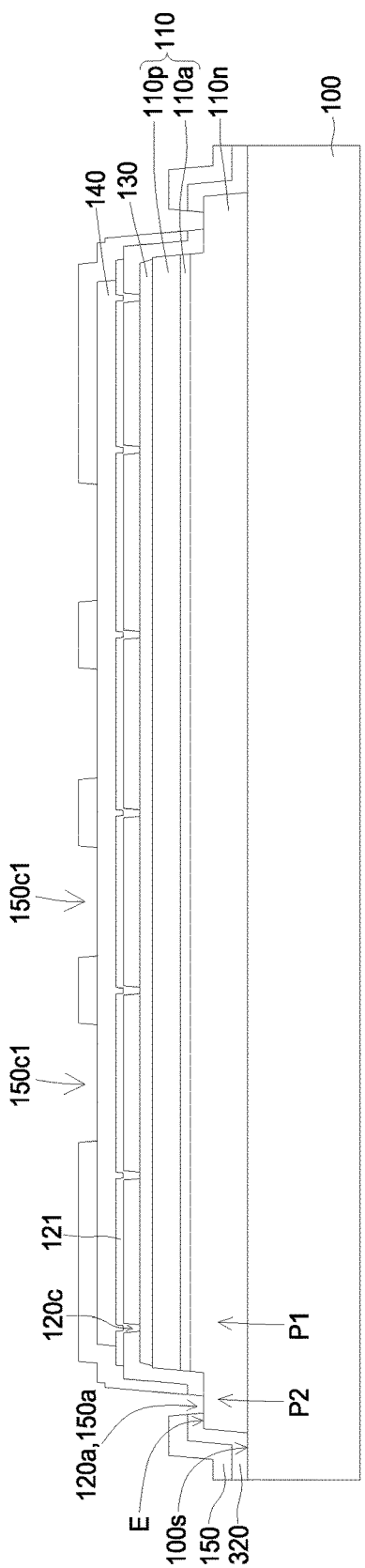
Figure 14B:
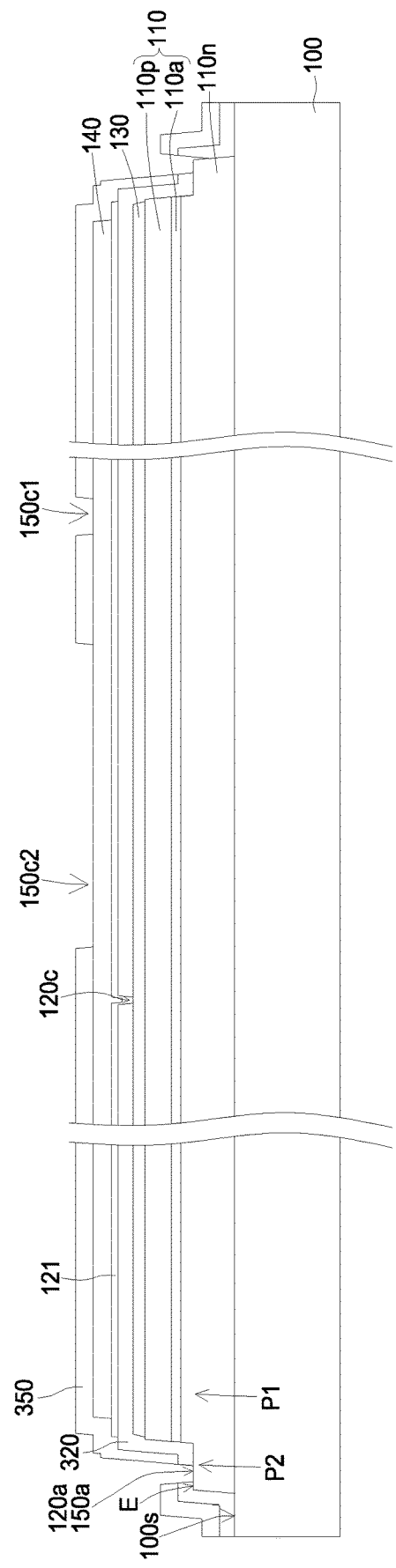

After the reflective conductive structure 140 is formed, referring to FIG. 13 and FIGS. 14A-14B, a step of forming a second insulative layer 150 is implemented. FIG. 13 shows a top view after the above-mentioned steps in the manufacturing method of the light-emitting element 10 are completed, and FIGS. 14A-14B respectively show cross-sectional views along line A-A' and line B-B' in FIG. 13. The second insulative layer 150 is formed on the reflective conductive structure 140. In an embodiment, the second insulative layer 150 is formed on the reflective conductive structure 140 and the first insulative layer 120, and covers the peripheral exposed area E and the substrate surface 100s of the periphery of the substrate 100. In an embodiment, the second insulative layer 150 is formed on part of the reflective conductive structure 140. In an embodiment, the second insulative layer 150 includes a first group of second openings 150c1/150c2 located on the reflective conductive structure 140 and exposing part of the reflective conductive structure 140. The second insulative layer 150 further includes one or multiple second peripheral openings 150a located on the peripheral exposed area E, and exposing part of the second part P2. In the step of forming the second insulative layer 150, an insulative material can be disposed first, and then first group of second openings 150c1/150c2 and the one or multiple second peripheral openings 150a can be formed by dry etching, wet etching or lift-off the insulative material. In an embodiment, the first group of second openings 150c1/150c2 and the first group of first opening 120c are arranged in a staggered manner and do not overlap. In this embodiment, the size, number, and position of the first group of second openings 150c1/150c2 can be adjusted according to the requirements of the light-emitting device. For example, the size and number of the first group of second openings 150c1/150c2 can be adjusted according to electrical requirements. When the size and number of the first group of second openings 150c1/150c2 are large, the forward voltage of the light-emitting device can be reduced. In addition, in order to prevent the first group of second openings 150c1/150c2 from overlapping with the first group of first opening 120c that leads to increase the height difference between stacked layers, while maintaining a total area of the first group of second openings 150c1/150c2, the height difference can be reduced by increasing the number of the first group of second openings 150c1/150c2 and reducing the size of each of the first group of second openings 150c1/150c2. In an embodiment, in the step of forming one or multiple second peripheral openings 150a, one or multiple first peripheral openings 120a of the first insulative layer 120 may be formed at the same time as the one or multiple second peripheral openings 150a are formed. In other words, in the step of removing part of the second insulative layer to form the one or multiple second peripheral openings 150a, the first insulating layer 120 directly under the one or multiple second peripheral openings 150a is also removed to form the one or multiple first peripheral openings 120a to expose the second part P2 of the first semiconductor layer 110n. In an embodiment, the one or multiple first peripheral openings 120a are disposed on the peripheral exposed area E, and the one or multiple second peripheral openings 150a are respectively disposed on the peripheral exposed area E and corresponding to positions of the one or multiple first peripheral openings 120a. The second insulative layer 150 is transparent to the light emitted by the active region 110a. The material of the second insulative layer 150 is a non-conductive material, which includes an organic material or an inorganic material. The organic material includes SU-8 photoresist, benzo cyclobutene (BCB), perfluorocyclobutane (PFCB), epoxy resin, acrylic resin, cycloolefin polymer (COC), polymethylmethacrylate (PMMA), polyethylene terephthalate (PET), polycarbonate (PC), polyetherimide (PEI), polyimide (PI) or fluorocarbon polymer. The inorganic material includes silicon or dielectric material. The dielectric material includes glass, silicon oxide, silicon nitride, silicon oxynitride, niobium oxide, tantalum oxide, hafnium oxide, titanium oxide, magnesium fluoride, or aluminum oxide. The second insulative layer 150 includes multiple sub-layers. In an embodiment, the multiple sub-layers are formed by the dielectric materials including silicon-containing material, such as silicon oxide, silicon nitride, or silicon oxynitride; metal oxide, such as tantalum oxide, niobium oxide, hafnium oxide, titanium oxide, or aluminum oxide; or metal fluoride, such as magnesium fluoride. The second insulative layer 150 can be a distributed Bragg reflector (DBR), which is formed of a material stack with different refractive indexes and thickness arranged to reflect the light of a specific wavelength range emitted by the active region 110a. The second insulative layer 150 can be formed by atomic layer deposition (ALD), sputtering, evaporation, or spin-coating. In an embodiment, since the second insulative layer 150 covers the side surface of the first semiconductor layer 110n and the side surface of the semiconductor mesa 110, which can protect the first semiconductor layer 110n and the semiconductor mesa 110 from possible damages by subsequent processes or short circuit caused by opposite electrical contacts.

Figure 15:
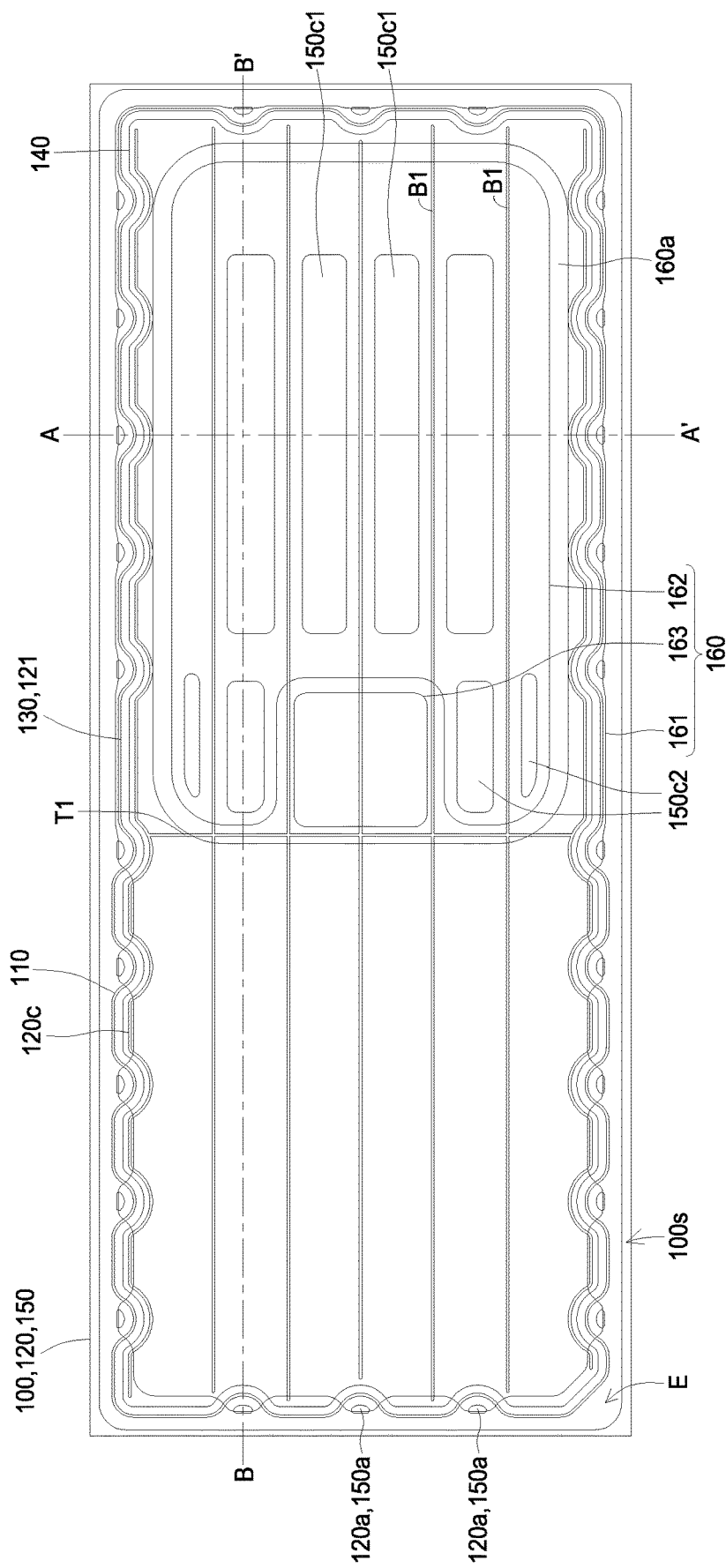
Figure 16A:
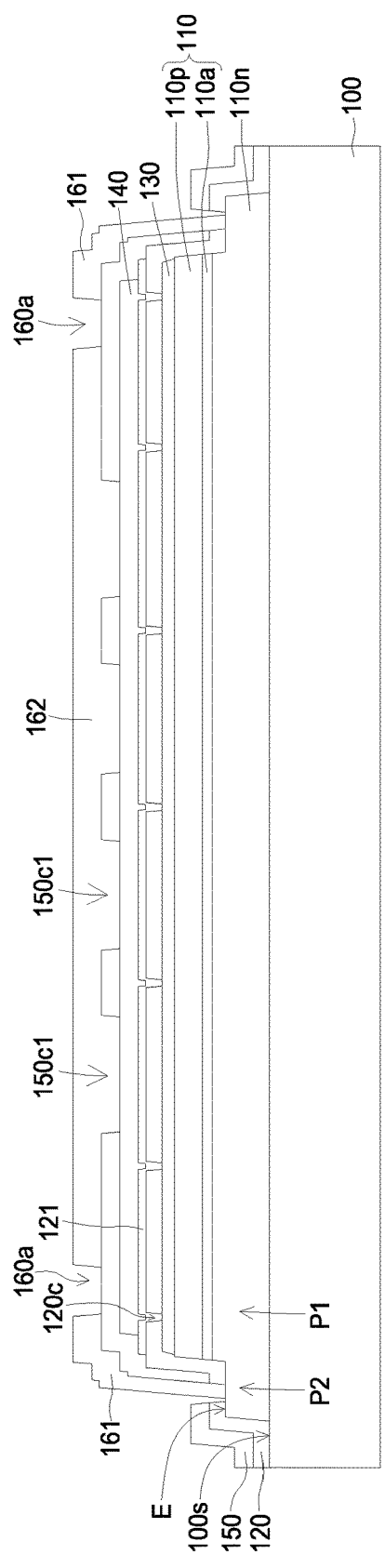
Figure 16B:
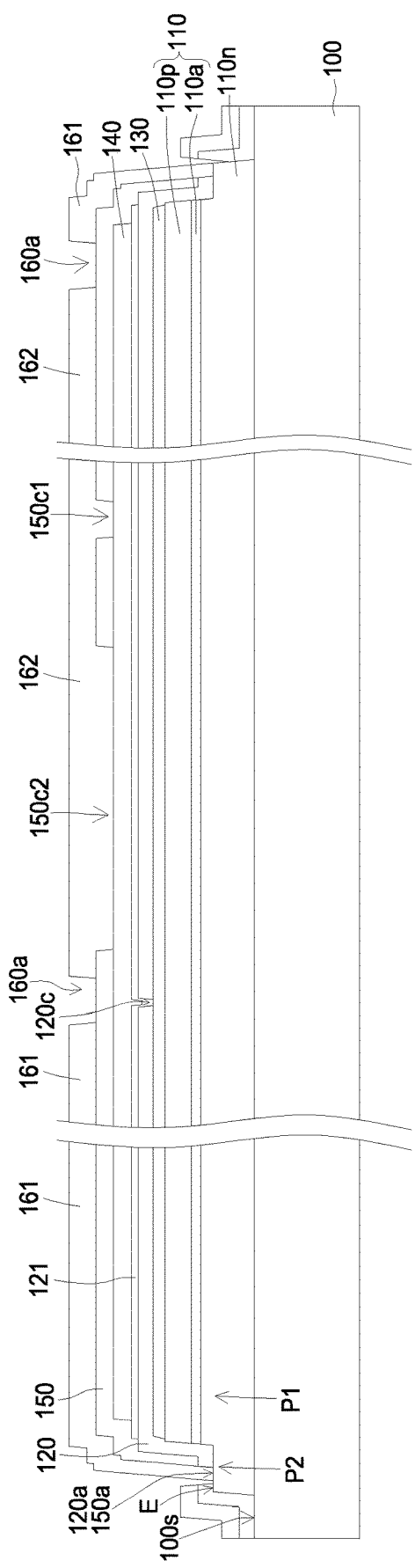

After second insulative layer 150 is formed, referring to FIG. 15 and FIGS. 16A-16B, a step of forming a connective layer 160 is implemented. FIG. 15 shows a top view after the above-mentioned steps in the manufacturing method of the light-emitting element 10 are completed, and FIGS. 16A-16B respectively show cross-sectional views along line A-A' and line B-B' in FIG. 15. The connective layer 160 is formed on the insulative layer 150 and includes a first connective part 161 and a second connective part 162 separated from the first connective part 161. The first connective part 161 covers the first insulative layer 120 and the second insulative layer 150, extends to the peripheral exposed region E, and contacts the second part P2 of the first semiconductor layer 110n through the first peripheral openings 120a and the second peripheral openings 150a to electrically connect to the first semiconductor layer 110n. The second connective part 162 contacts the reflective conductive structure 140 through the first group of second openings 150c1/150c2 and is electrically connected to the second semiconductor layer 110p. In an embodiment, the connective layer 160 further includes a third connective part 163 located between the first connective part 161 and the second connective part 162, and is electrically separated from the first connective part 161 and the second connective part 162. In an embodiment, the first connective part 161 surrounds the second connective part 162 and/or the third connective part 163 in the top view of the light-emitting device 10, and uniform current diffusion can be achieved by the first connective part 161 electrically connected to the first semiconductor layer 110*n* surrounding the second connective part 162 electrically connected to the second semiconductor layer 110*p*. In an embodiment, the third connective part 163 is electrically floating and is used as a pin region of the light emitting device 10, and has a buffer function of absorbing and distributing soldering force. In an embodiment, the third connective part 163 is connected to the first connective part 161 to electrically connect to the first connective part 161, or the third connective part 163 is connected to the second connective part 162 to electrically connect to the second connective part 162. In an embodiment, the connective layer 160 includes metal materials, such as silver (Ag), aluminum (Al), chromium (Cr), platinum (Pt), gold (Au), titanium (Ti), tungsten (W), zinc (Zn) or alloy or stack of the above materials. In an embodiment, the connective layer 160 includes a reflective metal layer, such as silver (Ag) or aluminum (Al), with an adhesive layer (not shown) between the reflective metal layer and the second insulative layer 150 to increase the adhesion between the reflective metal layer and the second insulative layer 150. In an embodiment, the adhesive layer is formed on the second insulative layer 150 corresponding to the first connective part 161 and the second connective part 162. In an embodiment, a part of the adhesive layer covers the first insulative layer 120 and the second insulative layer 150, extends to the peripheral exposed area E, and contacts the second part P2 of the first semiconductor layer 110*n* through the first peripheral openings 120*a* and the second peripheral openings 150*a* to electrically connect to the first semiconductor layer 110*n*. In this embodiment, another part of the adhesive layer contacts the reflective conductive structure 140 through the first group of second openings 150*c*/150*c*2 to electrically connect to the second semiconductor layer 110*p*. In an embodiment, the adhesive layer is formed on the second insulative layer 150 and extends to the sidewalls of the first peripheral openings 120*a*, the second peripheral openings 150*a*, and the first group of second openings 150*c*1/150*c*2, and has multiple adhesive openings (not shown) corresponding to the first peripheral openings 120*a*, the second peripheral openings 150*a*, and the first group of second openings 150*c*1/150*c*2, and the connective layer 160 passes through the adhesive layer openings, the first peripheral openings hole 120*a* and the second peripheral openings 150*a* to contact the first semiconductor layer 110*n* and passes through the adhesive layer openings and the first group of second openings 150*c*1/150*c*2 to contact the reflective conductive structure 140. In an embodiment, the material of the adhesive layer includes metal or transparent conductive material. In an embodiment, the transparent conductive layer 130 can be a thin film with high transparency made of metal. The metal includes gold (Au), aluminum (Al), titanium (Ti), nickel (Ni), chromium (Cr) or alloys or laminates of the above materials. The transparent conductive material is transparent to the light emitted from the active region 110*a*, such as indium tin oxide (ITO), zinc oxide (ZnO), aluminum zinc oxide (AZO), gallium zinc oxide (GZO), indium zinc oxide (IZO), graphene or titanium nitride. In an embodiment, the adhesive layer includes multiple adhesive layer openings (not shown), the material of the adhesive layer may include a dielectric material, such as titanium oxide or aluminum oxide. In an embodiment, the thickness of the adhesive layer is smaller than that of the transparent conductive layer 130 to prevent light absorption from affecting the luminous efficiency.

Figure 17:
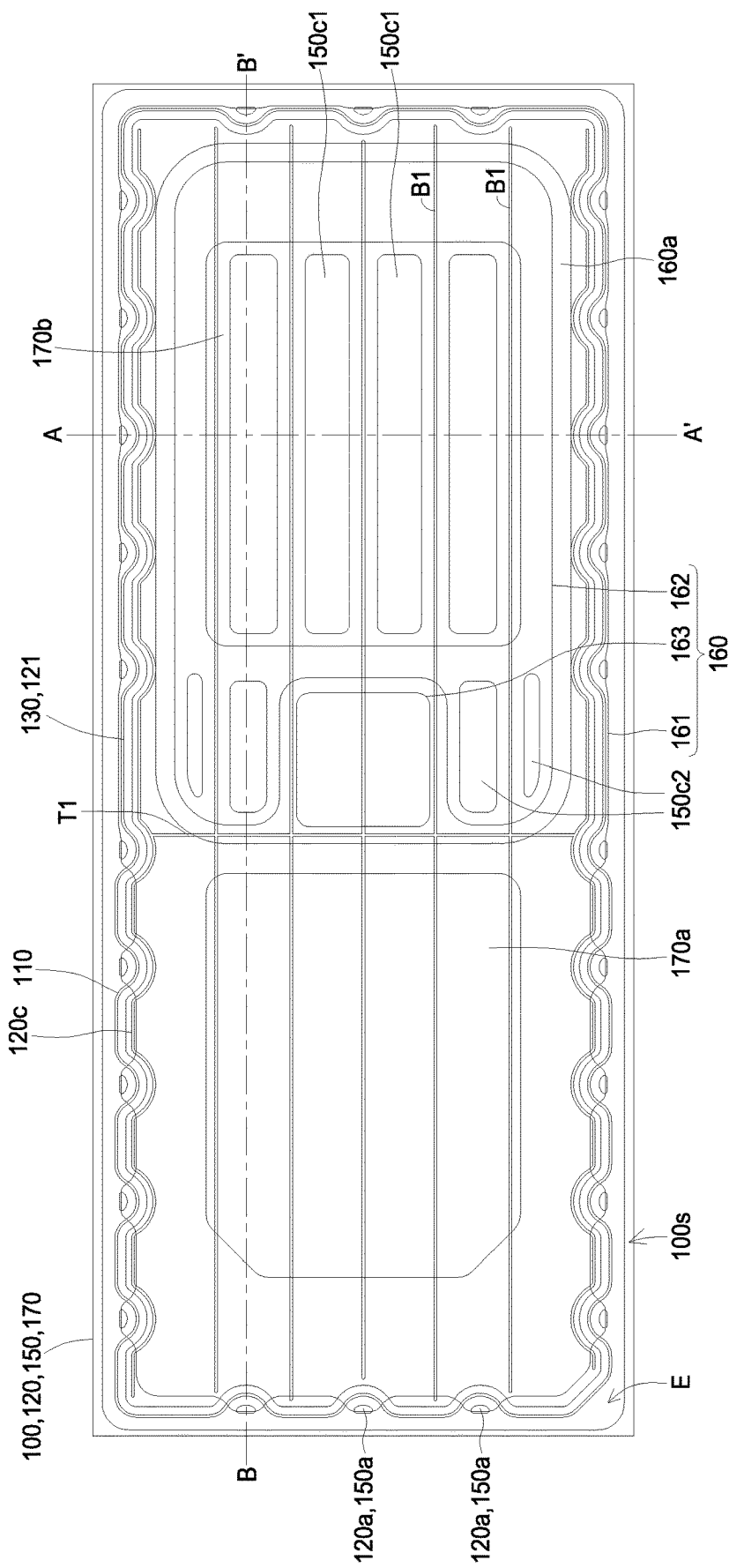

Next, referring to FIG. 17 and FIGS. 18A-18B, a step of forming a third insulative layer 170 is implemented. FIG. 17 shows a top view after the above-mentioned steps in the manufacturing method of the light-emitting element 10 are completed, and FIGS. 18A-18B respectively show cross-sectional views along line A-A' and line B-B' in FIG. 17. The third insulative layer 170 is formed on the connective layer 160, extends to the second insulative layer 150 and covers the peripheral exposed area E and/or the substrate surface 100*s*. In the step of forming the third insulative layer 170, an insulative material can be disposed first, and then one or multiple first pad openings 170*a* exposing the first connective part 161 and one or multiple second pad openings 170*b* exposing the second connective part 162 can be formed by dry etching, wet etching or lift-off the insulative material. In an embodiment, in the top view of the light-emitting device 10, the first group of second openings 150*c*1 is overlapped with the one or multiple second pad openings 170*b* and located within the one or multiple second pad openings 170*b*, and the first group of second openings 150*c*2 is not overlapped with the one or multiple second pad openings 170*b* and located outside the one or multiple second pad openings 170*b*. In this embodiment, since the one or multiple second pad openings 170*b* intersect the first group of second openings 150*c*1/150*c*2, there can be a height difference at the junction, so designing the positional relationship between the first group of second openings 150*c*1/150*c*2 and the one or multiple second pad openings 170*b* can reduce the aforementioned height difference. In an embodiment, the shapes of the one or multiple first pad openings 170*a* and the one or multiple second pad openings 170*b* are different. The third insulative layer 170 is transparent to the light emitted by the active region 110*a*. The material of the third insulative layer 170 is a non-conductive material, which includes an organic material or an inorganic material. The organic material includes SU-8 photoresist, benzo cyclobutene (BCB), perfluorocyclobutane (PFCB), epoxy resin, acrylic resin, cycloolefin polymer (COC), polymethylmethacrylate (PMMA), polyethylene terephthalate (PET), polycarbonate (PC), polyetherimide (PEI), polyimide (PI) or fluorocarbon polymer. The inorganic material includes silicon or dielectric material. The dielectric material includes glass, silicon oxide, silicon nitride, silicon oxynitride, niobium oxide, tantalum oxide, hafnium oxide, titanium oxide, magnesium fluoride, or aluminum oxide. The third insulative layer 170 includes multiple sub-layers. In an embodiment, the multiple sub-layers are formed by the dielectric materials including silicon-containing material, such as silicon oxide, silicon nitride, or silicon oxynitride; metal oxide, such as tantalum oxide, niobium oxide, hafnium oxide, titanium oxide, or aluminum oxide; or metal fluoride, such as magnesium fluoride. The third insulative layer 170 can be a distributed Bragg reflector (DBR), which is formed of a material stack with different refractive indexes and thickness arranged to reflect the light of a specific wavelength range emitted by the active region 110*a*. The third insulative layer 170 can be formed by atomic layer deposition (ALD), sputtering, evaporation, or spin-coating. In an embodiment, since the third insulative layer 170 covers the side surface of the first semiconductor layer 110*n*, the side surface of the semiconductor mesa 110 and the side surface of the connective layer 160, which can protect the first semiconductor layer 110*n*, the semiconductor mesa 110 and the connective layer 160 from possible damages by subsequent processes or short circuit caused by opposite electrical contacts.

After third insulative layer 170 is formed, referring to FIG. 1A and FIGS. 2A-2B. A first pad 181 is formed in the one or multiple first pad openings 170a and electrically connected to the first semiconductor layer 110n by contacting the first connective part 161. A second pad 182 is formed in the one or multiple second pad openings 170b and electrically connected to the second semiconductor layer 110p by contacting the second connective part 162. In an embodiment, the first pad 181 and/or the second pad 182 can be further formed on the third insulative layer 170, so the areas of the first pad 181 and the second pad 182 are increased to increase the bonding area for external bonding in the subsequent packaging process. The first pad 181 and the second pad 182 include metal materials, such as chromium (Cr), titanium (Ti), tungsten (W), gold (Au), aluminum (Al), indium (In), tin (Sn), nickel (Ni), platinum (Pt) and other metals or stacks or alloys of the above materials. The first pad 181 and the second pad 182 may be composed of a single layer or multiple layers. For example, the first pad 181 and the second pad 182 may include Ti/Al, Ti/Au, Ti/Pt/Au, Cr/Au, Cr/Pt/Au, Ni/Au, Ni/Pt/Au, or Cr/Al/Cr/Ni/Au. In an embodiment, the surfaces of the first pad 181 and the second pad 182 have multiple recesses (not shown) corresponding to the openings of the first insulative layer 120, the second insulative layer 150 and the third insulative layer 170. With these recesses, the bonding force between the pad and the carrier can be improved in the packaging process, so as to improve the process yield. Finally, the semiconductor wafer is divided along the isolation region to form the light-emitting devices 10.

FIG. 1A shows a top view of the light-emitting device 10 in accordance with an embodiment of the present application. FIG. 2A shows a cross-sectional view along the line A-A' in FIG. 1A. FIG. 2B shows a cross-sectional view along the line B-B' in FIG. 1A. FIG. 1A and FIGS. 2A-2B show the light-emitting device 10 including a substrate 100, a first semiconductor layer 110n, a semiconductor mesa 110, a peripheral exposed region E, a first insulative layer 120, a reflective conductive structure 140, a second insulative layer 150, a connective layer 160, a third insulative layer 170, a first pad 181, and a second pad 182. In an embodiment, the light-emitting device 10 may include a transparent conductive layer 130 located between the semiconductor mesa 110 and the first insulative layer 120. In an embodiment, the light-emitting device 10 may include an adhesive layer 121 located between the first insulative layer 120 and the reflective conductive structure 140.

In detail, the first semiconductor layer 110n is located on the substrate 100 and includes a first part P1 and a second part P2. In an embodiment, the second part P2 surrounds the first part P1. In an embodiment, the first semiconductor layer 110n does not cover the substrate surface 100s of the periphery of the substrate 100. The semiconductor mesa 110 is located on the first semiconductor layer 110n, including the active region 110a on the first part P1 and the second semiconductor layer 110p located on the active region 110a. In this embodiment, the second part P2 includes a peripheral exposed region E not covered by the semiconductor mesa 110, exposing the first semiconductor layer 110n, and surrounding the semiconductor mesa 110. The peripheral exposed region E includes a bottom and a sidewall, and the bottom is formed by the top surface of the second part P2 of the first-type semiconductor layer 110n, and the sidewall is formed by the side surface of the semiconductor mesa 110 connected to the top surface of the second part P2. The first insulative layer 120 is on the second semiconductor layer 110p. In an embodiment, the first insulative layer 120 is formed on the top surface of the transparent conductive layer 130, and extends to cover part of the second semiconductor layer 110p, the side surface of the second part P2 of the first semiconductor layer 110n, a part of the bottom and the sidewall of the peripheral exposed area E, and the substrate surface 100s of the periphery of the substrate 100. The first insulative layer 120 includes one or multiple first peripheral openings 120a and a first group of first opening 120c. The one or multiple first peripheral openings 120a are located on the peripheral exposed region E and expose the second part P2 of the first semiconductor layer 110n. The first group of first opening 120c is located on the second semiconductor layer 110p and exposes the second semiconductor layer 110p and/or the transparent conductive layer 130. In an embodiment, the first group of first opening 120c includes a trench not connected to the peripheral exposed area E in the top view of the light-emitting device 10. Specifically, the trench is spaced apart from the boundary of the semiconductor mesa 110 by a distance. In detail, the end and the edge of the trench are spaced apart from the boundary of the semiconductor mesa 110 by a distance. The reflective conductive structure 140 is located on the second semiconductor layer 110p or the transparent conductive layer 130, and is electrically connected to the second semiconductor layer 110p and/or the transparent conductive layer 130 through the first group of first opening 120c. In an embodiment, the edge of the reflective conductive structure 140 is retracted from the edge of the second semiconductor layer 110p and the edge of the transparent conductive layer 130 is retracted from the edge of the reflective conductive structure 140. In other words, the edge of the reflective conductive structure 140 is located on the second semiconductor layer 110p and there is a distance between the edge of the reflective conductive structure 140 and the edge of the second semiconductor layer 110p, a distance between the edge of the transparent conductive layer 130 and the edge of the reflective conductive structure 140, and the edge of the reflective conductive structure 140 is between the edge of the second semiconductor layer 110p and the edge of the transparent conductive layer 130. In an embodiment, the reflective conductive structure 140 is located on the adhesive layer 121, and the adhesion between the reflective conductive structure 140 and the first insulative layer 120 is increased by the adhesive layer 121. In an embodiment, the adhesive layer 121 is located on the first insulative layer 120, or is located on the first insulative layer 120 and extends to the sidewall of the first group of first opening 120c to electrically connect to the second semiconductor layer 110p and/or the transparent conductive layer 130. In an embodiment, the adhesive layer 121 has an adhesive layer opening (not shown) disposed on the corresponding first group of first opening 120c, and the second semiconductor layer 110p and/or the transparent conductive layer 130 are exposed by the adhesive layer opening and the first group of first opening 120c. In an embodiment, the edge of the adhesive layer 121 is retracted from the edge of the second semiconductor layer 110p, and the edge of the transparent conductive layer 130 is retracted from the edge of the adhesive layer 121. The second insulative layer 150 is located on the reflective conductive structure 140. In an embodiment, the second insulative layer 150 is located on the reflective conductive structure 140 and the first insulative layer 120, and covers the peripheral exposed area E and the substrate surface 100s of the periphery of the substrate 100. In an embodiment, the second insulative layer 150 is located on part of the reflective conductive structure 140. In an embodiment, the second insulative layer 150 includes a first group of second openings 150c1/150c2 located on the reflective conductive structure 140 and exposing part of the reflective conductive structure 140. In an embodiment, the first group of second openings 150c1/150c2 and the first group of first opening 120c are arranged in a staggered manner and do not overlap. In an embodiment, the second insulative layer 150 further includes one or multiple second peripheral openings 150a located on the peripheral exposed area E and corresponding to the one or multiple first peripheral openings 120a to expose part of the second part P2. In an embodiment, the multiple first peripheral openings 120a are located on the peripheral exposed area E, and the multiple second peripheral openings 150a are disposed on the peripheral exposed area E and respectively corresponding to the positions of the multiple first peripheral openings 120a. In an embodiment, the first insulative layer 120 and the second insulative layer 150 cover the side surface of the first semiconductor layer 110n and the side surface of the semiconductor mesa 110, which can protect the first semiconductor layer 110n and the semiconductor mesa 110 from possible damages by subsequent processes or short circuit caused by opposite electrical contacts. The connective layer 160 is located on the insulative layer 150 and includes a first connective part 161 and a second connective part 162 separated from the first connective part 161. The first connective part 161 covers the first insulative layer 120 and the second insulative layer 150, extends to the peripheral exposed region E, and contacts the second part P2 of the first semiconductor layer 110n through the first peripheral openings 120a and the second peripheral openings 150a to electrically connect to the first semiconductor layer 110n. The second connective part 162 contacts the reflective conductive structure 140 through the first group of second openings 150c1/150c2 and is electrically connected to the second semiconductor layer 110p. In an embodiment, the connective layer 160 further includes a third connective part 163 located between the first connective part 161 and the second connective part 162, and is electrically separated from the first connective part 161 and the second connective part 162. In an embodiment, the first connective part 161 surrounds the second connective part 162 and/or the third connective part 163 in the top view of the light-emitting device 10, and uniform current diffusion can be achieved by the first connective part 161 electrically connected to the first semiconductor layer 110n surrounding the second connective part 162 electrically connected to the second semiconductor layer 110p. In an embodiment, the third connective part 163 is electrically floating and is used as a pin region of the light emitting device 10, and has a buffer function of absorbing and distributing soldering force. In an embodiment, the third connective part 163 is connected to the first connective part 161 to electrically connect to the first connective part 161, or the third connective part 163 is connected to the second connective part 162 to electrically connect to the second connective part 162. The third insulative layer 170 is located on the connective layer 160, extends to the second insulative layer 150 and covers the peripheral exposed area E and/or the substrate surface 100s. The third insulative layer 170 includes one or multiple first pad openings 170a exposing the first connective part 161 and one or multiple second pad openings 170b exposing the second connective part 162. The third insulative layer 170 covers the side surface of the first semiconductor layer 110n, the side surface of the semiconductor mesa 110 and the substrate surface 100s. The first pad 181 is located in the one or multiple first pad openings 170a and electrically connected to the first semiconductor layer 110n by contacting the first connective part 161. A second pad 182 is located in the one or multiple second pad openings 170b and electrically connected to the second semiconductor layer 110p by contacting the second connective part 162. In an embodiment, the first pad 181 and the second pad 182 are respectively located in the one or multiple first pad openings 170a and the one or multiple second pad openings 170b, and further extend on the third insulative layer 170. In an embodiment, in the top view of the light-emitting device 10, the first group of second openings 150c1 is overlapped with the one or multiple second pad openings 170b and located within the one or multiple second pad openings 170b, and the first group of second openings 150c2 is not overlapped with the one or multiple second pad openings 170b and located outside the one or multiple second pad openings 170b. In an embodiment, the shapes of the one or multiple first pad openings 170a and the one or multiple second pad openings 170b are different.

The first connective part 161 is electrically connected to the first semiconductor layer 110n through the first peripheral openings 120a and the second peripheral openings 150a. The second connective part 162 is electrically connected to the second semiconductor layer 110p through the first group of second openings 150c1/150c2. In an embodiment, the surfaces of the first pad 181 and the second pad 182 have multiple recesses (not shown) corresponding to the openings of the first insulative layer 120, the second insulative layer 150 and the third insulative layer 170. With these recesses, the bonding force between the pad and the carrier can be improved in the packaging process, so as to improve the process yield. In an embodiment, in the top view of the light-emitting device 10, the first pads 181 and the second pads 182 are arranged in a first direction D1, the first group of first opening 120c extends in the first insulative layer 120 along the first direction D1 to form a trench, and the trench has a length along the first direction D1 greater than the length of the first pad 181 or the second pad 182 in the first direction D1. In an embodiment, the trench extends along the first direction D1 and overlaps the first pad 181 and the second pad 182 in the top view of the light-emitting device 10. The first insulative layer 120 and the reflective conductive structure 140 form a reflective mirror with a certain area to improve brightness by designing the first group of first opening 120c as the trench, and the current can be evenly distributed to reduce the forward voltage. In an embodiment, the trench extends in the first insulative layer 120 to form a fishbone pattern in the top view of the light-emitting device 10. The trench includes a trunk T1 and a plurality of branches B1, and the branches B1 respectively extend from two sides of the trunk T1 to form a fishbone pattern on the semiconductor mesa 110 in the top view of the light-emitting device 10. In an embodiment, the branches B1 are respectively branched from two sides of the trunk T1 along the direction perpendicular to the extending direction of the trunk T1. In an embodiment, the branches B1 on both sides of the trunk T1 may be symmetrical or asymmetrical. In an embodiment, the number, lengths and/or widths of the branches B1 on both sides of the trunk T1 may be the same or different. In an embodiment, the lengths and/or widths of the trunk T1 and the branch B1 may be the same or different. In an embodiment, the distance between two adjacent branches B1 may be the same or different. In an embodiment, the number of branches B1, the lengths and widths of the trunk T1 and branches B1, the distance between two adjacent branches B1, the ratio of the total area of the trench to the area of the substrate 100, and the ratio of the total top view area of the overlapping portion of the reflective conductive structure 140 and the first insulative layer 120 to the top view area of the semiconductor mesa 110 can be designed and adjusted according to the size and photoelectric characteristics requirements. In an embodiment, the widths of the trunk T1 and the branches B1 may be 1 μm to 20 μm. In an embodiment, the distance between two adjacent branches B1 may be 10 μm to 200 μm. In an embodiment, the ratio of the total top view area of the trench to the top view area of the substrate 100 may be 1% to 20%. In an embodiment, the ratio of the total top view area of the overlapping portion of the reflective conductive structure 140 and the first insulative layer 120 to the top view area of the semiconductor mesa 110 may be 80% to 99%. The present application is not limited to the above range of values. In the low current density products, for example, the current density is less than or equal to 0.21 A/mm$^2$, the widths of the trunk T1 and branches B1 can be smaller, and the distance between two adjacent branches B1 can be larger. In the high current density products, for example, the current density is greater than or equal to 0.42 A/mm$^2$, the widths of the trunk T1 and branches B1 can be relatively large, and the distance between two adjacent branches B1 can be small.

Figure 1B:
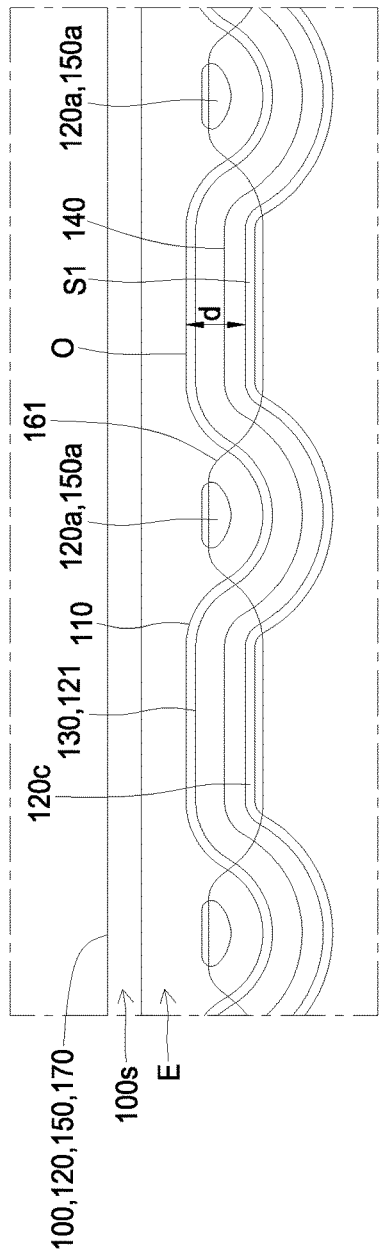
FIG. 1B shows a partially enlarged top view of the place marked C in FIG. 1A.

FIG. 1B shows a partially enlarged top view of the place marked C in FIG. 1A. The semiconductor mesa 110 has a boundary O adjacent to the peripheral exposed area E and extending along the first direction D1, the boundary O includes a first concave-convex pattern. Specifically, the contour of the semiconductor mesa 110 includes the first concave-convex pattern. The trench formed by the first group of first opening 120c extending in the first insulative layer 120 includes an outermost section S1. The outermost section S1 is adjacent to the boundary O and extends along the first direction D1, and has a distance d from the boundary O and includes a second concave-convex pattern substantially corresponding to the first concave-convex pattern. In detail, the convex part of the second concave-convex pattern is corresponding to the convex part of the first concave-convex pattern, and the concave part of the second concave-convex pattern is corresponding to the concave part of the first concave-convex pattern. the first concave-convex pattern of the boundary O is wavy, zigzag, square wave or other non-linear patterns. The first concave-convex pattern can improve the light extraction efficiency of the light-emitting device 10. In an embodiment, the edge of the first connective part 161 includes a third concave-convex pattern, the convex part of the third concave-convex pattern is corresponding to the concave part of the first concave-convex pattern and/or the concave part of the second concave-convex pattern, and the concave part of the third concave-convex pattern is corresponding to the convex part of the first concave-convex pattern and/or the convex part of the second concave-convex pattern. The first connective part 161 extends to the first peripheral openings 120a and the second peripheral openings 150a through the convex part of the third concave-convex pattern to electrically connect the first semiconductor layer 110n to achieve uniform current diffusion and avoid short circuit caused by opposite electrical contacts. In an embodiment, the edge of the first connective part 161 includes the third concave-convex pattern around the first pad 181 and the edge of the first connective part 161 includes a fourth concave-convex pattern around the second pad 182. The convex part of the fourth concave-convex pattern is corresponding to the convex part of the first concave-convex pattern and/or the convex part of the second concave-convex pattern, and the concave part of the fourth concave-convex pattern is corresponding to the concave part of the first concave-convex pattern and/or the concave part of the second concave-convex pattern. The first connective part 161 extends to the first peripheral openings 120a and the second peripheral openings 150a through the concave part of the fourth concave-convex pattern to electrically connect the first semiconductor layer 110n to achieve uniform current diffusion. In an embodiment, the edge of the first connective part 161 may be a straight line around the second pad 182, and the first connective part 161 is electrically connected to first semiconductor layer 110n through the first peripheral openings 120a and the second peripheral openings 150a. With the aforementioned design, the edge of the first connective part 161 can have a certain width around the second pad 182 to avoid the problem of current crowding.

Figure 19A:
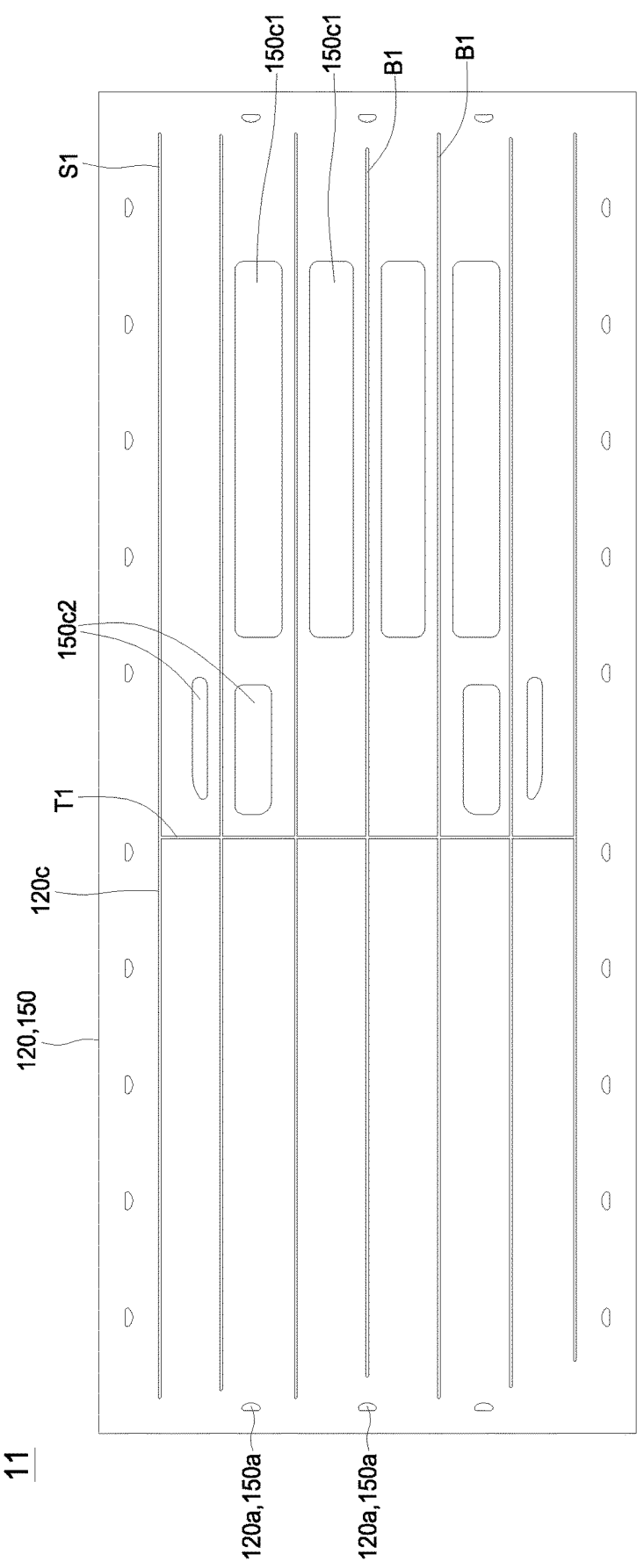
Figure 19C:
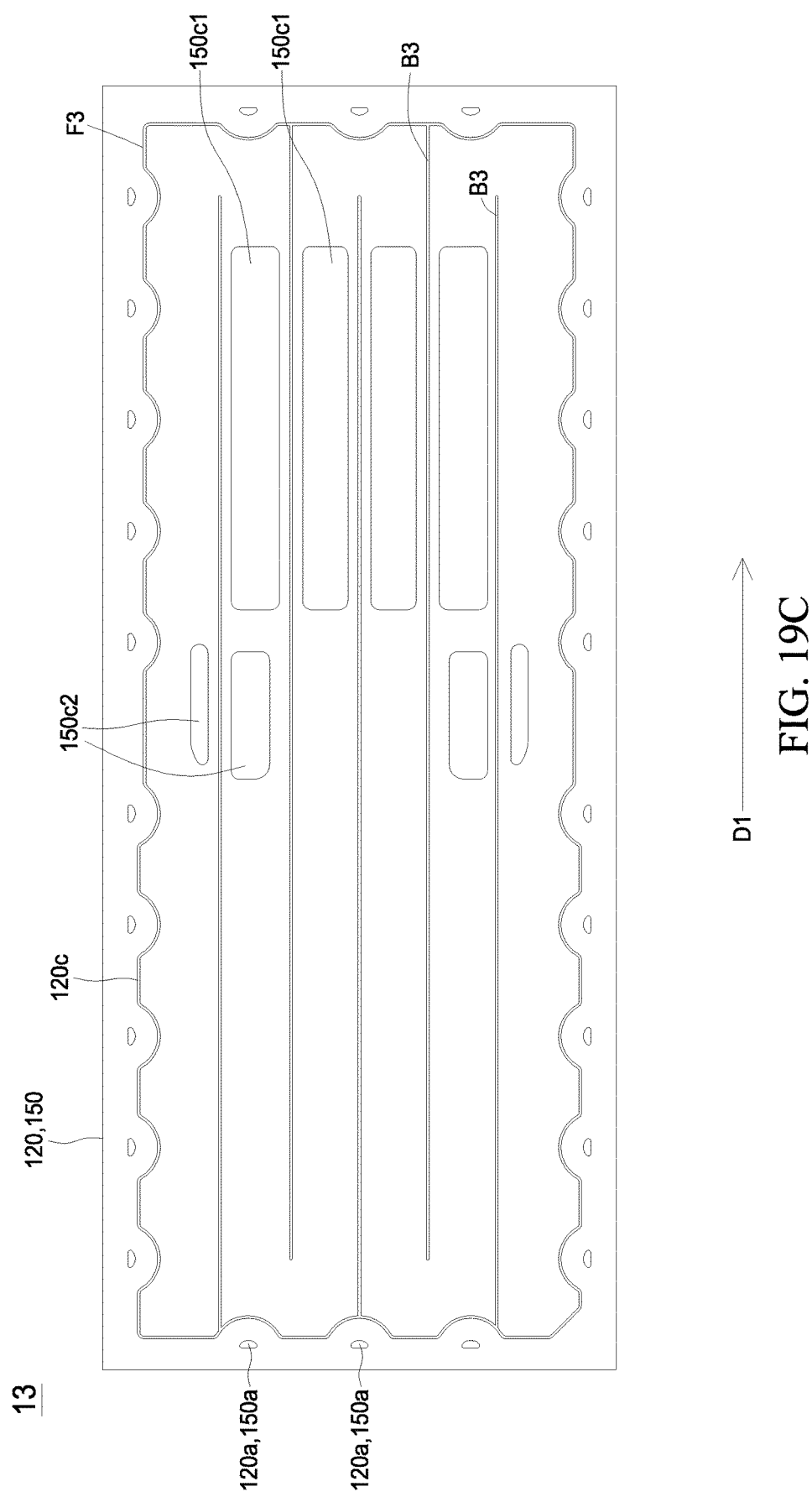
Figure 19D:
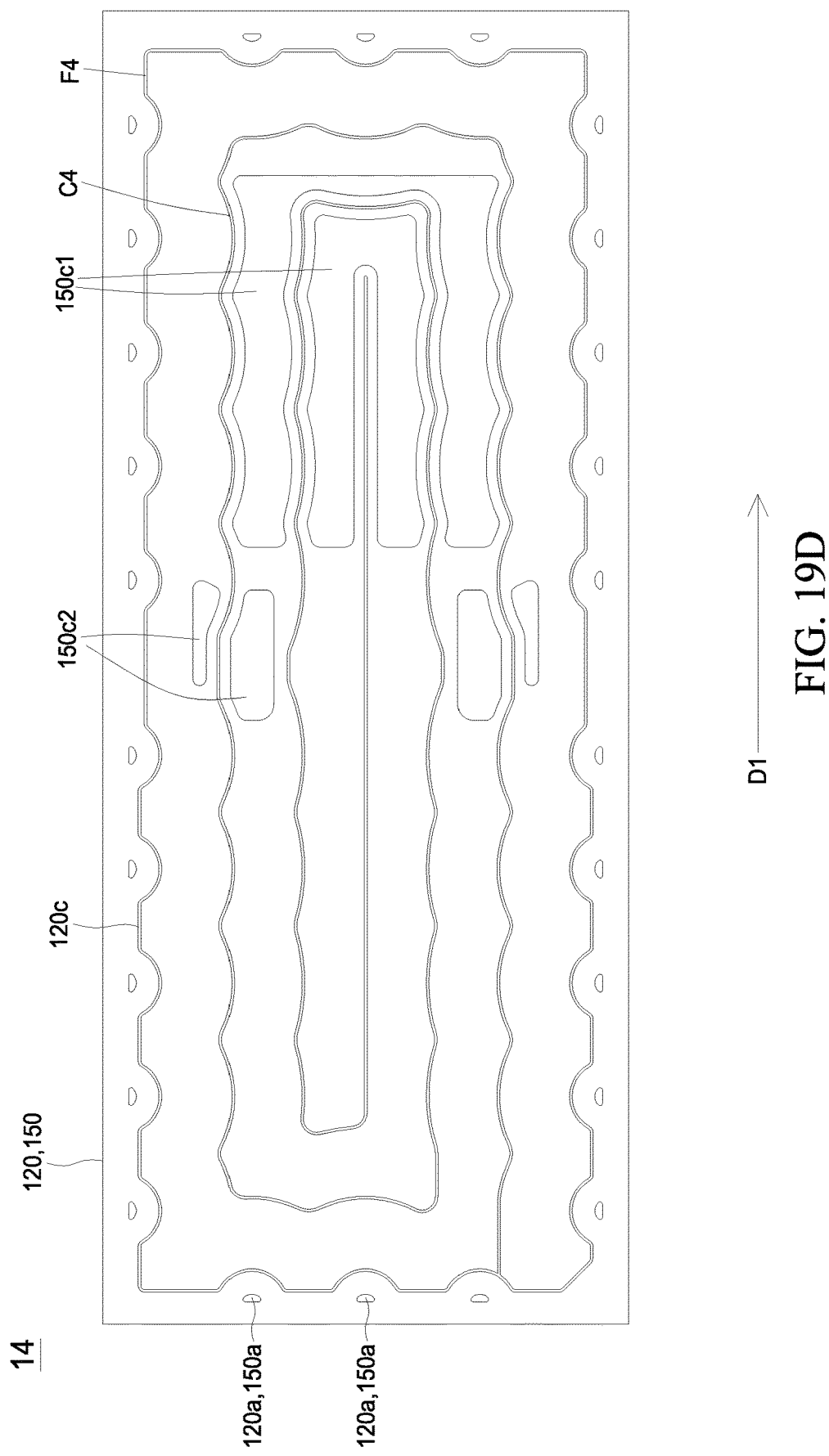
Figure 19E:
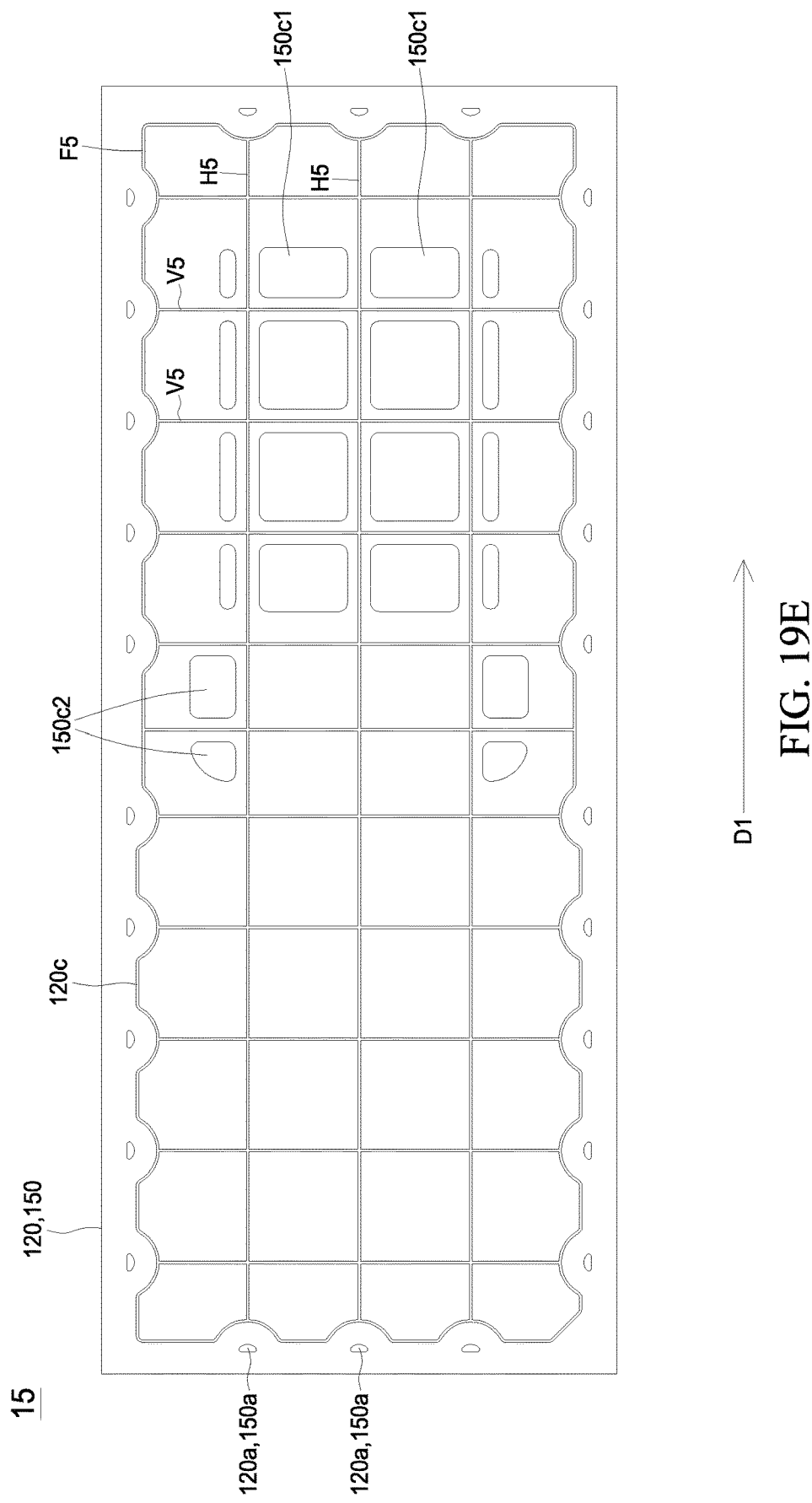

FIGS. 19A-19E show top views of the light-emitting devices 11-15 in accordance with embodiments of the present application. The manufacturing methods and the structures of the light-emitting devices 11-15 are similar to the light-emitting device 10. The similar manufacturing method and the similar structure will not be repeated and can be referred to the description and drawings of the light-emitting device 10. The differences between the light-emitting devices 11-15 and the light-emitting device 10 will be explained in the following. In order to clearly illustrate the differences, FIGS. 19A-19E just show the first insulative layer 120, the first peripheral openings 120a, the first group of first opening 120c, the second insulative layer 150, the second peripheral openings 150a, and the first group of second openings 150c1/150c2. Referring to FIG. 19A, the difference between the light-emitting device 11 and the light-emitting device 10 is that the outermost section S1 is a straight-line pattern, which does not include a second concave-convex pattern corresponding to the first concave-convex pattern. Referring to FIG. 19B, the difference between the light-emitting device 12 and the light-emitting device 10 is that, compared with the extension direction of the trunk T1 of the light-emitting device 10 perpendicular to the first direction D1 and the branches B1 respectively extend from two sides of the trunk T1 perpendicular to the extension direction of the trunk T1 (that is, parallel to the first direction D1) to form the fishbone pattern, the first group of first opening 120c of the light-emitting element 12 extends in the first insulative layer 120 to form a trunk T2 extending parallel to the first direction D1 and a plurality of branches B2 extending perpendicular to the extension direction of the trunk T1 (that is, perpendicular to the first direction D1) form a fishbone pattern. The current injection can be increased by disposing the trunk T2 in the center of the light emitting element 12. In an embodiment, the branches B2 on both sides of the trunk T2 may be symmetrical or asymmetrical. In an embodiment, the number, lengths and/or widths of the branches B2 on both sides of the trunk T2 may be the same or different. In an embodiment, the lengths and/or widths of the trunk T2 and the branches B2 may be the same or different. In an embodiment, the distance between two adjacent branches B2 may be the same or different. In an embodiment, the number of branches B2, the lengths and widths of the trunk T2 and branches B2, the distance between two adjacent branches B2, the ratio of the total area of the trench to the area of the substrate 100, and the ratio of the total top view area of the overlapping portion of the reflective conductive structure 140 and the first insulative layer 120 to the top view area of the semiconductor mesa 110 can be designed and adjusted according to the size and photoelectric characteristics requirements. In an embodiment, the widths of the trunk T2 and the branches B2 may be 1 µm to 20 µm. In an embodiment, the distance between two adjacent branches B2 may be 10 µm to 200 µm. In an embodiment, the ratio of the total top view area of the trench to the top view area of the substrate 100 may be 1% to 20%. In an embodiment, the ratio of the total top view area of the overlapping portion of the reflective conductive structure 140 and the first insulative layer 120 to the top view area of the semiconductor mesa 110 may be 80% to 99%. The present application is not limited to the above range of values. In the low current density products, for example, the current density is less than or equal to 0.21 A/mm$^2$, the widths of the trunk T2 and branches B2 can be smaller, and the distance between two adjacent branches B2 can be larger. In the high current density products, for example, the current density is greater than or equal to 0.42 A/mm$^2$, the widths of the trunk T2 and branches B2 can be relatively large, and the distance between two adjacent branches B2 can be small. Referring to FIG. 19C, the difference between the light-emitting device 13 and the light-emitting device 10 is that the trench formed by the first group of first opening 120c extending in the first insulative layer 120 includes an outer frame F3 and a plurality of branches B3. The outer frame F3 is disposed adjacent to the boundary of the semiconductor mesa 110, and the branches B3 extend from two opposite sides of the outer frame F3 perpendicular to the first direction D1 and extend parallel to the first direction D1 to form an interdigitated pattern on the semiconductor mesa 110. In an embodiment, the lengths and/or widths of the branches B3 may be the same or different. In an embodiment, the widths of the outer frame F3 and the branches B3 may be the same or different. In an embodiment, the distance between two adjacent branches B3 may be the same or different. In an embodiment, the number of branches B3, the lengths and widths of the outer frame F3 and branches B3, the distance between two adjacent branches B3, the ratio of the total area of the trench to the area of the substrate 100, and the ratio of the total top view area of the overlapping portion of the reflective conductive structure 140 and the first insulative layer 120 to the top view area of the semiconductor mesa 110 can be designed and adjusted according to the size and photoelectric characteristics requirements. In an embodiment, the widths of the outer frame F3 and the branches B3 may be 1 µm to 20 µm. In an embodiment, the distance between two adjacent branches B3 may be 10 µm to 200 µm. In an embodiment, the ratio of the total top view area of the trench to the top view area of the substrate 100 may be 1% to 20%. In an embodiment, the ratio of the total top view area of the overlapping portion of the reflective conductive structure 140 and the first insulative layer 120 to the top view area of the semiconductor mesa 110 may be 80% to 99%. The present application is not limited to the above range of values. In the low current density products, for example, the current density is less than or equal to 0.21 A/mm$^2$, the widths of the outer frame F3 and the branches B3 can be smaller, and the distance between two adjacent branches B3 can be larger. In the high current density products, for example, the current density is greater than or equal to 0.42 A/mm$^2$, the widths of the outer frame F3 and the branches B3 can be relatively large, and the distance between two adjacent branches B3 can be small. The differences between the light-emitting devices 14-15 and the light-emitting device 10 are that the trenches formed by the first group of first opening 120c extending in the first insulative layer 120 are a winding pattern and a grid pattern respectively shown in FIG. 19D and FIG. 19E. Referring to FIG. 19D, the difference between the light-emitting device 14 and the light-emitting device 10 is that the trench formed by the first group of first opening 120c extending in the first insulative layer 120 includes an outer frame F4 and an inner winding portion C4. The outer frame F4 is disposed adjacent to the boundary of the semiconductor mesa 110, and the inner winding portion C4 extends from the outer frame F4 to form a winding pattern on the semiconductor mesa 110. The uniformity of current injection can be improved by disposing the inner winding portion C4 in the outer frame F4. In an embodiment, the widths of the outer frame F4 and the inner winding portion C4 may be the same or different. In an embodiment, the widths of the outer frame F4 and the inner winding portion C4, the distance between the outer frame F4 and the inner winding portion C4, the ratio of the total area of the trench to the area of the substrate 100, and the ratio of the total top view area of the overlapping portion of the reflective conductive structure 140 and the first insulative layer 120 to the top view area of the semiconductor mesa 110 can be designed and adjusted according to the size and photoelectric characteristics requirements. In an embodiment, the widths of the outer frame F4 and the inner winding portion C4 may be 1 µm to 20 µm. In an embodiment, the distance between the outer frame F4 and the inner winding portion C4 may be 10 µm to 200 µm. In an embodiment, the ratio of the total top view area of the trench to the top view area of the substrate 100 may be 1% to 20%. In an embodiment, the ratio of the total top view area of the overlapping portion of the reflective conductive structure 140 and the first insulative layer 120 to the top view area of the semiconductor mesa 110 may be 80% to 99%. The present application is not limited to the above range of values. In the low current density products, for example, the current density is less than or equal to 0.21 A/mm$^2$, the widths of the outer frame F4 and the inner winding portion C4 can be smaller, and the distance between the outer frame F4 and the inner winding portion C4 can be larger. In the high current density products, for example, the current density is greater than or equal to 0.42 A/mm$^2$, the widths of the outer frame F4 and the inner winding portion C4 can be relatively large, and the distance between the outer frame F4 and the inner winding portion C4 can be small. In an embodiment, as shown in FIG. 19D, the trench extending in the first insulative layer 120 includes a fifth concave-convex pattern, wherein the fifth concave-convex pattern is corresponding to the first concave-convex pattern of the semiconductor mesa 110. In an embodiment, as shown in FIG. 19D, a tail portion of the trench includes a straight-line segment extending parallel to the first direction D1, and the straight-line segment has an extension length in the first direction D1 greater than the length in the first direction D1 of the first pad 181 or the second pad 182. In an embodiment, as shown in FIG. 19D, the first group of second openings 150c1 and the first group of first opening 120c are arranged in a staggered manner, and the shapes of the first group of second openings 150c1 conform to the extensive shape of the trench and extend to form one or more U shapes. Referring to FIG. 19E, the difference between the light-emitting device 15 and the light-emitting device 10 is that the trench formed by the first group of first opening 120c extending in the first insulative layer 120 includes an outer frame F5, a plurality of warp portions V5 and a plurality of weft portions H5. The outer frame F5 is disposed adjacent to the boundary of the semiconductor mesa 110, and the warp portions V5 respectively extend perpendicularly to the first direction D1 from one side of the outer frame F5, and the weft portions H5 respectively extend parallelly to the first direction D1 from another side of the outer frame F5 adjacent to the one side of the outer frame F5. The outer frame F5, the warp portions V5 and the weft portions H5 form a grid pattern on the semiconductor mesa 110. The current contact area can be increased by arranging the warp portions V5 and the weft portions H5 in the outer frame F5. In an embodiment, the widths of the outer frame F5, the warp portions V5 and the weft portions H5 may be the same or different. In an embodiment, the distance between two adjacent warp portions V5 and/or two adjacent weft portions H5 may be the same or different. In an embodiment, the widths of the outer frame F5, the warp portions V5 and the weft portions H5, the distance between two adjacent warp portions V5 and/or two adjacent weft portions H5, the ratio of the total area of the trench to the area of the substrate 100, and the ratio of the total top view area of the overlapping portion of the reflective conductive structure 140 and the first insulative layer 120 to the top view area of the semiconductor mesa 110 can be designed and adjusted according to the size and photoelectric characteristics requirements. In an embodiment, the widths of the outer frame F5, the warp portions V5 and the weft portions H5 may be 1 μm to 20 μm. In an embodiment, the distance between two adjacent warp portions V5 and/or two adjacent weft portions H5 may be 10 μm to 200 μm. In an embodiment, the ratio of the total top view area of the trench to the top view area of the substrate 100 may be 1% to 20%. In an embodiment, the ratio of the total top view area of the overlapping portion of the reflective conductive structure 140 and the first insulative layer 120 to the top view area of the semiconductor mesa 110 may be 80% to 99%. The present application is not limited to the above range of values. In the low current density products, for example, the current density is less than or equal to 0.21 A/mm$^2$, the widths of the outer frame F5, the warp portions V5 and the weft portions H5 can be smaller, and the distance between two adjacent warp portions V5 and/or two adjacent weft portions H5 can be larger. In the high current density products, for example, the current density is greater than or equal to 0.42 A/mm$^2$, the widths of the outer frame F5, the warp portions V5 and the weft portions H5 can be relatively large, and the distance between two adjacent warp portions V5 and/or two adjacent weft portions H5 can be small.

Figure 20A:
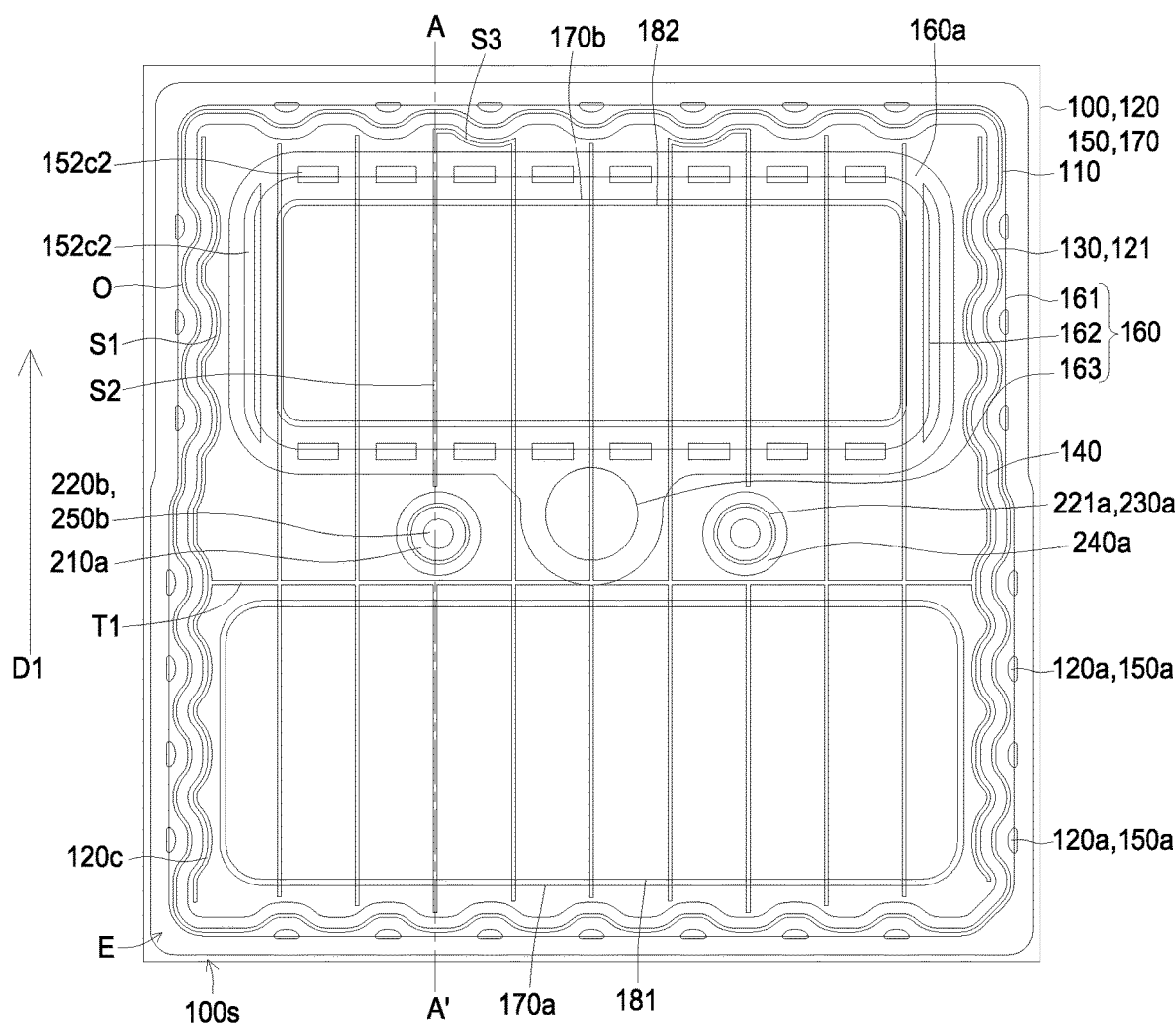
FIG. 20A shows a top view of the light-emitting device 20 in accordance with an embodiment of the present application.
Figure 20B:
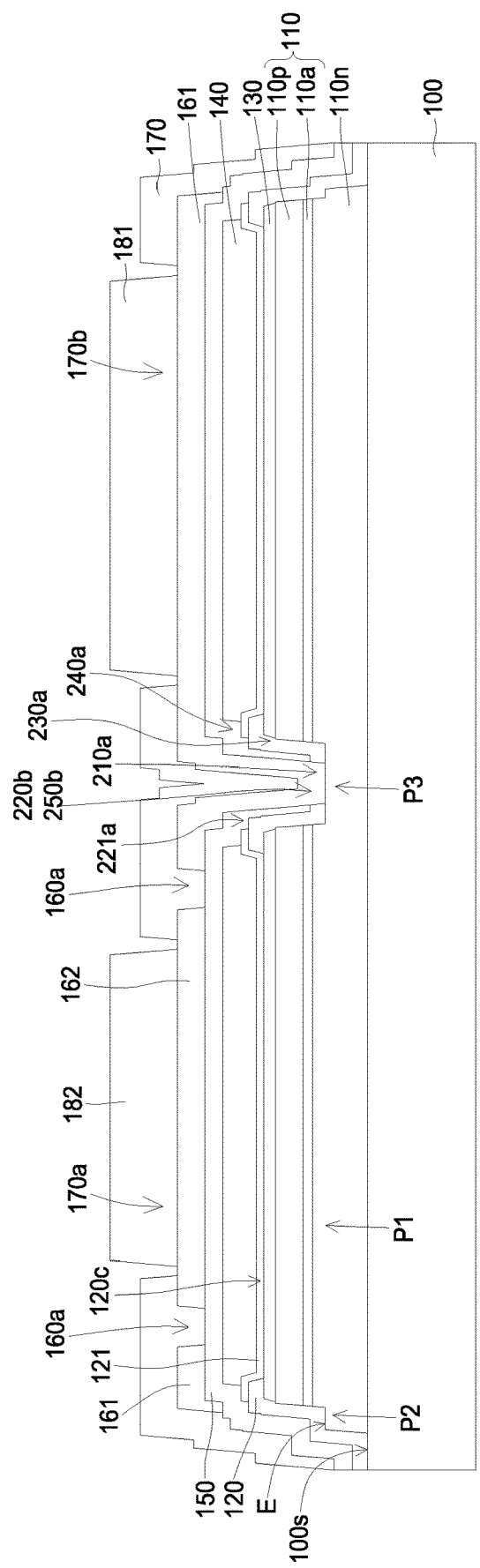
FIG. 20B shows a cross-sectional view along the line A-A' in FIG. 20A.

FIGS. 20A-20B respectively show a top view and a cross-sectional view of the light-emitting device 20 in accordance with an embodiment of the present application. The manufacturing method and the structure of the light-emitting device 20 is similar to the light-emitting device 10. The similar manufacturing method and the similar structure will not be repeated and can be referred to the description and drawings of the light-emitting device 10. The differences between the light-emitting device 20 and the light-emitting device 10 will be explained in the following. Referring to FIGS. 20A-20B, the first semiconductor layer 110n further includes one or multiple third parts P3. In an embodiment, the first part P1 surrounds the one or multiple third parts P3. The second semiconductor layer 110p and the active region 110a on the one or multiple third parts P3 are removed from the top surface of the second semiconductor layer 110p, or part of the first semiconductor layer 110n is further removed to a certain depth, to expose the top surface of the first semiconductor layer 110n to form one or multiple mesa openings 210a, which exposes the one or multiple third parts P3 and are surrounded by the semiconductor mesa 110. The first insulative layer 120 and the second insulative layer 150 respectively further include one or multiple first internal openings 220b and one or multiple second internal openings 250b corresponding to the one or multiple mesa openings 210a and exposing the one or multiple third parts P3. In an embodiment, the one or multiple first internal openings 220b and the one or multiple second internal openings 250b are formed in the same process as the one or multiple first peripheral openings 120a and the one or multiple second peripheral openings 150a. In an embodiment, the first connective part 161 is electrically connected to the first semiconductor layer 110n through the one or multiple first internal openings 220b and the one or multiple second internal openings 250b to achieve the effect of uniform current diffusion. The transparent conductive layer 130, the adhesive layer 121, and the reflective conductive structure 140 respectively further include one or multiple transparent conductive openings 230a, one or multiple adhesive openings 221a, and one or multiple reflective conductive openings 240a corresponding to the one or multiple mesa openings 210a and exposing the one or multiple third parts P3. In an embodiment, the one or multiple transparent conductive openings 230a, the one or multiple adhesive openings 221a, and the one or multiple reflective conductive openings 240a can be formed by dry etching, wet etching or lift-off the materials of the transparent conductive layer 130, the adhesive layer 121 and the reflective conductive structure 140 respectively.

Referring to FIG. 20A and FIG. 20B, the trench formed by the first group of first opening 120c extending in the first insulative layer 120 includes a trunk T1 and an outermost section S1 extending from the trunk T1, an inner section S2 and a connective section S3. The inner section S2 extends along the first direction D1, the outermost section S1 is located between the boundary O and the inner section S2, and the connective section S3 extends perpendicularly to the first direction D1 to connect the inner section S2. The forward voltage of the light-emitting device 20 can be adjusted by increasing or decreasing the connective section S3 to adjust the area of the trench. In an embodiment, the inner section S2 does not overlap with the one or multiple mesa opening 210a in the top view of the light-emitting device 20. In an embodiment, the inner section S2 has one or multiple gap corresponding to the one or multiple mesa opening 210a in the top view of the light-emitting device 20. In an embodiment, the first group of first opening 120c does not overlap with the one or multiple reflective conductive openings 240a, and also does not overlap with the one or multiple transparent conductive openings 230a, the one or multiple adhesive openings 221a, the one or multiple first internal openings 220b and the one or multiple second internal openings 250b in the one or multiple reflective conductive openings 240a. As shown in FIGS. 20A-20B, the second insulative layer 150 of the light-emitting device 20 includes one or multiple first group of second openings 150c2. In an embodiment, the one or multiple first group of second openings 150c2 do not overlap with the second pads 182 in the top view of the light-emitting device 20. In an embodiment, in the top view of the light-emitting device 20, the one or multiple first group of second openings 150c2 and the first group of first opening 120c are arranged in a staggered manner, and the one or multiple first group of second openings 150c2 surrounds the second pad 182 to form a dotted ring pattern. In an embodiment, the second insulative layer 150 of the light emitting device 20 does not include an opening overlapping with the second pad 182. In an embodiment, the locations of the first pad 181 and/or the second pad 182 avoid the one or multiple mesa openings 210a, so as to avoid possible peeling of the pad and the interface of each layer due to the height difference.

Figure 21A:
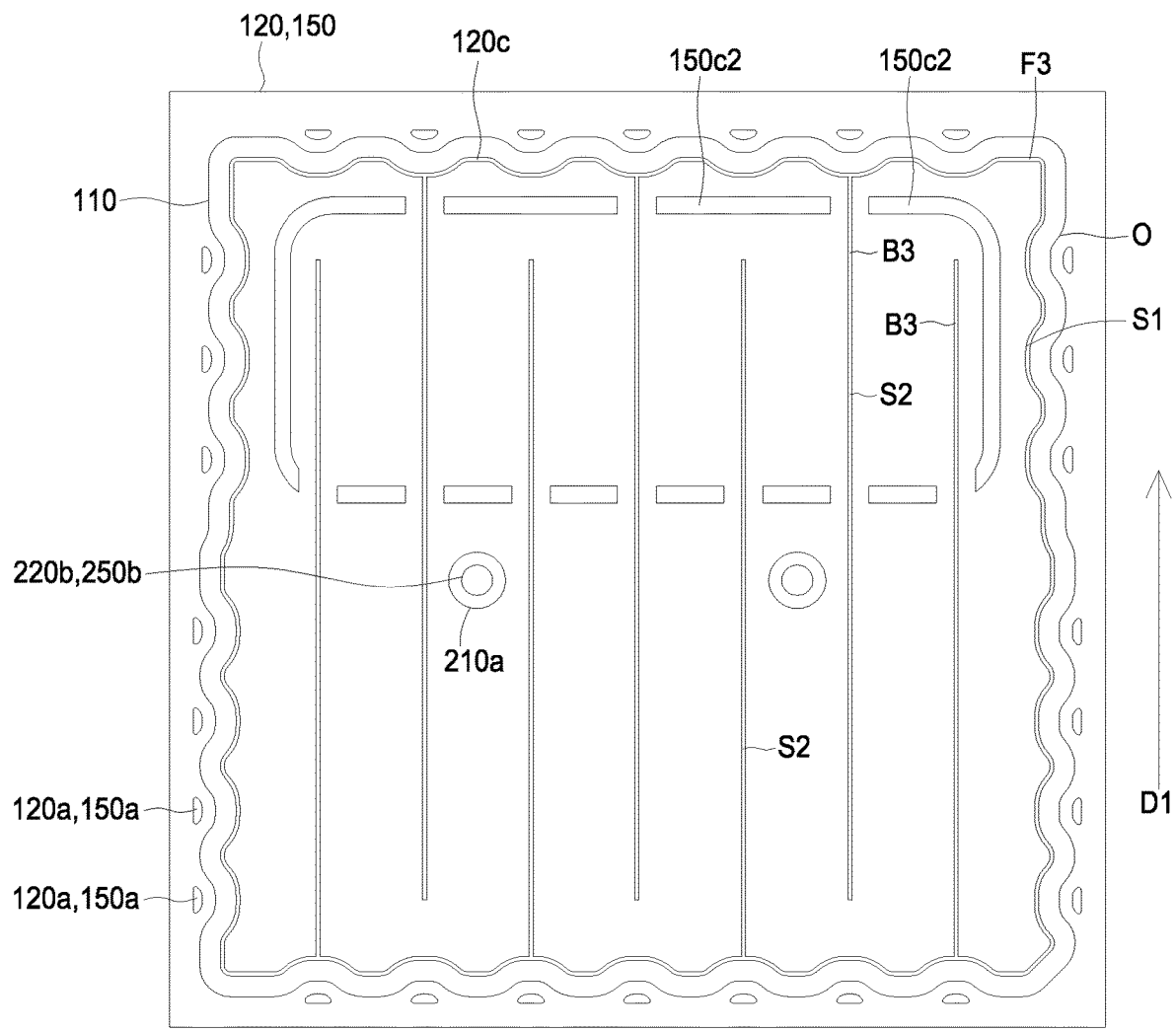
FIGS. 21A-21B show top views of the light-emitting devices 21-22 in accordance with embodiments of the present application.
Figure 21B:
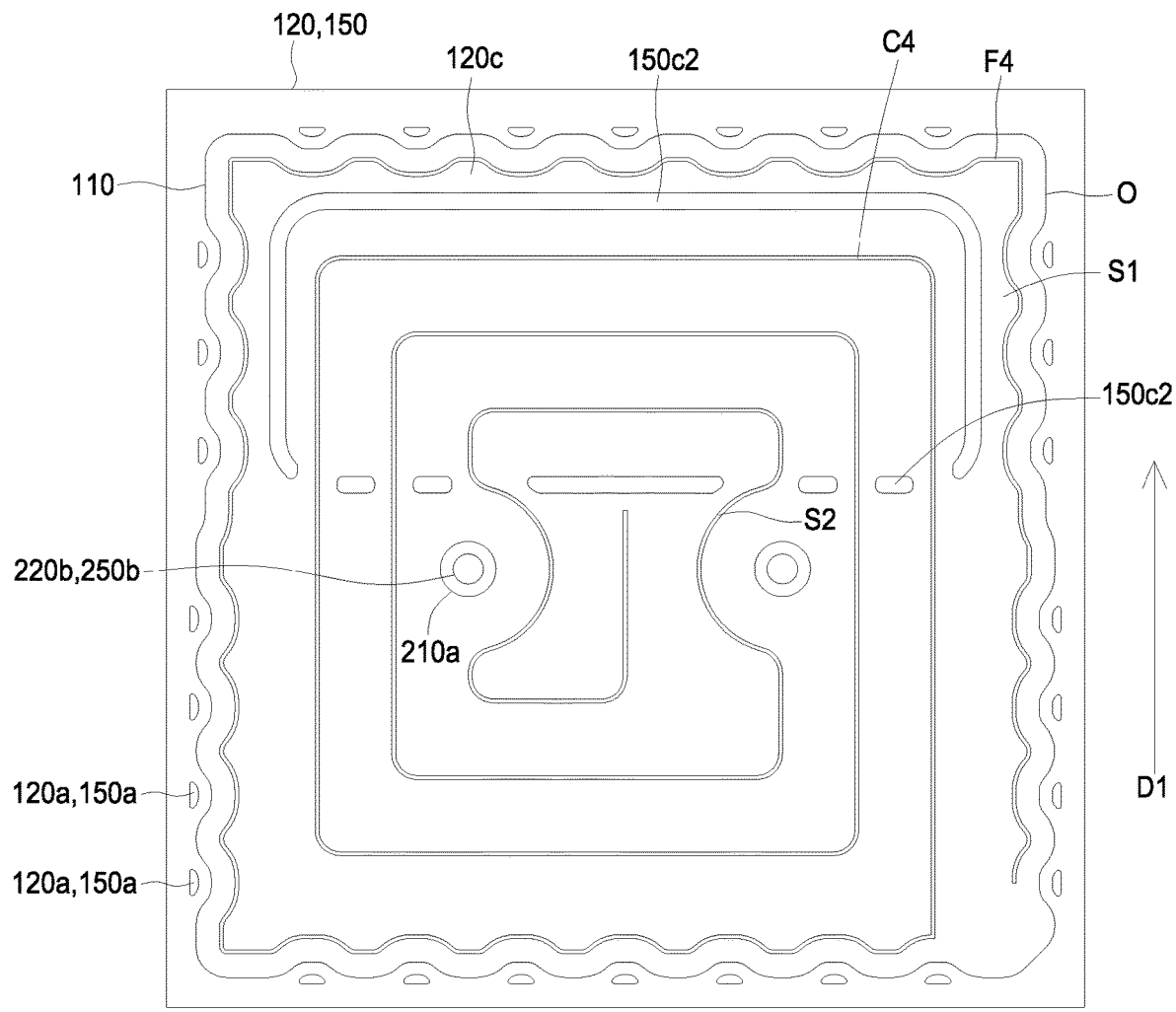

FIGS. 21A-21B show top views of the light-emitting devices 21-22 in accordance with embodiments of the present application. The manufacturing methods and the structures of the light-emitting devices 21-22 are similar to the light-emitting device 10. The similar manufacturing method and the similar structure will not be repeated and can be referred to the description and drawings of the light-emitting device 10. The differences between the light-emitting devices 21-22 and the light-emitting device 10 will be explained in the following. In order to clearly illustrate the differences, FIGS. 21A-21B just show the semiconductor mesa 110, the first insulative layer 120, the one or multiple first peripheral openings 120a, the one or multiple first internal openings 220b, the first group of first opening 120c, the second insulative layer 150, the one or multiple second peripheral openings 150a, the one or multiple second internal openings 250b, and the first group of second openings 150c2. The differences between the light-emitting devices 21-22 and the light-emitting device 20 are that the trenches formed by the first group of first opening 120c extending in the first insulative layer 120 are an interdigitated pattern and a winding pattern respectively shown in FIG. 21A and FIG. 21B. Referring to FIG. 21A, in the top view of the light-emitting device 20, the one or multiple mesa openings 210a is disposed between the inner sections S2 so that the inner sections S2 do not overlap with the one or multiple mesa openings 210a. Referring to FIG. 21B, in the top view of the light-emitting device 20, the inner section S2 has one or multiple arc-shaped portions adjacent to the one or multiple mesa openings 210a to avoid the one or multiple mesa openings 210a, so that the inner section S2 does not overlap with the one or multiple mesa openings 210a. In an embodiment, as shown in FIG. 21B, the first group of second openings 150c2 and the first group of first opening 120c are arranged in a staggered manner, and the shape of one of the first group of second openings 150c2 conform to the extensive shape of the trench and extend to form a U shape.

Figure 22:
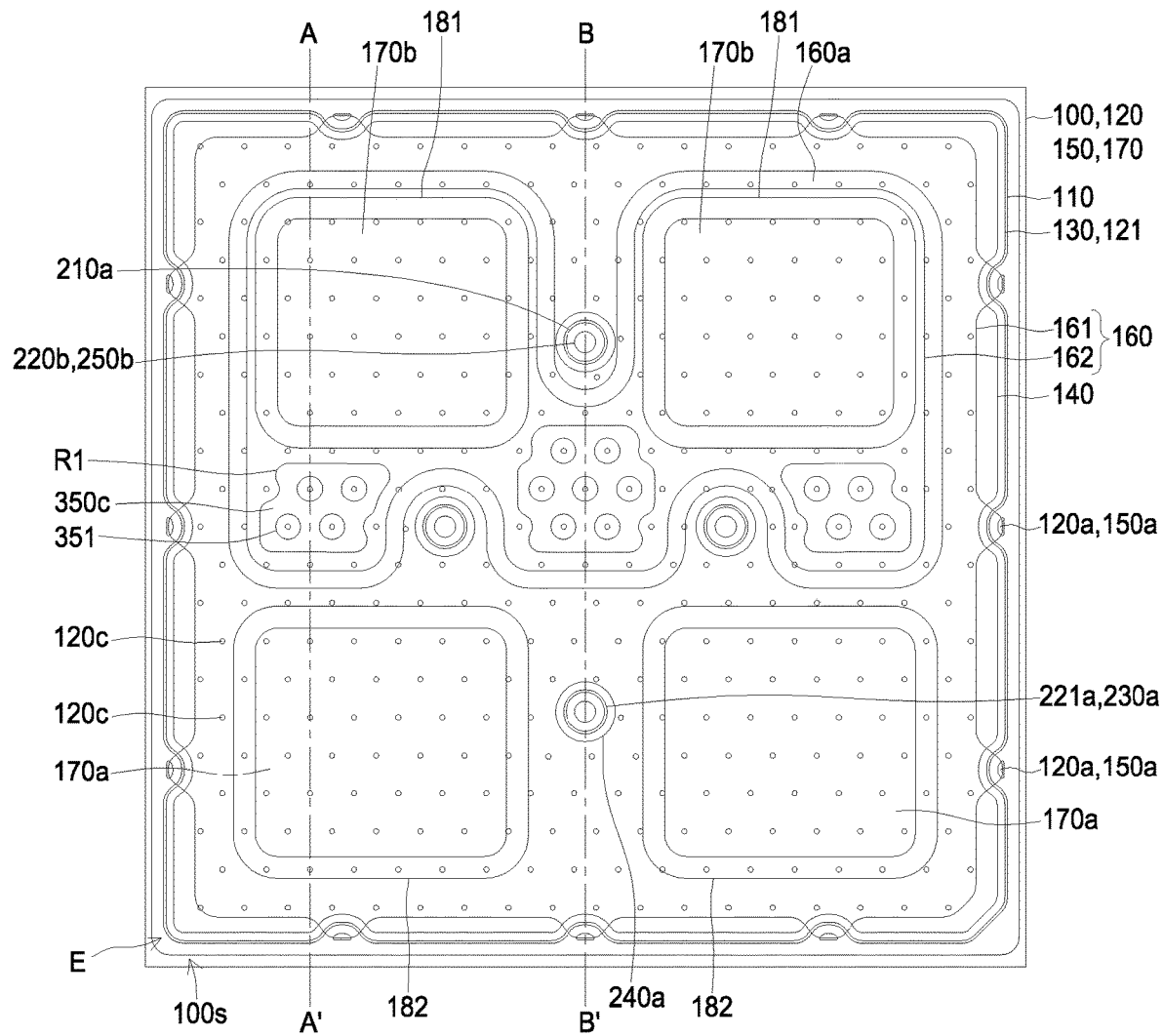
FIG. 22 shows a top view of the light-emitting device 30 in accordance with an embodiment of the present application.
Figure 23A:
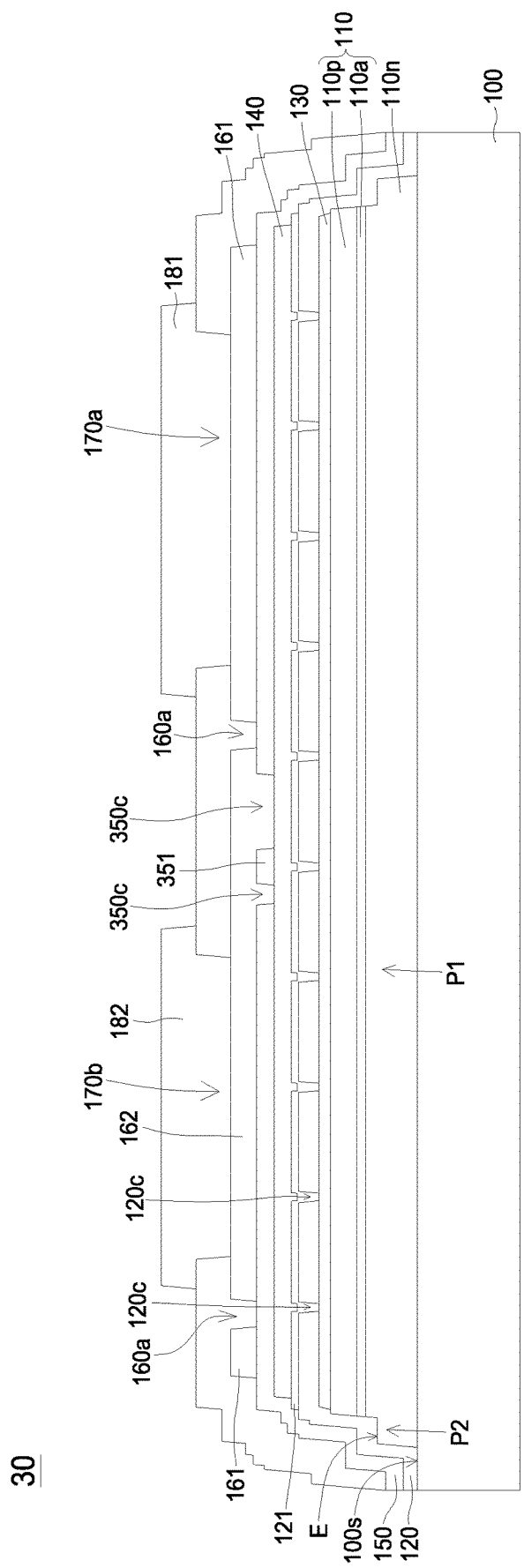
FIG. 23A shows a cross-sectional view along the line A-A' in FIG. 22.
Figure 23B:
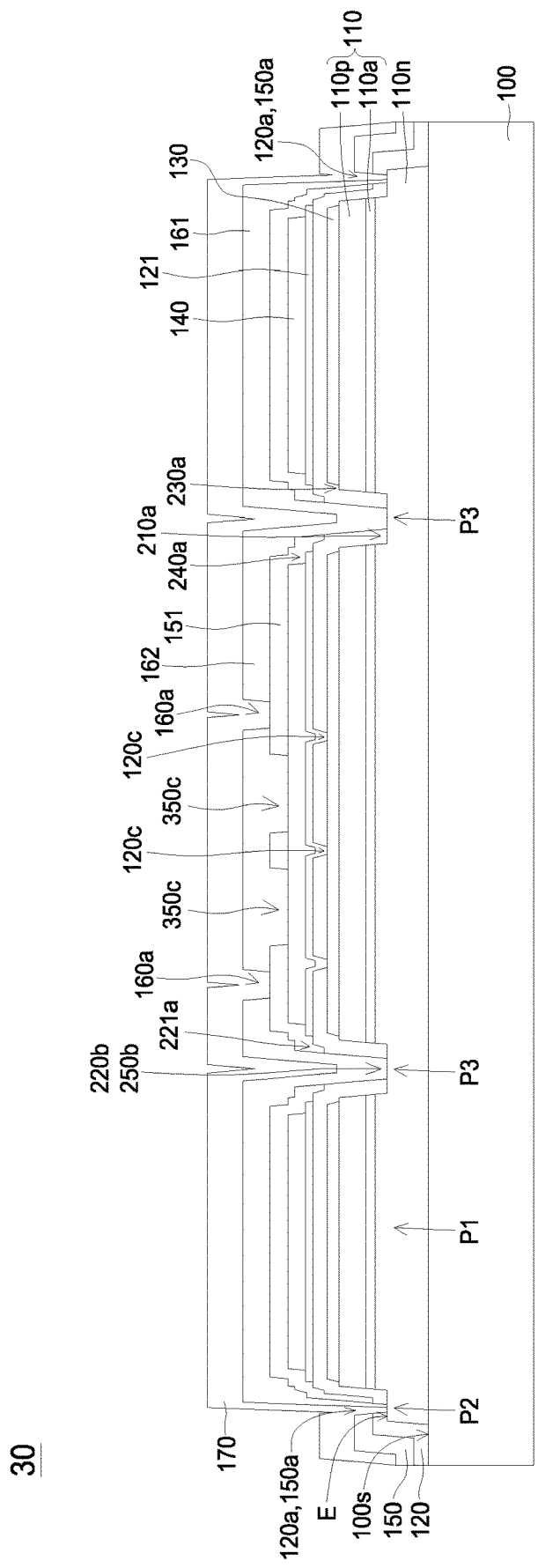
FIG. 23B shows a cross-sectional view along the line B-B' in FIG. 22.

FIG. 22 shows a top view of the light-emitting device 30 in accordance with an embodiment of the present application. FIG. 23A shows a cross-sectional view along the line A-A' in FIG. 22. FIG. 23B shows a cross-sectional view along the line B-B' in FIG. 22. The manufacturing method and the structure of the light-emitting device 30 are similar to the light-emitting devices 10 and 20. The similar manufacturing method and the similar structure will not be repeated and can be referred to the description and drawings of the light-emitting devices 10 and 20. The differences between the light-emitting device 30 and the light-emitting devices 10 and 20 will be explained in the following. Referring to FIG. 22, FIG. 23A and FIG. 23B, the difference between the light emitting device 30 and the light emitting devices 10 and 20 is that the first group of first openings 120c includes multiple holes distributed on the semiconductor mesa 110. The second insulative layer 150 has a contact area R1 located on the reflective conductive structure 140, the contact area R1 includes one or multiple covering portions 351 and a first group of second opening 350c surrounding the one or multiple covering portions 351, and the second connective part 162 is formed on the second insulative layer 150, and covers the first group of second opening 350c and the one or multiple covering portions 351 of the contact area R1 to contact the reflective conductive structure 140 through the first group of second opening 350c to electrically connect to the second semiconductor layer 110p. In an embodiment, the multiple holes of the first group of first openings 120c, the one or multiple covering portions 351 and the first group of second opening 350c of the contact area R1 can be formed by dry etching, wet etching or lift-off the materials of the first insulative layer 120 and the second insulative layer respectively. In an embodiment, the diameters of the multiple holes of the first group of first openings 120c may be 1 μm to 20 μm. In an embodiment, the distance between two adjacent holes of the first group of first openings 120c may be 1 μm to 50 μm. The present application is not limited to the above range of values. In the low current density products, for example, the current density is less than or equal to 0.21 A/mm$^2$, the diameters of the multiple holes of the first group of first openings 120c can be smaller, and the distance between two adjacent holes of the first group of first openings 120c can be larger. In the high current density products, for example, the current density is greater than or equal to 0.42 A/mm$^2$, the diameters of the multiple holes of the first group of first openings 120c can be relatively large, and the distance between two adjacent holes of the first group of first openings 120c can be small. In an embodiment, the light emitting device 30 may include an adhesive layer 121 is formed between the first insulative layer 120 and the reflective conductive structure 140, and extends to the sidewall of the first group of first openings 120c. In an embodiment, the adhesive layer 121 has multiple adhesive openings (not shown) disposed on the corresponding first group of first openings 120c, and the second semiconductor layer 110p and/or the transparent conductive layer 130 are exposed by the multiple adhesive openings and the first group of first openings 120c. In an embodiment, the diameters of the multiple adhesive openings may be 1 μm to 20 μm. In an embodiment, the distance between two adjacent adhesive openings may be 1 μm to 50 μm. In an embodiment, the diameters of the multiple holes of the first group of first openings 120c and the multiple adhesive openings may be same or different. In an embodiment, the distance between two adjacent holes of the first group of first openings 120c and between two adjacent adhesive openings may be same or different. In an embodiment, the diameters of the multiple adhesive openings are smaller than the diameters of the multiple holes of the first group of first openings 120c. With this design, the adhesive layer 121 covers the sidewalls of the first group of first openings 120c, which can increase the adhesion between the reflective conductive structure 140 and the first insulating layer 120.

In an embodiment, in the top view of the light-emitting device 30, the multiple holes of the first group of first openings 120c include a first set of holes located within the contact area R1 and a second set of holes located outside the contact area R1. The one or multiple covering portions 351 are respectively corresponding to the first set of holes, and the first group of second opening 350c surrounds the first set of holes and does not overlap with the first set of holes. In an embodiment, the pitch between two adjacent holes of the first set of holes located within the contact region R1 and the pitch between two adjacent holes of the second set of holes located outside the contact region R1 may be the same or different. In an embodiment, the arrangement of the first set of holes located within the contact region R1 and the arrangement of the multiple holes located outside the contact region R1 may be the same or different. In an embodiment, in the top view of the light-emitting device 30, the contact region R1 is located between the first pad 181 and the second pad 182 and does not overlap with the first pad 181 and the second pad 182. In an embodiment, in the top view of the light-emitting device 30, the contour of the contact region R1 is a geometric pattern or an irregular pattern. In an embodiment, the contour of the contact region R1 is an irregular pattern and the edge of the contact region R1 includes a concave-convex edge. The short circuit formed by the opposite electrical contact can be avoided by the aforementioned position design of the contact region R1. In an embodiment, the contact region R1 and the mesa openings 210a are alternately arranged. In an embodiment, in the top view of the light-emitting device 30, the contact region R1 is located at the periphery of the second connective part 162.

Figure 24:
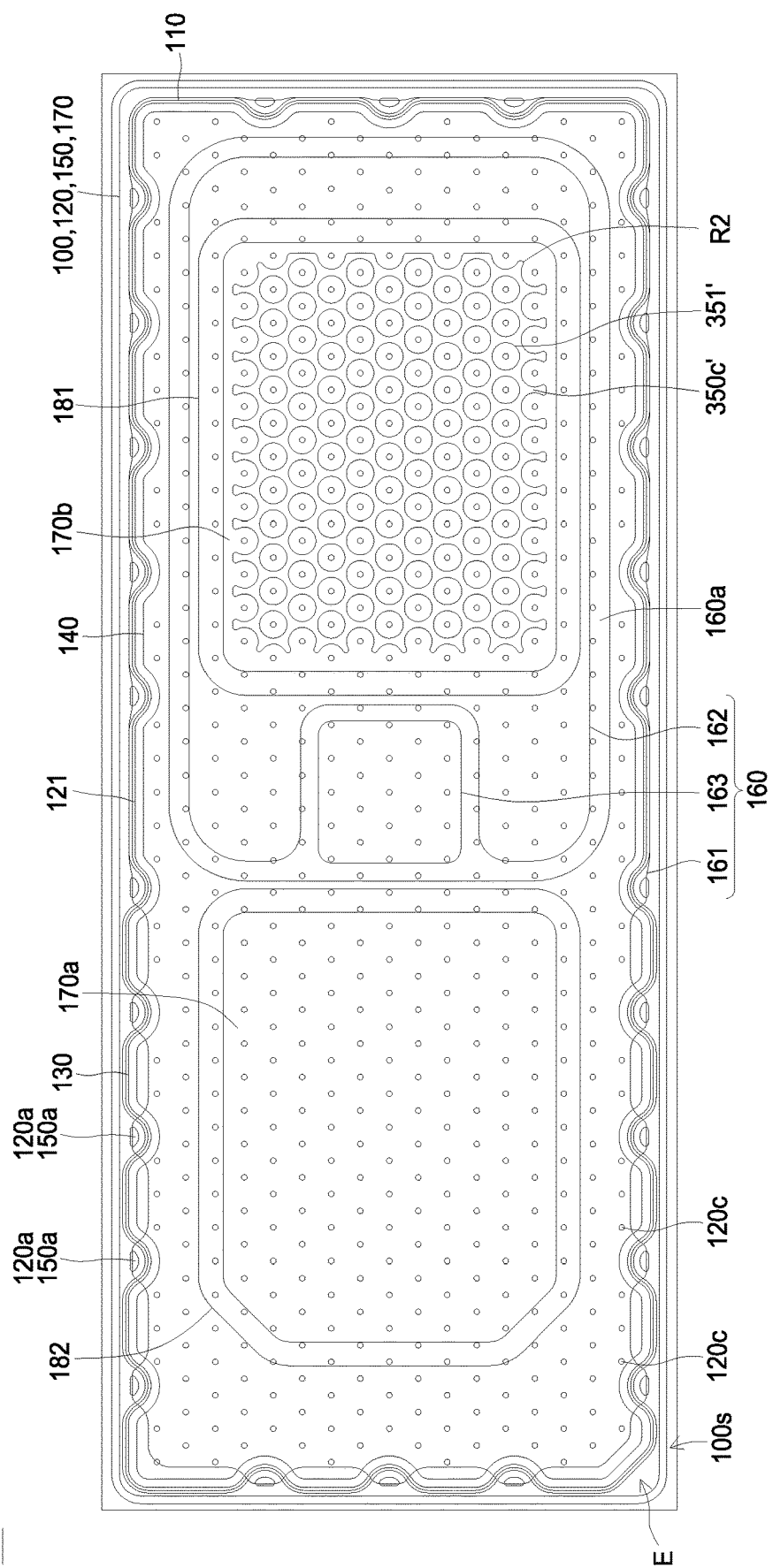
FIG. 24 shows a top view of the light-emitting device 31 in accordance with an embodiment of the present application.

FIG. 24 shows a top view of the light-emitting device 31 in accordance with an embodiment of the present application. The manufacturing method and the structure of the light-emitting device 31 are similar to the light-emitting devices 10, 20 and 30. The similar manufacturing method and the similar structure will not be repeated and can be referred to the description and drawings of the light-emitting devices 10, 20 and 30. The differences between the light-emitting device 31 and the light-emitting device 30 will be explained in the following. Referring to FIG. 24, the difference between the light emitting device 31 and the light emitting device 30 is that the second insulative layer 150 has a contact region R2 located on the reflective conductive structure 140 and overlapping with the second pad 182 in the top view of the light-emitting device 31. With the aforementioned position design of the contact region R2, compared with the embodiment of the light emitting device 30 in which the second pad 182 does not overlap with the contact region R1, the contact region R2 of the light emitting device 31 can have a larger contact area, which can improve the current injection to reduce the forward voltage of the light-emitting device. In an embodiment, the contact area R2 includes one or multiple covering portions 351' and a first group of second opening 350c' surrounding the one or multiple covering portions 351', and the second connective part 162 is formed on the second insulative layer 150, and covers the first group of second opening 350c' and the one or multiple covering portions 351' of the contact area R2 to contact the reflective conductive structure 140 through the first group of second opening 350c' to electrically connect to the second semiconductor layer 110p.

Figure 25:
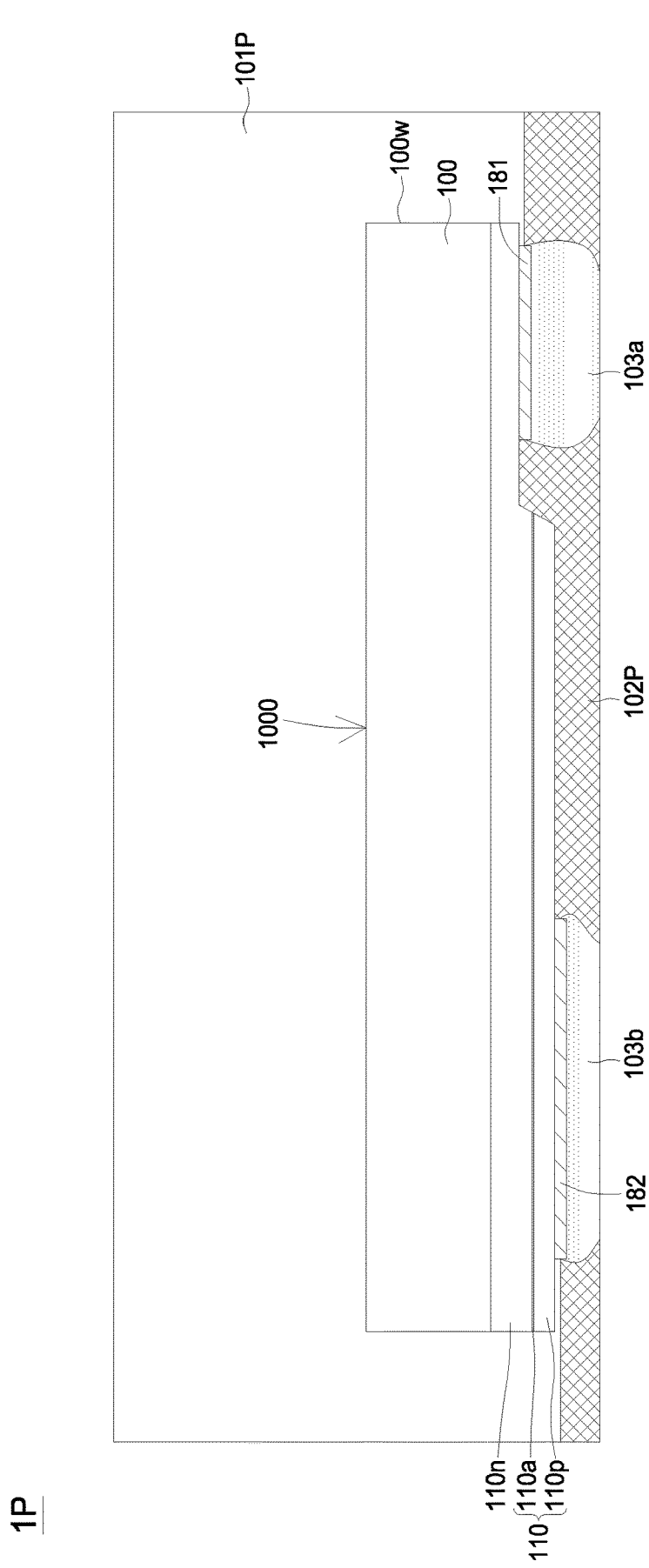
FIGS. 25-27 show a schematic diagram of the light-emitting device packages 1P-3P in accordance with embodiments of the present application.

FIG. 25 shows a schematic diagram of the light-emitting device package 1P in accordance with embodiment of the present application. Referring to FIG. 25, the transparent body 101P covers the substrate side surface 100w. The bumps 103a and 103b are respectively corresponding to the first pad 181 and the second pad 182. In detail, the bump 103a is connected to the first pad 181 and the bump 103b is connected to the second pad 182. The reflective body 102P covers part of the side walls of the bumps 103a and 103b. In an embodiment, the reflective body 102P also covers part of the sidewalls of the first pad 181 and the second pad 182.

The bumps 103a and 103b are lead-free solders containing one material selected from tin, copper, silver, bismuth, indium, zinc and antimony. The thicknesses of the bumps 103a and 103b are respectively between 20~150 μm. In an embodiment, the bumps 103a and 103b are formed by reflow soldering. In detail, the solder pastes are disposed on the pads, then heated in a reflow oven, and melted to generate the joints. The solder pastes may include tin-silver-copper, tin-antimony or gold-tin and have a melting point greater than 215° C., or greater than 220° C., or between 215° C. and 240° C., such as 217° C., 220° C., 234° C. In addition, the peak temperature in the reflow process occurring in the reflow zone stage is greater than 250° C., or greater than 260° C., or between 250-270° C., such as 255° C., 265° C.

The reflective body 102P is an electrical insulator and includes a first matrix and a plurality of reflective particles (not shown) mixed in the first matrix. The first matrix has a silicon-based material or an epoxy-based material, and has a refractive index between 1.4-1.6 or 1.5-1.6. The reflective particles include titanium dioxide, silicon dioxide, aluminum oxide, zinc oxide, or zirconium dioxide. In an embodiment, when the light emitted by the active region 110a hits the reflective body 102P, the light can be reflected and this reflection is called diffuse reflection. In addition to the reflective function, the reflective body 102P can bear the stress generated by the light-emitting device package 1P during operation.

The transparent body 101P includes a silicon-based matrix material or an epoxy-based matrix material. Moreover, the transparent body 101P may include a plurality of wavelength conversion particles (not shown) or/and diffusion powder particles dispersed therein to absorb the first light emitted by the light-emitting element 1000 and convert it into a second light with a spectrum different from the first light. The light-emitting element 1000 may be the light-emitting device in the foregoing embodiments. The combination of the first light and the second light can generate a third light. In this embodiment, the third light has a color point coordinate (x, y) in the CIE1931 chromaticity diagram, wherein $0.27 \leq x \leq 0.285$ and $0.23 \leq y \leq 0.26$. In another embodiment, the combination of the first light and the second light can generate white light. According to the weight percent concentration and type of wavelength conversion particles, the light-emitting device package 1P can have a white light in a thermally stable state, and the white light have the relative color temperature (CCT) range of 2200K~6500K, such as 2200K, 2400K, 2700K, 3000K, 5000k, 5700K, 6500K, the coordinates (x, y) of the color point in the CIE1931 chromaticity diagram within the range of seven MacAdam ellipses, and the color rendering index (CRI) greater than 80 or greater than 90. In another embodiment, the combination of the first light and the second light can generate purple light, amber light, green light, yellow light or other non-white light.

The wavelength conversion particles have a particle size of 10 nm to 100 um and may contain one, two or more types of inorganic phosphors, organic fluorescent colorants, semiconductor materials, or the above-mentioned combination of materials. The inorganic phosphors include but not limited to yellow-green phosphor or red phosphor. The composition of the yellow-green phosphor is such as aluminum oxide (YAG or TAG), silicate, vanadate, alkaline earth metal selenide, or metal nitride. The composition of red phosphor is such as fluoride ($K_2TiF_6:Mn^{4+}$, $K_2SiF_6:Mn^{4+}$), silicate, vanadate, alkaline earth metal sulfide (CaS), metal oxynitride, or tungstomolybdate group mixture. The weight percent concentration (w/w) of the wavelength conversion particles in the matrix is between 50-70%. The semiconductor materials include nano-crystal semiconductor material, such as quantum-dot luminescent material. The quantum-dot luminescent material can be selected from zinc sulfide (ZnS), zinc selenide (ZnSe), zinc telluride (ZnTe), zinc oxide (ZnO), cadmium sulfide (CdS), cadmium selenide (CdSe), telluride Cadmium (CdTe), gallium nitride (GaN), gallium phosphide (GaP), gallium selenide (GaSe), gallium antimonide (GaSb), gallium arsenide (GaAs), aluminum nitride (AlN), aluminum phosphide (AlP), aluminum arsenide (AlAs), indium phosphide (InP), indium arsenide (InAs), tellurium (Te), lead sulfide (PbS), indium antimonide (InSb), lead telluride (PbTe), Lead Selenide (PbSe), Antimony Telluride (SbTe), Zinc Cadmium Selenium Sulfide (ZnCdSeS), Copper Indium Sulfide (CuInS), Cesium Lead Chloride ($CsPbCl_3$), Cesium Lead Bromide ($CsPbBr_3$), and Cesium Lead Iodide ($CsPbI_3$). The diffusion powder particles include titanium dioxide, zirconium oxide, zinc oxide or aluminum oxide, and are used to diffuse the light emitted by the light-emitting element 1000.

Figure 26:
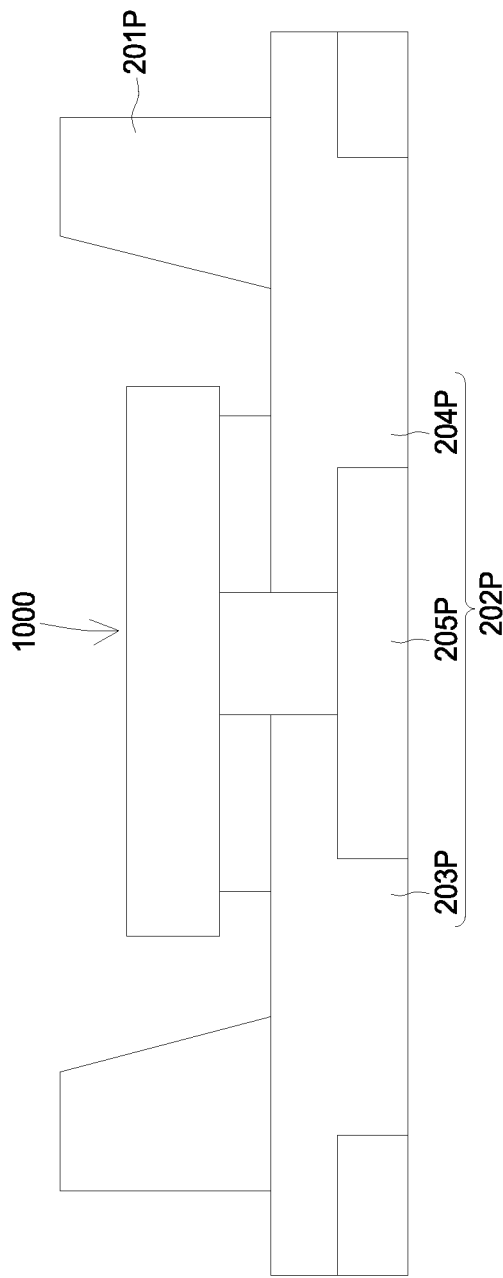

FIG. 26 shows a schematic diagram of the light-emitting device package 2P in accordance with embodiment of the present application. Referring to FIG. 26, a light-emitting element 1000 is mounted on a first bonding pad 203P and a second bonding pad 204P of a package substrate 202P in the flip-chip form. The first bonding pad 203P and the second bonding pad 204P are electrically insulated by an insulative portion 205P including insulative material. In flip-chip mounting, the side of the substrate 100 opposite to the surface where the pads are formed faces upward, and the side of the substrate 100 is the main light extraction surface. Disposing a reflective structure 201P around the light-emitting element 1000 can increase the light extraction efficiency of the light-emitting device package 2P, wherein the light-emitting element 1000 can be the light-emitting devices in the foregoing embodiments.

Figure 27:
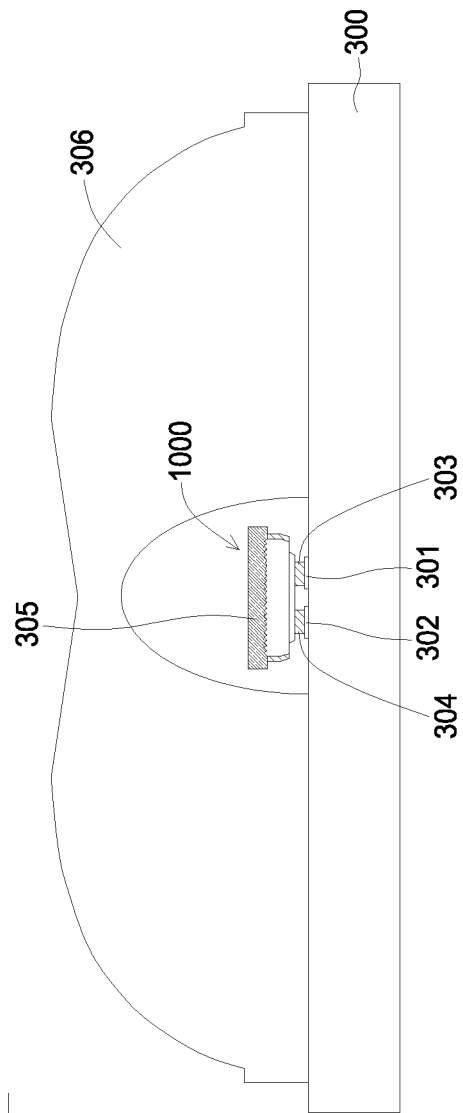

FIG. 27 shows a schematic diagram of the light-emitting device package 3P in accordance with embodiment of the present application. Referring to FIG. 27, the light-emitting device package 3P includes a support substrate 300, a light-emitting element 1000, a wavelength converter 305 and a lens 306. The light-emitting element 1000 is flip-chip-bonded to the first bonding pad 301 and the second bonding pad 302 of the support substrate 300 by using the first bump 303 and the second bump 304. The support substrate 300 may be a printed circuit board. The lens 306 is disposed on the light-emitting element 1000. The lens 306 is a diffusion lens that disperses light, but it is not limited thereto. The lens 306 of various shapes can be combined with the light-emitting element 1000 to realize various light patterns, wherein the light-emitting element 1000 can be the light-emitting devices in the foregoing embodiments.

Figure 28:
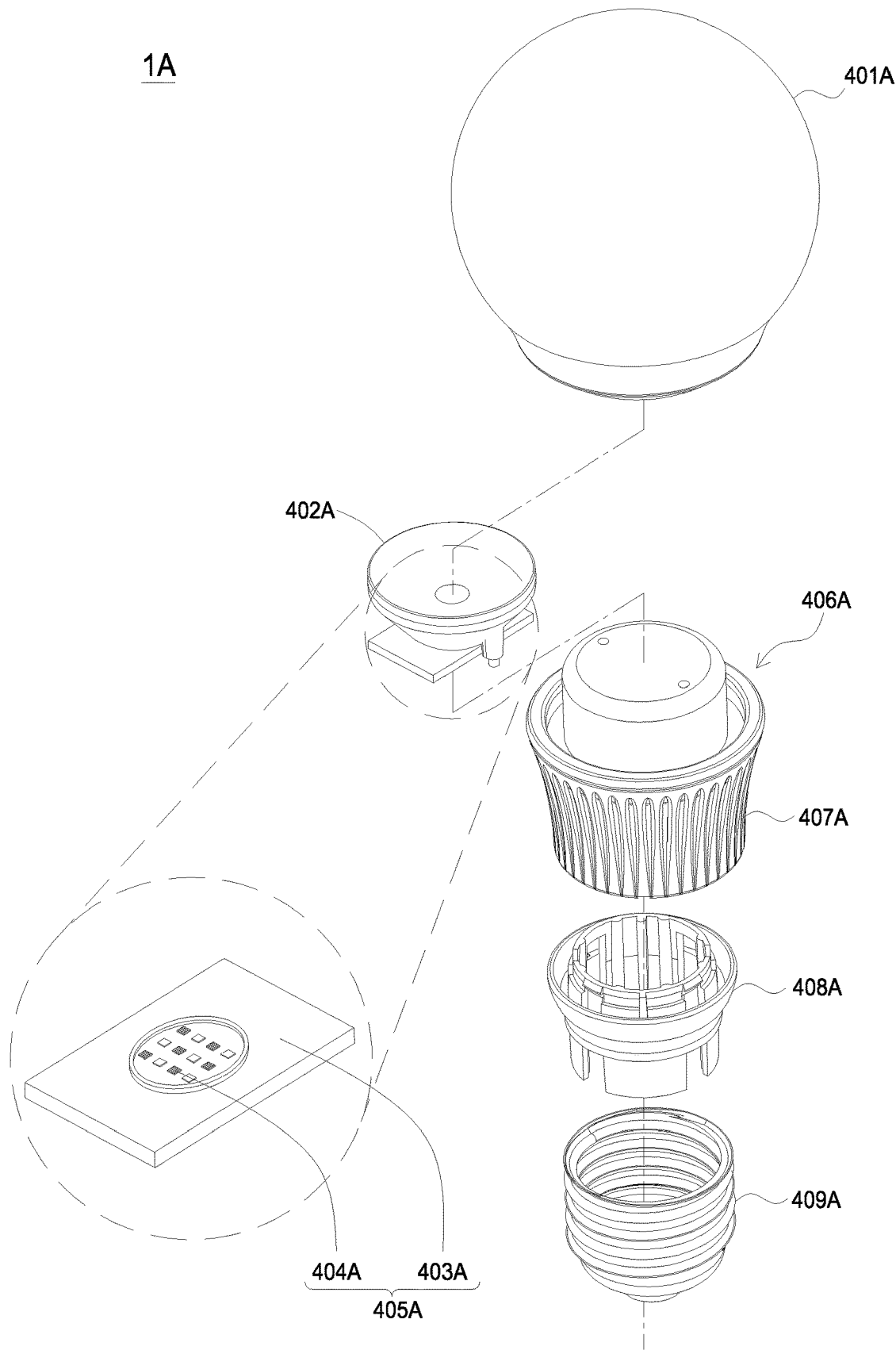
FIGS. 28-31 show a schematic diagram of the light-emitting apparatuses 1A-4A in accordance with embodiments of the present application.

FIG. 28 shows a schematic diagram of the light-emitting apparatus 1A in accordance with embodiment of the present application. Referring to FIG. 28, the light-emitting apparatuses 1A includes a lampshade 401A, a reflector 402A, a light-emitting module 405A, a lamp holder 406A, a heat sink 407A, a connective element 408A and an electrical connective element 409A. The light-emitting module 405A includes a carrying element 403A, and a plurality of light-emitting units 404A located on the carrying element 403A, wherein the plurality of light-emitting units 404A can be the light-emitting devices or light-emitting packages in the foregoing embodiments.

Figure 29:
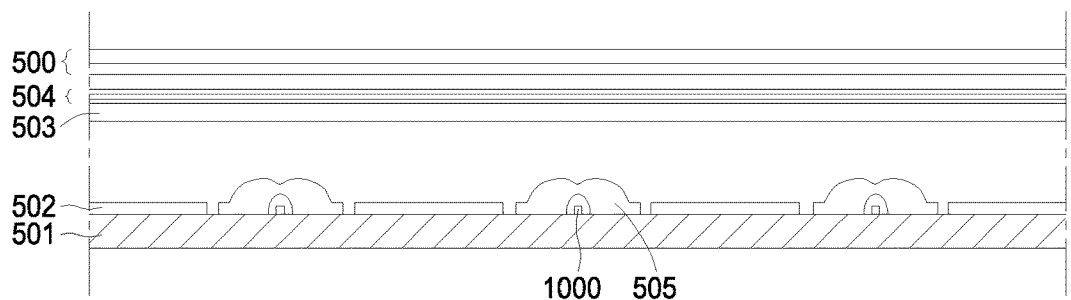

FIG. 29 shows a schematic diagram of the light-emitting apparatus 2A in accordance with embodiment of the present application. Referring to FIG. 29, the light-emitting apparatus 2A includes a display panel 500 and a backlight unit. The backlight unit includes a light-emitting element 1000, a bottom cover 501, a reflective sheet 502, a diffusion sheet 503 and an optical sheet 504. The bottom cover 501 can be opened upward to accommodate the light-emitting element 1000, the reflective sheet 502, the diffusion sheet 503 and the optical sheet 504. The light-emitting element 1000 can be the light-emitting devices or the light-emitting packages in the foregoing embodiments. In an embodiment, disposing a lens 505 on each light-emitting element 1000 can improve the uniformity of the light emitted from the plurality of light-emitting elements 1000. The diffusion sheet 503 and the optical sheet 504 are located on the light-emitting element 1000, and the light emitted from the light-emitting element 1000 can be supplied to the display panel 500 in the form of a surface light source through the diffusion sheet 503 and the optical sheet 504.

Figure 30:
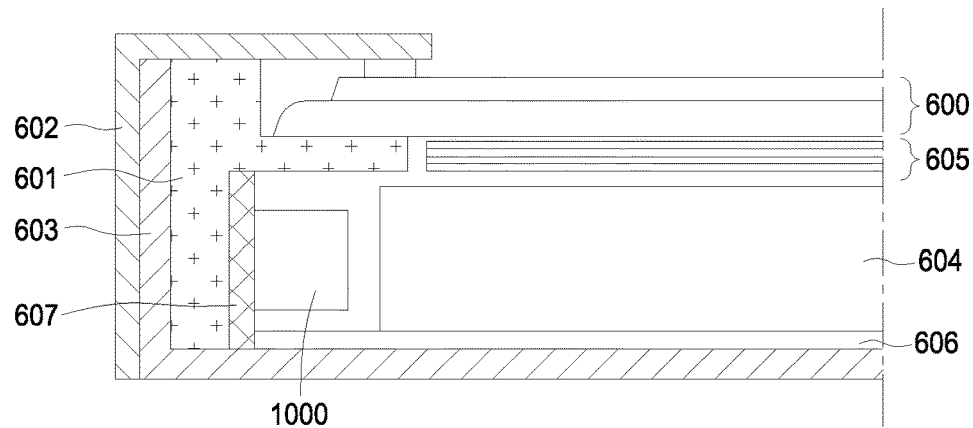

FIG. 30 shows a schematic diagram of the light-emitting apparatus 3A in accordance with embodiment of the present application. Referring to FIG. 30, the light-emitting apparatus 3A includes a display panel 600 and a backlight unit disposed under the display panel 600. Furthermore, the light-emitting apparatus 3A includes: a frame 601 supporting the display panel 600 and housing the backlight unit, and covers 602 and 603 of the display panel 600. The display panel 600 can be fixed by the covers 602 and 603 respectively located above and below it, and the cover 603 located below can be combined with the backlight unit. The backlight unit includes a light guide plate 604, an optical sheet 605, a reflective sheet 606, a carrier plate 607 and a plurality of light-emitting elements 1000. The optical sheet 605 is located on the light guide plate 604 to diffuse the light, the reflective sheet 606 is located under the light guide plate 604 to reflect the light traveling under the light guide plate 604 to the direction of the display panel 600, and the light-emitting elements 1000 are arranged at intervals on the carrier plate 607. In an embodiment, the carrier plate 607 may be a printed circuit board. The light-emitting element 1000 can be the light-emitting devices or the light-emitting packages in the foregoing embodiments.

Figure 31:
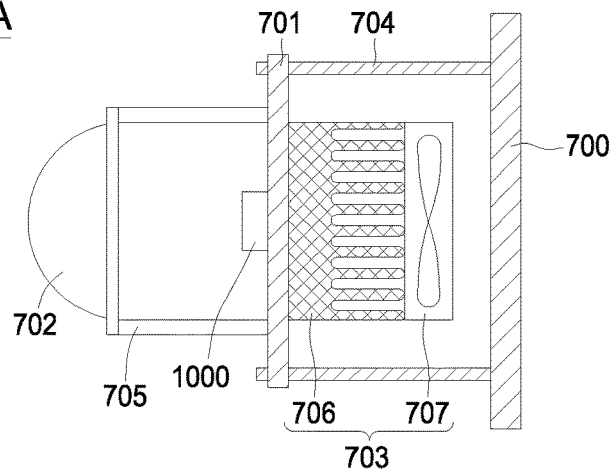

FIG. 31 shows a schematic diagram of the light-emitting apparatus 4A in accordance with embodiment of the present application. Referring to FIG. 31, the light-emitting apparatus 4A includes a lamp main body 700, a carrier board 701, a light-emitting element 1000, a cover lens 702, a heat dissipation element 703, a support rib 704, and a connective member 705. The carrier board 701 is fixed by the supporting rib 704 and spaced apart on the lamp main body 700. The carrier board 701 may be a substrate with conductive patterns such as a printed circuit board. The light-emitting element 1000 is located on the carrier board 701 and can be electrically connected to an external power source through the conductive pattern of the carrier board 701. The light-emitting element 1000 can be the light-emitting devices or the light emitting packages in the foregoing embodiments. The cover lens 702 is located on the light path emitted from the light-emitting element 1000, and the direction angle and/or color of the light emitted from the light-emitting apparatus 4A to the outside can be adjusted through the cover lens 702. The connective member 705 has the function of guiding the light by surrounding the light-emitting element 1000 while fixing the cover lens 702 and the carrier board 701. In an embodiment, the connective member 705 may be formed of light reflective material, or coated with light reflective material. The heat dissipation element 703 may include a heat dissipation fin 706 and/or a heat dissipation fan 707 to discharge heat generated by the light-emitting element 1000 to the outside.

It will be apparent to those having ordinary skill in the art that various modifications and variations can be made to the devices in accordance with the present application without departing from the scope or spirit of the disclosure. In view of the foregoing, it is intended that the present application covers modifications and variations of this disclosure provided they fall within the scope of the following claims and their equivalents.

What is claimed is:
1. A light-emitting device, comprising:
    a semiconductor stack, comprising:
        a first semiconductor layer comprising a first part and a second part connected to the first part; and
        a semiconductor mesa comprising an active region formed on the first part and a second semiconductor layer formed on the active region;

a first insulative layer formed on the semiconductor stack and comprising a plurality of first openings, wherein the plurality of first openings comprises a first group and a second group;
a reflective conductive structure formed on the first insulative layer and electrically connected to the second semiconductor layer through the first group of the plurality of first openings;
a second insulative layer formed on the reflective conductive structure and comprising a plurality of second openings and a contact area, wherein the plurality of second openings comprises a first group and a second group, and wherein the contact area comprises one or multiple covering portions and the first group of the plurality of second openings, the one or multiple covering portions are overlapped with the first group of the plurality of first openings, and the first group of the plurality of second openings and the first group of the plurality of first openings are arranged in a staggered manner;
a first pad formed on the second insulative layer and electrically connected to the first semiconductor layer through the second group of the plurality of first openings and the second group of the plurality of second openings; and
a second pad formed on the second insulative layer and electrically connected to the second semiconductor layer through the first group of the plurality of first openings and the first group of the plurality of second openings.

2. The light-emitting device of claim 1, wherein in a top view of the light-emitting device, the contact area is overlapped with the second pad.

3. The light-emitting device of claim 1, wherein in a top view of the light-emitting device, the first group of the plurality of second openings comprises a connective opening surrounding the one or multiple covering portions and having a concave-convex contour.

4. The light-emitting device of claim 1, wherein in a top view of the light-emitting device, the first group of the plurality of second openings comprises multiple connective openings surrounding the second pad and not overlapped with the second pad.

5. The light-emitting device of claim 4, wherein two of the multiple connective openings have different dimensions.

6. The light-emitting device of claim 1, wherein the first group of the plurality of first openings comprises a trench, and in a top view of the light-emitting device, the first pad and the second pad are arranged in a first direction, the trench extends along the first direction in the first insulative layer and spaced apart from a boundary of the semiconductor mesa.

7. The light-emitting device of claim 6, wherein the trench has a length along the first direction greater than a length of the first pad or the second pad along the first direction.

8. The light-emitting device of claim 6, wherein the second part comprises a peripheral exposed area surrounding the semiconductor mesa, and in the top view of the light-emitting device, the semiconductor mesa has a boundary adjacent to the peripheral exposed area and extending along the first direction, the boundary comprises a first concave-convex pattern, and wherein the trench has an outermost section near the boundary, and the outermost section comprises a second concave-convex pattern corresponding to the first concave-convex pattern.

9. The light-emitting device of claim 1, wherein the first group of the plurality of first openings comprises multiple holes formed on the semiconductor mesa, and the multiple holes comprises a first set of holes located within the contact area and a second set of holes located outside the contact area, and wherein a pitch between two adjacent holes of the first set of holes is different from a pitch between two adjacent holes of the second set of holes.

10. The light-emitting device of claim 9, further comprising an adhesion layer between the first insulative layer and the reflective conductive structure.

11. The light-emitting device of claim 10, wherein a material of the adhesion layer comprises transparent metal oxide.

12. The light-emitting device of claim 9, further comprising a first connective part between the second insulative layer and the first pad, wherein the second part comprises a peripheral exposed area surrounding the semiconductor mesa, and the first connective part is located on the peripheral exposed area and fills in the second group of the plurality of first openings and the second group of the plurality of second openings to electrically connect the first semiconductor layer.

13. The light-emitting device of claim 12, further comprising a second connective part between the second insulative layer and the second pad, wherein the second connective part fills in the first group of the plurality of second openings to electrically connect the second semiconductor layer, and the second connective part is surrounded by the first connective part in a top view of the light-emitting device.

14. The light-emitting device of claim 13, wherein the second group of the plurality of first openings comprises multiple first peripheral openings on the peripheral exposed area, the second group of the plurality of second openings comprises multiple second peripheral openings on the peripheral exposed area, and the first connective part fills in the multiple first peripheral openings and the multiple second peripheral openings to electrically connect the first semiconductor layer.

15. The light-emitting device of claim 12, further comprising one or multiple mesa openings formed in the semiconductor mesa, and wherein the first semiconductor layer further comprises one or multiple third parts surrounded by the first part and exposed by the one or multiple mesa openings in a top view of the light-emitting device, and the first connective part is located on the one or multiple third parts and fills in the second group of the plurality of first openings and the second group of the plurality of second openings to electrically connect the first semiconductor layer.

16. The light-emitting device of claim 15, wherein the second group of the plurality of first openings comprises multiple first internal openings on the one or multiple third parts, the second group of the plurality of second openings comprises multiple second internal openings on the one or multiple third parts, and the first connective part fills in the multiple first internal openings and the multiple second internal openings to electrically connect the first semiconductor layer.

17. The light-emitting device of claim 12, wherein in a top view of the light-emitting device, the first pad and the second pad are arranged in a first direction, the semiconductor mesa has a boundary adjacent to the peripheral exposed area and extending along the first direction, and the first connective part comprises a first edge around the first pad, and wherein the boundary comprises a first concave-convex pattern and the first edge of the first connective part comprises a third concave-convex pattern, a convex part of the third concave-convex pattern is corresponding to a concave part of the first concave-convex pattern, and a concave part of the third concave-convex pattern is corresponding to a convex part of the first concave-convex pattern.

18. The light-emitting device of claim 17, wherein the first connective part comprises a second edge around the second pad, the second edge of the first connective part comprises a fourth concave-convex pattern, a convex part of the fourth concave-convex pattern is corresponding to the convex part of the first concave-convex pattern, and a concave part of the fourth concave-convex pattern is corresponding to the concave part of the first concave-convex pattern.

19. The light-emitting device of claim 17, wherein the first connective part comprises a second edge around the second pad, the second edge of the first connective part comprises a straight line.

20. The light-emitting device of claim 13, further comprising a third connective part on the second insulative layer and electrically separated from the first connective part and the second connective part, wherein in the top view of the light-emitting device, the third connective part is surrounded by the first connective part.

\* \* \* \* \*